US012100722B2

(12) United States Patent
Furumi et al.

(10) Patent No.: US 12,100,722 B2
(45) Date of Patent: Sep. 24, 2024

(54) IMAGING DEVICE WITH IMPROVED SHORT-WAVELENGTH SENSITIVITY

(71) Applicant: SONY SEMICONDUCTOR SOLUTIONS CORPORATION, Kanagawa (JP)

(72) Inventors: Koji Furumi, Kanagawa (JP); Shuji Manda, Kanagawa (JP); Ryosuke Matsumoto, Kanagawa (JP); Tomoyuki Hirano, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 777 days.

(21) Appl. No.: 17/250,834

(22) PCT Filed: Sep. 17, 2019

(86) PCT No.: PCT/JP2019/036358
§ 371 (c)(1),
(2) Date: Mar. 10, 2021

(87) PCT Pub. No.: WO2020/059702
PCT Pub. Date: Mar. 26, 2020

(65) Prior Publication Data
US 2022/0052092 A1 Feb. 17, 2022

(30) Foreign Application Priority Data
Sep. 21, 2018 (JP) .................................. 2018-177893

(51) Int. Cl.
*H01L 27/146* (2006.01)
(52) U.S. Cl.
CPC .. *H01L 27/14623* (2013.01); *H01L 27/14621* (2013.01); *H01L 27/14627* (2013.01);
(Continued)

(58) Field of Classification Search
CPC ......... H01L 27/14623; H01L 27/14621; H01L 27/14627; H01L 27/1463; H01L 27/1464;
(Continued)

(56) References Cited

U.S. PATENT DOCUMENTS

| 8,130,309 B2 | 3/2012 | Wada |
| 2010/0059846 A1* | 3/2010 | Kim ................. H01L 27/14636 |
| | | 257/E21.585 |

(Continued)

FOREIGN PATENT DOCUMENTS

| CN | 104103655 A | 10/2014 |
| CN | 105489624 A | 4/2016 |

(Continued)

OTHER PUBLICATIONS

International Search Report and Written Opinion of PCT Application No. PCT/JP2019/036358, issued on Dec. 17, 2019, 11 pages of ISRWO.

*Primary Examiner* — Gevell V Selby
(74) *Attorney, Agent, or Firm* — CHIP LAW GROUP

(57) ABSTRACT

There is provided an imaging device including a first semiconductor layer formed on a semiconductor substrate, a second semiconductor layer formed on the first semiconductor layer and having an opposite conductivity type to the first semiconductor layer, a pixel separation portion that demarcates a pixel region including the first semiconductor layer and the second semiconductor layer, a first electrode connected to the first semiconductor layer from one surface side of the semiconductor substrate, and a metal layer connected to the second semiconductor layer from a light irradiation surface side which is the other surface of the semiconductor substrate and buried in the pixel separation portion in at least a part of the semiconductor substrate in a thickness direction.

12 Claims, 52 Drawing Sheets

(52) U.S. Cl.
CPC ...... *H01L 27/1463* (2013.01); *H01L 27/1464* (2013.01); *H01L 27/14645* (2013.01); *H01L 27/14685* (2013.01)

(58) Field of Classification Search
CPC ......... H01L 27/14645; H01L 27/14685; H01L 27/14603; H01L 27/1461; H01L 27/14643; H01L 27/14636; H01L 31/107
See application file for complete search history.

(56) References Cited

U.S. PATENT DOCUMENTS

| | | | |
|---|---|---|---|
| 2014/0291481 A1 | 10/2014 | Zhang et al. | |
| 2015/0137302 A1 | 5/2015 | Bui | |
| 2016/0099371 A1 | 4/2016 | Webster | |
| 2017/0092669 A1* | 3/2017 | Jerome | H01L 27/14687 |
| 2018/0090526 A1 | 3/2018 | Mandai et al. | |
| 2018/0240847 A1* | 8/2018 | Ota | H04N 25/70 |
| 2019/0157323 A1* | 5/2019 | Ogi | H04N 25/70 |
| 2019/0252442 A1 | 8/2019 | Tanaka et al. | |

FOREIGN PATENT DOCUMENTS

| | | |
|---|---|---|
| CN | 107431076 A | 12/2017 |
| CN | 109643722 A | 4/2019 |
| CN | 109716525 A | 5/2019 |
| CN | 109983581 A | 7/2019 |
| EP | 2787531 A1 | 10/2014 |
| EP | 3516692 A1 | 7/2019 |
| EP | 3549169 A1 | 10/2019 |
| HK | 1218347 A | 2/2017 |
| JP | H08130309 A | 5/1996 |
| JP | 2008-294454 A | 12/2008 |
| JP | 2014-225647 A | 12/2014 |
| JP | 2015-41746 A | 3/2015 |
| JP | 2018-88488 A | 6/2018 |
| JP | 2018-93126 A | 6/2018 |
| JP | 2018-137284 A | 8/2018 |
| KR | 10-2014-0119648 A | 10/2014 |
| KR | 10-2017-0124548 A | 11/2017 |
| KR | 10-2019-0089843 A | 7/2019 |
| TW | 201440241 A | 10/2014 |
| TW | 201622115 A | 6/2016 |
| TW | 201703149 A | 1/2017 |
| TW | 201703242 A | 1/2017 |
| WO | 2016/143531 A1 | 9/2016 |
| WO | 2018/057975 A1 | 3/2018 |
| WO | 2018/101033 A1 | 6/2018 |
| WO | 2018/105359 A1 | 6/2018 |
| WO | 2018/150801 A1 | 8/2018 |

* cited by examiner

IMAGING DEVICE WITH IMPROVED SHORT-WAVELENGTH SENSITIVITY

CROSS REFERENCE TO RELATED APPLICATIONS

This application is a U.S. National Phase of International Patent Application No. PCT/JP2019/036358 filed on Sep. 17, 2019, which claims priority benefit of Japanese Patent Application No. JP 2018-177893 filed in the Japan Patent Office on Sep. 21, 2018. Each of the above-referenced applications is hereby incorporated herein by reference in its entirety.

TECHNICAL FIELD

The present disclosure relates to an imaging device.

BACKGROUND ART

In the related art, for example, the following PTL 1 discloses a single photon avalanche diode (SPAD) configuration in which a first semiconductor layer which is a first buried layer with a first conductivity type and a second semiconductor layer with a second conductivity type opposite to the first conductivity type below the first semiconductor layer are provided. The second semiconductor layer is buried in an epitaxial layer and the second semiconductor layer is completely formed as a depletion layer by applying a bias voltage.

CITATION LIST

Patent Literature

[PTL 1]
JP 2015-41746A

SUMMARY

Technical Problem

In technologies for the SPAD, light incidence can be extracted as a large signal by applying a large bias voltage and multiplying electrons. In the configuration disclosed in PTL 1, a pair of electrodes applying a high voltage is arranged on the front surface of a substrate. Therefore, in order to reduce noise or improve photoelectric conversion efficiency, it is necessary to reliably insulate the pair of electrodes from each other. In particular, as micronization progresses, it becomes more difficult to insulate a pair of electrodes, and thus it is difficult to implement micronization simultaneously with a reduction in noise, improvement of the photoelectric conversion efficiency, or the like.

When a pair of electrodes are provided on the front surface and the rear surface of a substrate, the electrode provided using a transparent electrode or an impurity layer is provided on a light irradiation surface. However, when the transparent electrode is provided, noise occurs in a contact portion with the substrate in some cases. When the electrodes are formed using an impurity layer, it is necessary to inject high-concentration impurities. A depletion layer cannot be formed in a region of the impurity layer, but it is necessary to guarantee the thickness of the impurity layer in order to realize low resistance of the electrode. In this case, there is a problem that sensitivity of light with a short wavelength is particularly reduced.

Accordingly, it is required to achieve micronization, low noise of pixels, and high quantum efficiency, and to improve short-wavelength sensitivity while suppressing interference between the pixels and variation in each pixel.

Solution to Problem

According to the present disclosure, there is provided an imaging device including: a first semiconductor layer formed on a semiconductor substrate; a second semiconductor layer formed on the first semiconductor layer and having an opposite conductivity type to the first semiconductor layer; a pixel separation portion configured to demarcate a pixel region including the first and second semiconductor layers; a first electrode connected to the first semiconductor layer from one surface side of the semiconductor substrate; and a metal layer connected to the second semiconductor layer from a light irradiation surface side which is the other surface of the semiconductor substrate and buried in the pixel separation portion in at least a part of the semiconductor substrate in a thickness direction.

Advantageous Effects of Invention

According to the present disclosure, as described above, it is possible to achieve micronization, low noise of pixels, and high quantum efficiency, and to improve short-wavelength sensitivity while suppressing interference between the pixels and variation in each pixel.

The foregoing advantageous effects are not necessarily restrictive and any advantageous effect described in the present specification or other advantageous effects that can be ascertained from the present specification can be obtained in addition to the foregoing advantageous effects or instead of the foregoing advantageous effects.

DESCRIPTION OF EMBODIMENTS

Figure 1:
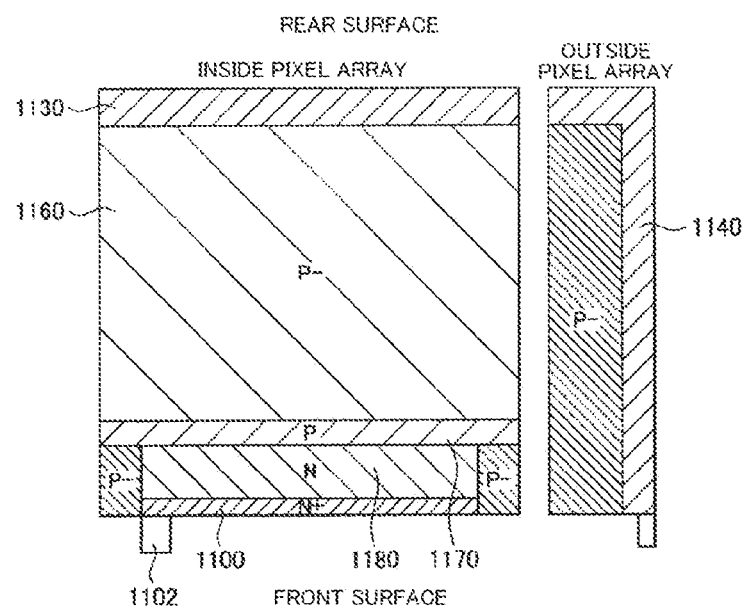
FIG. 1 is a schematic view illustrating a configuration example in which an SPAD photodiode is set as a backside irradiation type, one anode electrode is provided on the rear surface side, and a high voltage is applied.

Hereinafter, preferred embodiments of the present disclosure will be described with reference to the figures. In the present specification and the figures, the same reference numerals are given to constituent elements that have substantially the same functional configurations and description thereof will be omitted.

The description will be made in the following order.
1. Background Technology
2. Configuration example of imaging device according to embodiment
3. Other configuration examples of imaging device according to embodiment
4. Leading of anode electrode to outside
5. Positional relations between anode electrode and contact layer
6. Configuration example including color filter and lens
7. Application example of imaging device according to embodiment
8. Variations of present disclosure
8.1. Common structure
8.2. First variation
8.3. Second variation
8.4. Third variation
9. Application example other than imaging device
10. Configuration example of electronic device
11. Application example to moving body
12. Application example to endoscopic surgery system
1. Background Technology There is a single photon avalanche diode (SPAD) technology for realizing a photodiode that has reading sensitivity of a 1-photon level by multiplying electrons. In order to achieve multiplication in the SPAD, a high voltage of about ±tens of V is necessary. Therefore, it is difficult to design injection of impurities and it is difficult to implement micronization simultaneously with a reduction in noise, an improvement in photoelectric conversion efficiency, or the like. Therefore, as illustrated in FIG. 1, there is a technology of generating a deep depletion layer while solving the problem of relaxation of a lateral electric field by forming an SPAD photodiode as a backside irradiation type, providing one anode electrode 1130 on the rear surface side, and applying a high voltage. In the configuration illustrated in FIG. 1, a multiplication region which is a high electric field is formed between a high-concentration P-type layer (a second semiconductor layer) 1170 in contact with a P-type photoelectric conversion portion 1160 and an N-type layer (a first semiconductor layer) 1180 of a cathode. The N-type layer 1180 is connected to a cathode electrode 1100. An electrode 1102 is connected to the front surface side of the cathode electrode 1100.

The anode electrode 1130 is extracted on the front surface side. However, in order to relax an electric field between the cathode electrode 1100 and a contact portion to the front surface side, it is necessary to sufficiently separate the contact portion from the cathode electrode 1100. Therefore, in the configuration illustrated in FIG. 1, a contact layer 1140 which is connected to the anode electrode 1130 and draws the anode electrode 1130 to the front surface side is provided outside a pixel array.

On the other hand, in order to form the anode electrode 1130 on an irradiation surface on the rear surface side in the backside structure as in FIG. 1, it is necessary to use a transparent electrode as the anode electrode 1130. In a method of forming the anode electrode 1130 using a transparent electrode such as ITO and bringing the anode electrode 1130 in contact with the photoelectric conversion portion 1160, noise occurs in a contact portion between the anode electrode 1130 and the photoelectric conversion portion 1160. Therefore, an electrode into which high-concentration impurities are injected is formed on the outermost surface of a photodiode, that is, the outermost surface of the photoelectric conversion portion 1160, in some cases. However, when the high-concentration impurities are injected into the photoelectric conversion portion 1160, a depletion layer cannot be formed in this portion and photoelectric conversion cannot be performed on the outermost surface of the photodiode. Therefore, quantum efficiency of light with a short wavelength may deteriorate. Therefore, it is necessary to cause the high-concentration impurity portion formed on the outermost surface of the photoelectric conversion portion 1160 to be thin. However, when the high-concentration impurity portion is caused to be thin, resistance may increase. In particular, when the contact layer 1140 is provided outside the pixel array and comes into contact with the anode electrode 1130 on the rear surface side, an advantage of micronization is obtained. However, electric resistance from the contact layer 1140 to a pixel increases, and a voltage may be changed when a large multiplied flow unique to the SPAD flows. This change also affects other pixels, and interpixel interference indicating a change in characteristics of the other pixels may arise.

In view of the foregoing circumstances, according to the embodiment, interpixel interference caused due to a change in a voltage in an electrode is suppressed while a backside electrode structure capable of realizing micronized pixels is provided, and quantum efficiency of a short-wavelength side is also particularly improved.

2. Configuration Example of Imaging Device According to Embodiment

Figure 2:
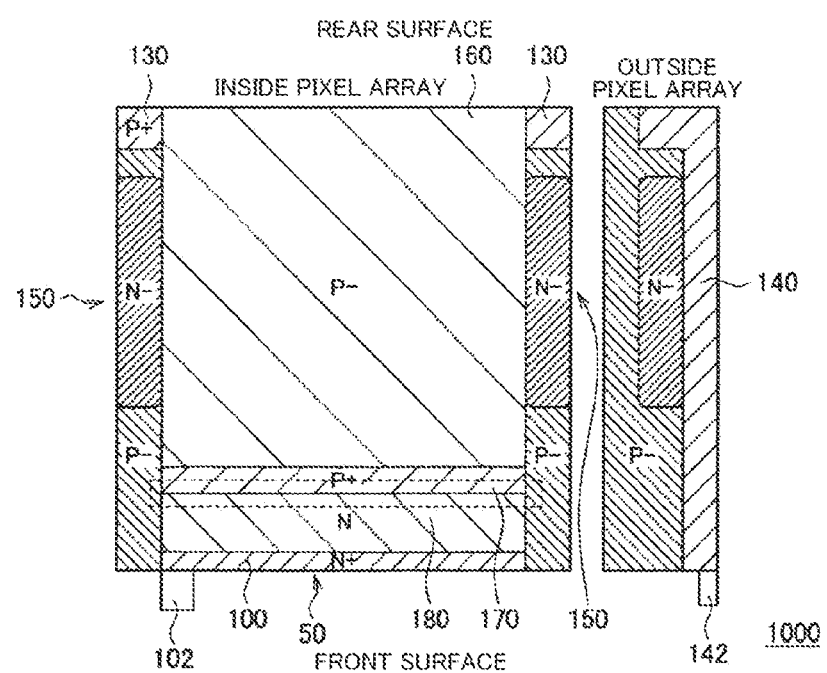
FIG. 2 is a schematic view illustrating a semiconductor device (an SPAD photodiode) according to an embodiment of the present disclosure.

FIG. 2 is a schematic view illustrating an imaging device (an SPAD photodiode) 1000 according to an embodiment of the present disclosure. In the configuration illustrated in FIG. 2, a multiplication region serving as an SPAD pixel and a photoelectric conversion portion 160 performing photoelectric conversion are included. A cathode electrode 100 and an anode electrode 130 are included. The configuration illustrated in FIG. 2 is a backside irradiation type pixel, a substrate of a photodiode is thinned to be equal to or less than 10 μm, and one anode electrode 130 of a pair of electrodes to which a high voltage is applied is provided on the rear surface side. A front surface side of a semiconductor substrate 50 is a side on which a wiring layer is formed on the semiconductor substrate 50. In the imaging device 100 according to the embodiment, the rear surface side of the semiconductor substrate 50 is set as a light irradiation surface. The anode electrode 130 on the rear surface side is provided to correspond to a pixel separation portion 150. The anode electrode 130 has a thickness equal to or greater than, for example, 500 nm and serves as a low-resistance electrode. The photoelectric conversion portion 160 is provided in a pixel region between the pixel separation portions 150 and the photoelectric conversion portion 160 and the outermost surface of the photoelectric conversion portion 160 on the rear surface side serves as a light irradiation portion irradiated with light. The pixel region is defined with a distance of the pixel separation portion 150 and has a rectangular planar shape with the vertical and horizontal sides equal to or less than 5 μm. The anode electrode 130 is connected to a contact layer 140 formed through deep impurity injection, metal burying, or the like outside the pixel array and a potential is extracted to the front surface side. A predetermined voltage is applied to the anode electrode 130 via the contact layer 140 by applying a predetermined voltage to an electrode 142 connected to the contact layer 140 on the front surface side. The contact layer 140 preferably surrounds the pixel array. The contact layer 140 may be located at one place or may be divided into a plurality of pieces. For the anode electrode layer 140, the plurality of contact layers 140 may be formed inside the pixel array. As the number of contact layers 140 for acquiring electrodes is larger, a change in a voltage in the anode electrode 130 on the rear surface side can be suppressed.

As illustrated in FIG. 2, a pixel is separated by the pixel separation portion 150 inside the pixel array. In FIG. 2, one pixel inside the pixel array is illustrated. The pixel separation portion 150 is formed by changing polarity of impurities with the photoelectric conversion portion 160. The anode electrode 130 on the rear surface side is provided to correspond to the position of the pixel separation portion 150 and is provided immediately above the pixel separation portion 150 in FIG. 2. The pixel separation portion 150 is formed through high-concentration impurity injection and the anode electrode 130 is formed with a sufficient thickness equal to or greater than, for example, 500 nm in order to sufficiently lower resistance. With this structure, a depletion layer of the photoelectric conversion portion 160 can be formed up to the outermost surface of the pixel rear surface side and the sensitivity of a short wavelength can be sufficiently kept.

In FIG. 2, an N-type impurity layer is formed on the front surface side to serve as the cathode electrode 100 and a P-type impurity layer is formed on the rear surface side to serve as the anode electrode 130. An N-type layer (a first semiconductor layer) 180 is connected to the cathode electrode 100. An electrode 102 is connected to the surface side of the cathode electrode 100. The photoelectric conversion portion 160 connected to the anode electrode 130 is a low-concentration P type and forms a multiplication region which is a high electric field between the N-type layer 180 of the cathode and the high-concentration P-type layer (a second semiconductor layer) 170 connected to the photoelectric conversion portion (a third semiconductor layer) 160. A low-concentration N-type layer is used as the pixel separation portion 150. The photoelectric conversion portion 160 may not be provided and the P-type layer 170 may extend up to the region of the photoelectric conversion portion 160.

The conductivity type and concentration of the impurity layer are exemplary, and P and N may be switched with each other and the anode and the cathode may be set to opposite conductivity types. Various other methods can be considered as a method of generating the multiplication region which is a high electric field. Further, an impurity injection region for separating the multiplication region may be provided or a buried insulation film or the like may be provided as the pixel separation portion 150.

As described above, in the embodiment, the front surface and the rear surface of the substrate have the anode electrode 130 and the cathode electrode 100 in the backside irradiation type SPAD. The anode electrode 130 on the rear surface side is provided in the pixel separation region 150. Thus, since the photoelectric conversion portion 160 formed from the depletion layer can extend up to the outermost surface of the light irradiation surface, it is possible to considerably raise short-wavelength sensitivity. When a pixel is relatively large, an electric field in the pixel is not constant and it is difficult for the depletion layer to expand up to the front surface of the photoelectric conversion portion 160 in the middle of the pixel because the anode electrode 130 is located at a pixel end. However, since a potential from the pixel end also reaches the middle of the pixel in a minute pixel, a structure in which the anode electrode 130 on the rear surface side is provided in the pixel separation portion 150 can be adopted.

Figure 3:
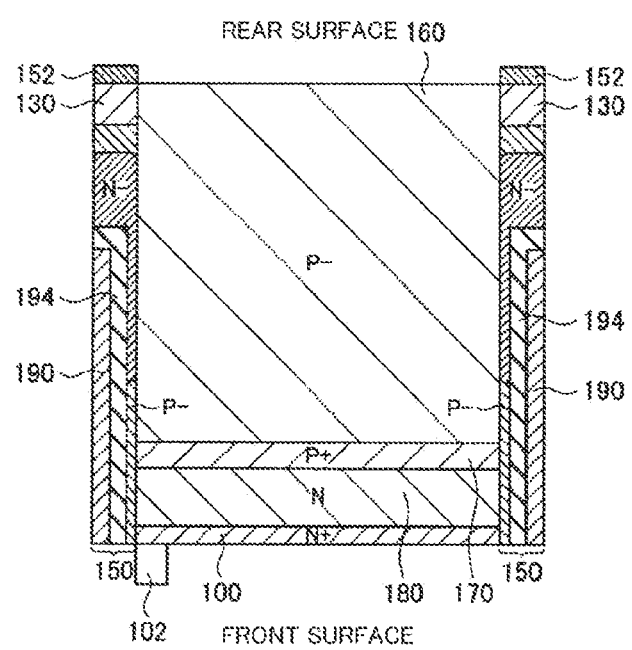
FIG. 3 is a schematic view illustrating another configuration example according to the embodiment.

FIG. 3 is a schematic view illustrating another configuration example according to the embodiment and illustrates an example in which a metal layer 152 with a light-shielding property is used as the pixel separation portion 150 on the pixel surface on the rear surface side. Thus, it is also possible to lower the resistance of the anode electrode 130 on the rear surface while reducing interpixel interference caused due to light, and further suppress the pixel interference caused due to a change in a voltage. The metal layer 152 can be formed of a metal such as tungsten (W). A high-concentration impurity injection region is provided immediately below the metal layer 152, as in FIG. 2, to serve as the anode electrode 130. The metal layer 152 and the anode electrode 130 formed from the high-centration impurity region may be in contact with each other. Even in the case of the configuration example illustrated in FIG. 3, the anode electrode 130 may be led out on the front surface side as in FIG. 2, or may be connected to a bonding pad on the rear surface side as it is.

The pixel separation portion 150 has a planar shape of a grid shape to surround the rectangular pixel region. Therefore, the anode electrode 130 formed on the pixel separation portion 150 and the metal layer 152 formed on the anode electrode 130 can have the planar shape of the grid shape resembling the pixel separation portion 150.

In the example illustrated in FIG. 3, a buried metal layer 190 with a light-shielding property is buried in the pixel separation portion 150 on the front surface side. The buried metal layer 190 can be formed of a metal such as tungsten (W) like the metal layer 152. In this case, the buried metal layer 190 and the photoelectric conversion portion 160 are separated by an insulation film 194, and the buried metal layer 190 is surrounded by the insulation film 194 between adjacent pixels in the pixel region. In this structure, it is possible to suppress inter-pixel interference occurring in a deep region of the pixel region and it is possible to combine a structure which is advantageous in micronization and in which the anode electrode 130 is provided on the rear surface side. The buried metal layer 190 is buried in a midway portion of the photoelectric conversion portion 160 from the front surface side and a high-concentration impurity region is generated immediately above the buried metal layer 190 to serve as the anode electrode 130 on the rear surface side.

Figure 4:
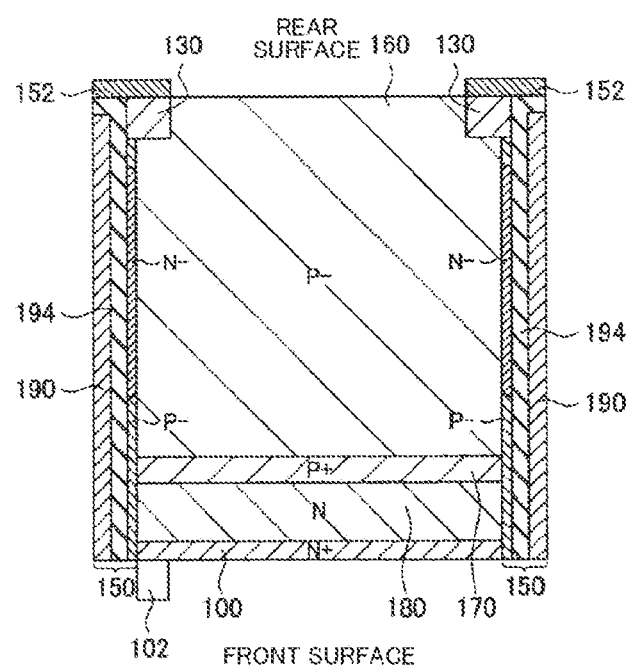
FIG. 4 is a schematic view illustrating a configuration in which a buried metal layer in the configuration illustrated in FIG. 3 is buried on the rear surface side.

In the example illustrated in FIG. 4, the buried metal layer 190 with the configuration illustrated in FIG. 3 is buried on the rear surface side. In this case, the anode electrode 130 formed from the high-concentration impurity region is formed inside the pixel region to surround the buried metal layer 190. However, since the buried metal layer 190 is provided and connection between pixels of the anode electrode 130 is cut, the metal layer 152 is provided on the pixel separation portion 150 and the metal layer 152 and the anode electrode 130 come into contact to connect the anode electrode 130 between the pixels. The metal layer 152 is insulated from the buried metal layer 190. The buried metal layer 190 may be buried in only a part of the photoelectric conversion portion 160 and is more preferably buried in the entire pixel region. With this structure, by also suppressing interpixel interference caused due to a change in the voltage while completely blocking the interpixel interference caused due to light, it is possible to achieve micronization and high quantum efficiency, and thus it is possible to realize low-noise pixels.

As described above, in the embodiment, the anode electrode 130 is formed to correspond to the position of the pixel separation portion 150. The forming of the anode electrode 130 to correspond to the position of the pixel separation portion 150 is assumed to include a case in which the anode electrode 130 is formed on a pixel region side of the pixel separation portion 150 as in FIG. 4 when the anode electrode 130 is formed immediately above the pixel separation portion 150 as in FIG. 2. The anode electrode 130 is formed to correspond to the position of the pixel separation portion 150, but may not be provided to correspond to all the pixel separation portion 150 or may be provided to correspond to only a part of the pixel separation portion 150.

3. Other Configuration Examples of Imaging Device According to Embodiment

Figure 5:
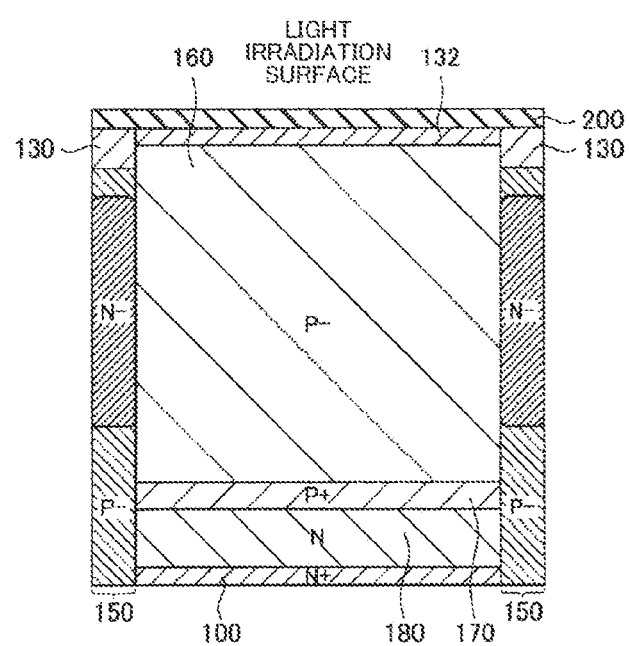
FIG. 5 is a schematic view illustrating an example in which an auxiliary electrode arranged with an anode electrode is provided on the outermost surface of a pixel region in the configuration example illustrated in FIG. 2.

Hereinafter, several variations of the embodiment will be described based on the configuration examples illustrated in FIGS. 2 to 4. A configuration example illustrated in FIG. 5 is an example in which an auxiliary electrode 132 arranged with the anode electrode 130 is provided on the outermost surface of the pixel region with respect to the configuration example illustrated in FIG. 2. The auxiliary electrode 132 is formed with the same conductivity type as the anode electrode 130. The thickness of the auxiliary electrode 132 is, for example, 50 nm or less so that the region of the photoelectric conversion portion 160 can be guaranteed as much as possible. In this way, the auxiliary electrode 132 may be provided on the outermost surface on the rear surface side within the pixel by injecting high-concentration impurities. Here, the thickness of the region of the auxiliary electrode 132 into which the impurities are injected inside the pixel is caused to be sufficiently thin and an appropriate thickness is equal to or less than, for example, 50 nm. In the example illustrated in FIG. 5, the insulation layer 200 is provided on the auxiliary electrode 132 and the photoelectric conversion portion 160 is irradiated with light via the insulation layer 200. By providing the auxiliary electrode 132, it is possible to cause the potential of the outermost surface of the photoelectric conversion portion 160 on the rear surface side to be constant, and thus it is possible to expand the depletion layer and cause the electric field of the multiplication region to be uniform in the pixel. The auxiliary electrode 132 has high resistance to the degree that there is no influence on the short-wavelength sensitivity because of the thin thickness. However, a variation in the potential of the other pixels does not occur since the resistance of the anode electrode 130 provided in the pixel separation portion is low.

Figure 6:
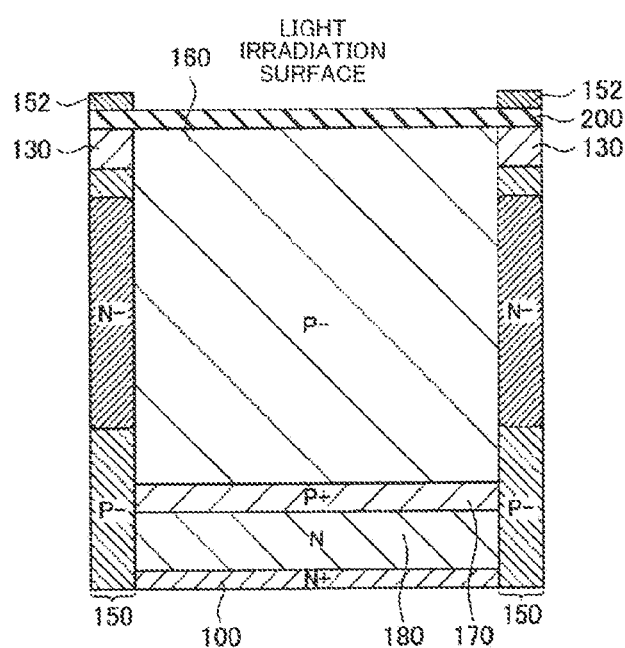
FIG. 6 is a schematic view illustrating an example in which an insulation layer is provided on the outermost surface of a photoelectric conversion portion and a metal layer with a light-shielding property is provided on an insulation layer within a range of a pixel separation portion in the configuration example illustrated in FIG. 2.
Figure 7:
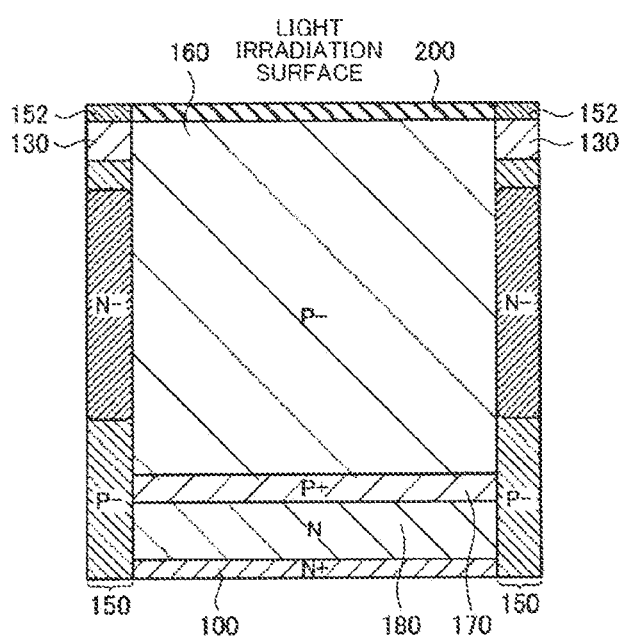
FIG. 7 is a schematic view illustrating an example in which a metal layer with a light-shielding property is provided on an anode electrode without providing an insulation layer on a pixel separation portion.

A configuration example illustrated in FIG. 6 is an example in which an insulation layer 200 is provided on the outermost surface (a light irradiation surface) of the photoelectric conversion portion 160 and a metal layer 152 with a light-shielding property is provided on the insulation layer 200 within a range of the pixel separation portion 150 with respect to the configuration example illustrated in FIG. 2. A configuration example illustrated in FIG. 7 is an example in which the metal layer 152 with the light-shielding property is provided on the anode electrode 130 without providing the insulation film 200 on the pixel separation portion 150. By providing the metal layer 152 with the high-shielding property, it is possible to divide a light intrusion path for each pixel. In the configuration example illustrated in FIG. 7, the anode electrode 130 and the metal layer 152 with the light-shielding property can have the same potential.

Figure 8:
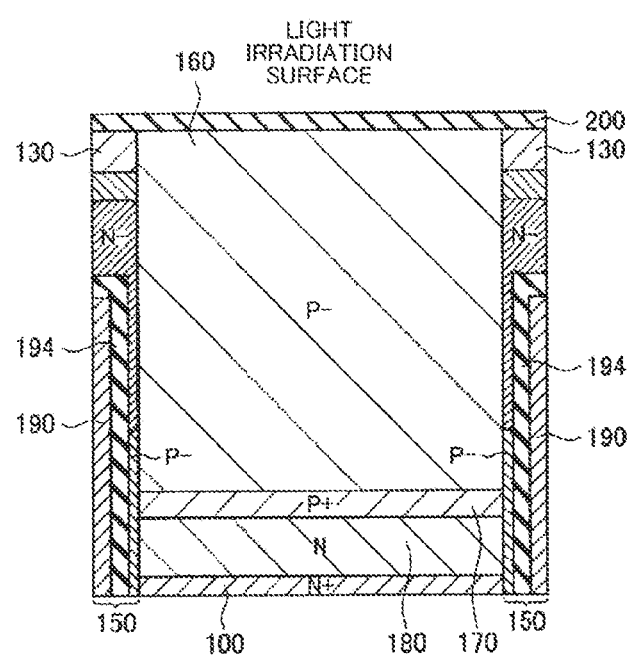
FIG. 8 is a schematic view illustrating an example in which an insulation layer is provided on a light irradiation surface without providing a metal layer with a light-shielding property in the configuration example illustrated in FIG. 3.
Figure 9:
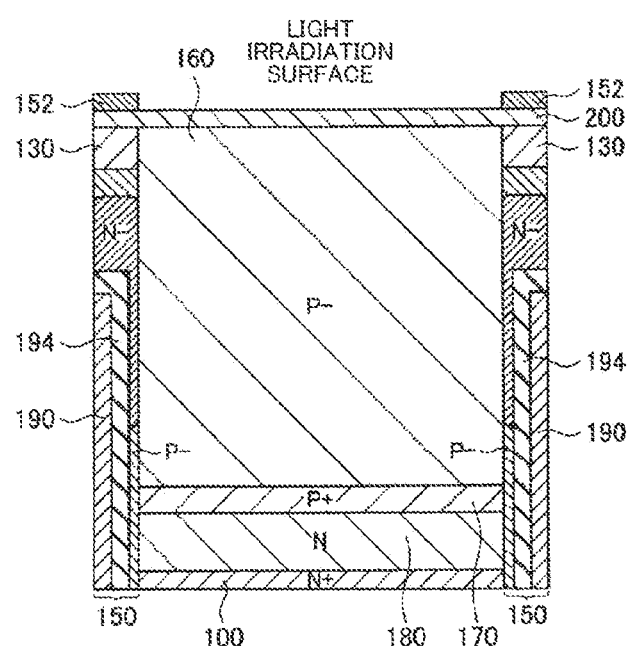
FIG. 9 is a schematic view illustrating an example in which an insulation layer and a metal layer with a light-shielding property are provided as in the configuration example illustrated in FIG. 6 in the configuration example illustrated in FIG. 3.
Figure 10:
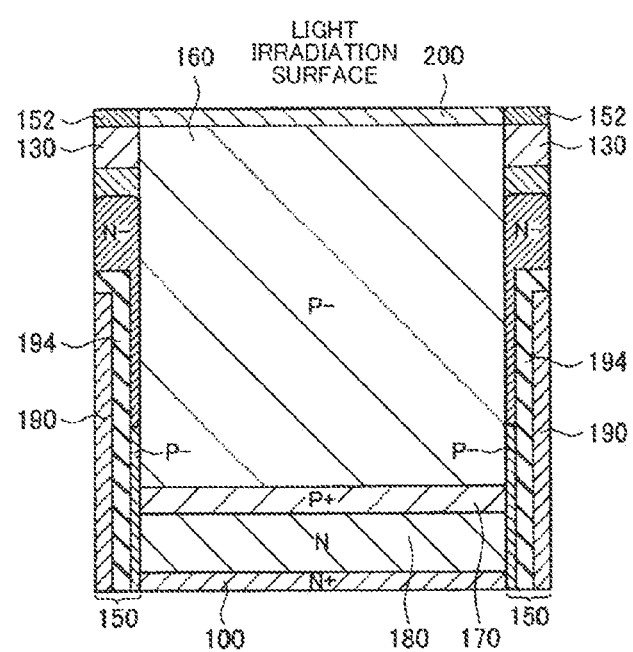
FIG. 10 is a schematic view illustrating an example in which an insulation layer and a metal layer with a light-shielding property are provided as in the configuration example illustrated in FIG. 7 in the configuration example illustrated in FIG. 3.

A configuration example illustrated in FIG. 8 is an example in which the insulation layer 200 is provided on the light irradiation surface without providing the metal layer 152 with the light-shielding property in the configuration example illustrated in FIG. 3. A configuration example illustrated in FIG. 9 is an example in which the insulation layer 200 and the metal layer 152 with the light-shielding property are provided in the configuration example illustrated in FIG. 3, as in the configuration example illustrated in FIG. 6. A configuration example illustrated in FIG. 10 is an example in which the insulation layer 200 and the metal layer 152 with the light-shielding property are provided in the configuration example illustrated in FIG. 3, as in the configuration example illustrated in FIG. 7.

Figure 11:
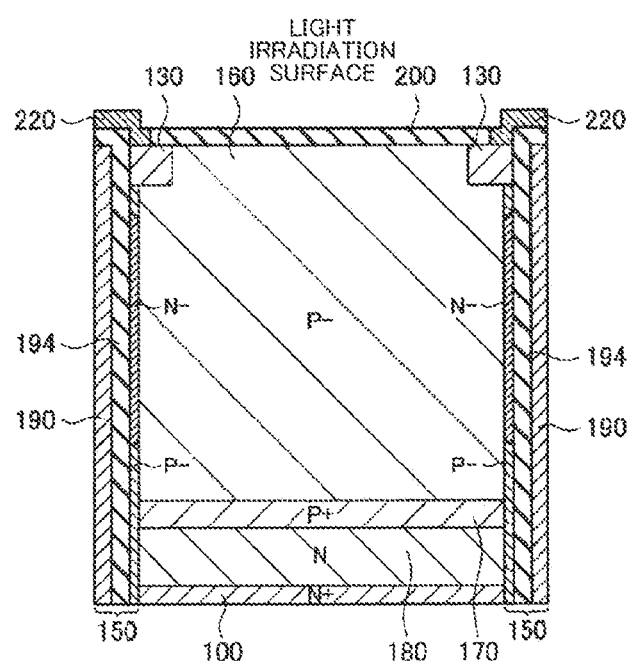
FIG. 11 is a schematic view illustrating an example in which an anode electrode is disposed on a pixel region side closer than a pixel separation portion and the anode electrode is connected to a surface metal layer provided on the pixel separation portion in the configuration example illustrated in FIG. 4.
Figure 12:
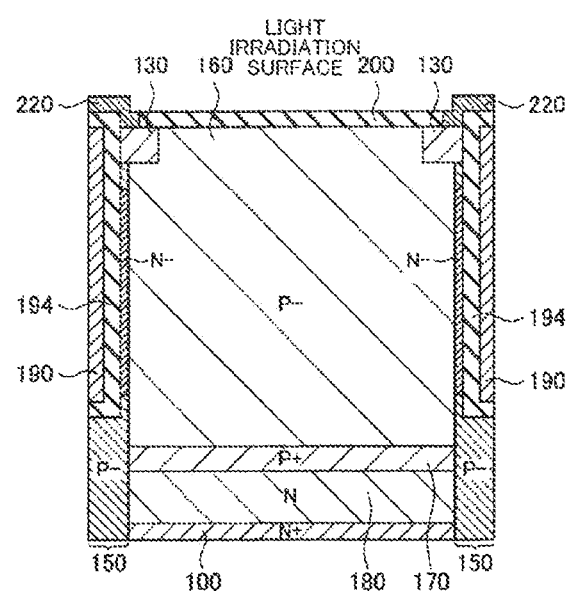
FIG. 12 is a schematic view illustrating an example in which a length of a buried metal layer is shorter in a depth direction of a pixel region in the configuration example illustrated in FIG. 1.

A configuration example illustrated in FIG. 11 is an example in which the anode electrode 130 is disposed on the pixel region side closer than the pixel separation portion 150 and a surface metal layer 220 provided on the pixel separation portion 150 and the anode electrode 130 is connected in the configuration example illustrated in FIG. 4. The anode electrode 130 is connected to the anode electrode 130 of the adjacent pixel region by the surface metal layer 220. Therefore, the surface metal layer 220 is formed over the pixel separation portion 150. A configuration example illustrated in FIG. 12 is an example in which the length of the buried metal layer 190 is shortened in a deep direction of the pixel region (the photoelectric conversion portion 160) with respect to the configuration example illustrated in FIG. 1.

4. Leading of Anode Electrode to Outside

Figure 13:
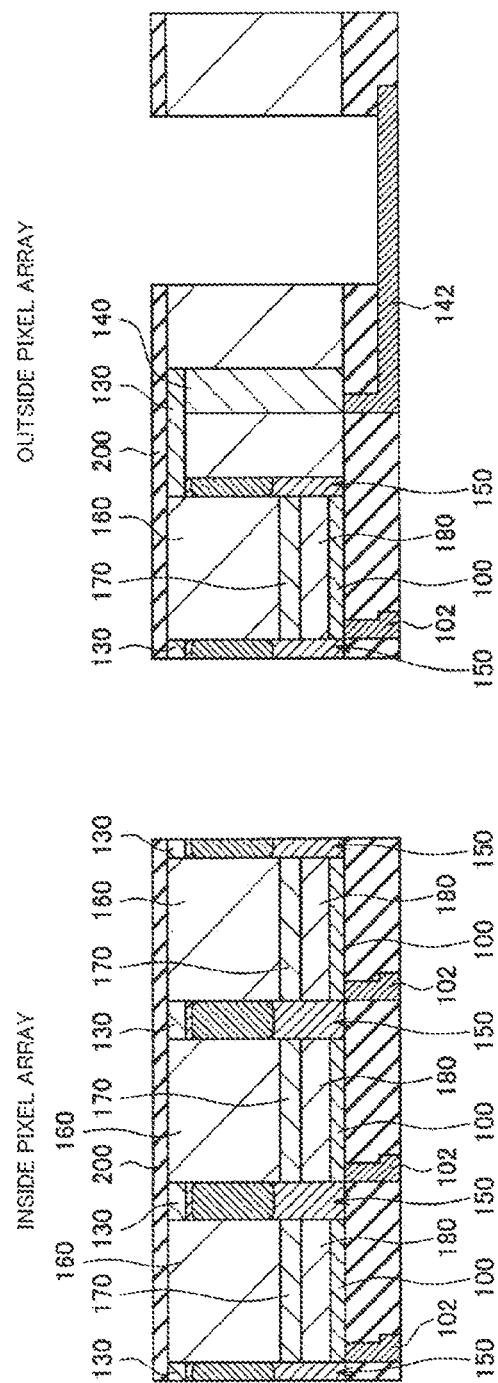
FIG. 13 is a schematic view illustrating a positional relation between an anode electrode and an electrode connected to the anode electrode.
Figure 14:
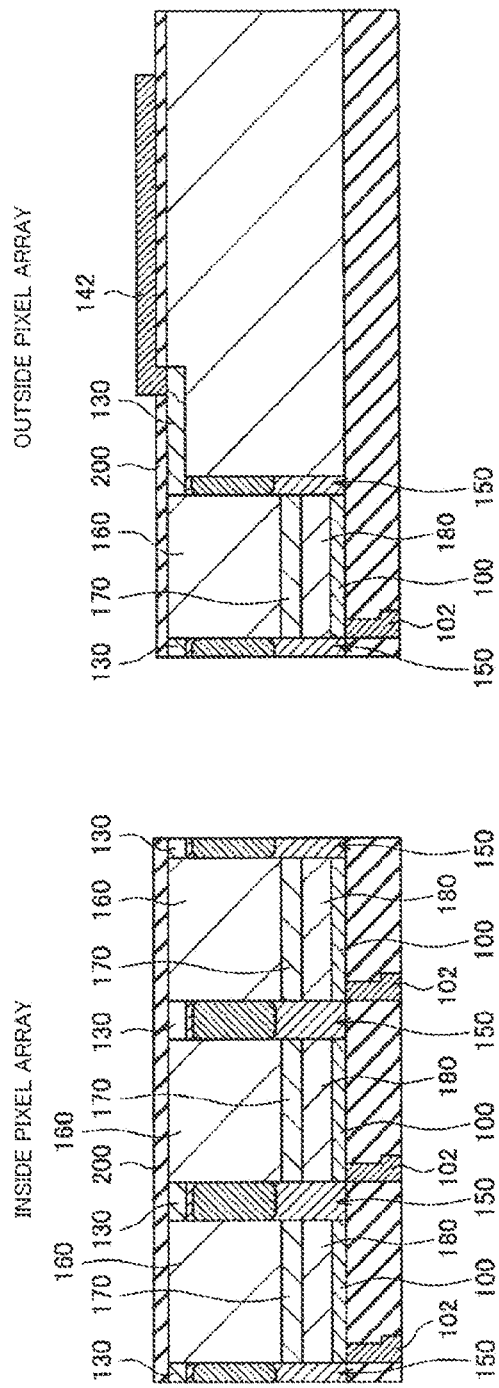
FIG. 14 is a schematic view illustrating a positional relation between an anode electrode and an electrode connected to the anode electrode.
Figure 15:
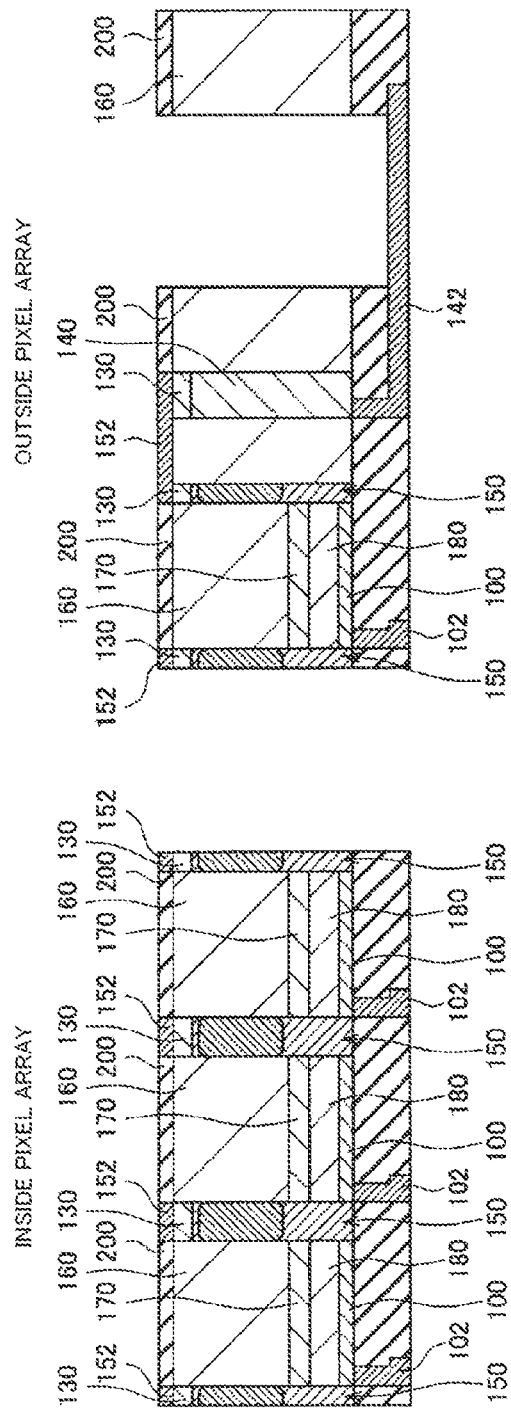
FIG. 15 is a schematic view illustrating a positional relation between an anode electrode and an electrode connected to the anode electrode.

FIGS. 13 to 15 are schematic views illustrating positional relations between the anode electrode 130 and the electrode 142 connected to the anode electrode 130. Here, the electrode 142 is provided outside the pixel array and functions as a bonding pad (lead-out electrode). FIG. 13 illustrates an example in which the anode electrode 130 is led out to the front surface side via the contact layer 140 by providing the contact layer 140 as in FIG. 2 and the contact layer 140 and the electrode 142 on the front surface side are connected. The contact layer 140 may be connected to a peripheral circuit of the pixel array.

An example illustrated in FIG. 14 is an example in which the electrode 142 is provided on the same rear surface side as the anode electrode 130 and the anode electrode 130 and the electrode 142 are directly connected. In the example illustrated in FIG. 14, the electrode 142 serving as a bonding pad is provided on the rear surface side. In FIG. 14, the metal layer 152 with the light-shielding property may be provided on the anode electrode 130, and the metal layer 152 may be connected to the electrode 142 serving as the bonding pad.

An example illustrated in FIG. 15 is an example in which the electrode 142 is provided on the front surface side as in the example illustrated in FIG. 13 and FIG. 15 is a schematic view illustrating an example in which the electrode 152 connected to the anode electrode 130 is provided and is connected to the contact layer 140 via the electrode 152.

5. Positional Relations Between Anode Electrode and Contact Layer

Figure 16:
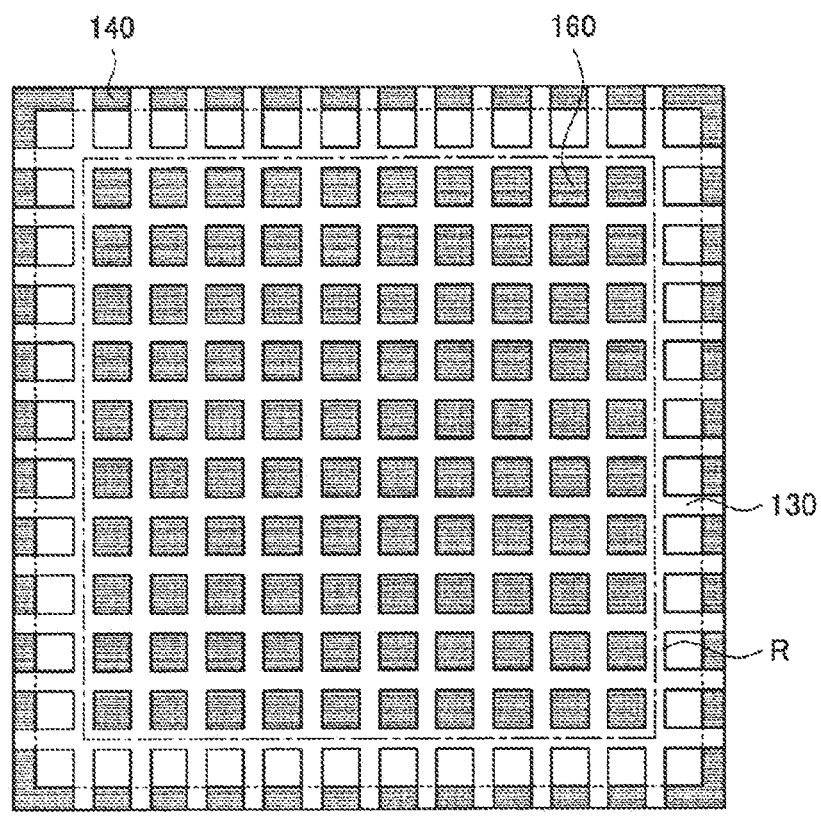
FIG. 16 is a plan view illustrating a positional relation between an anode electrode and a contact layer.
Figure 17:
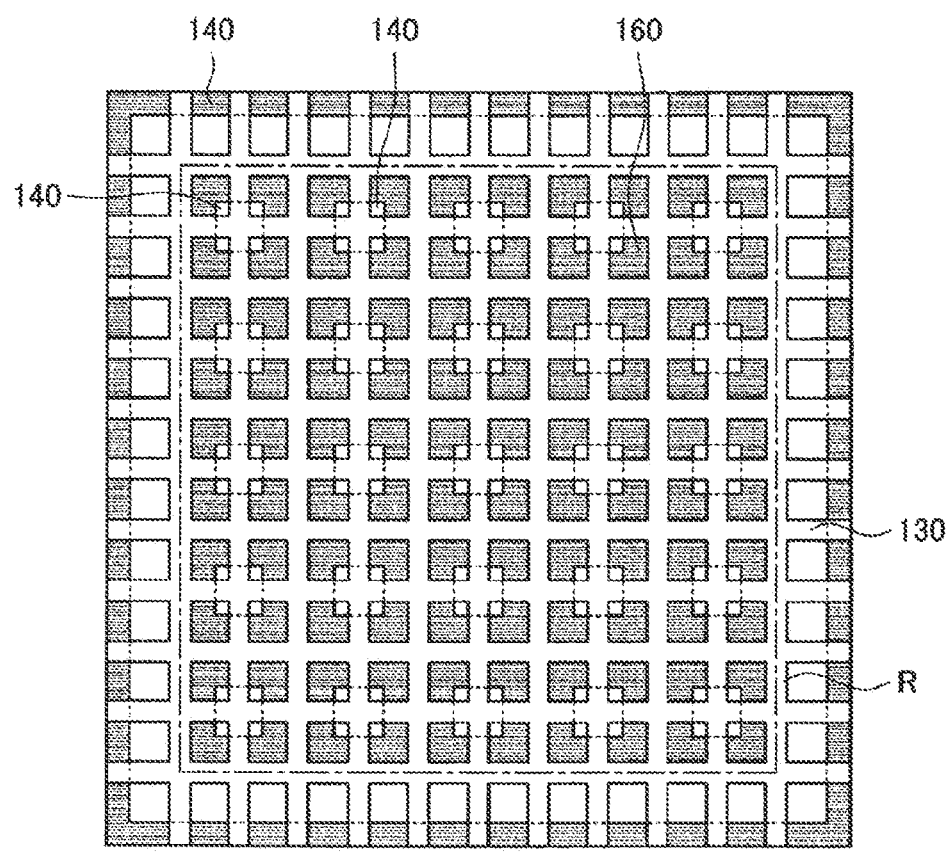
FIG. 17 is a plan view illustrating a positional relation between an anode electrode and a contact layer.

FIGS. 16 and 17 are plan views illustrating positional relations between the anode electrode 130 and the contact layer 140 and illustrate states viewed from the light irradiation surface side (the rear surface side). In FIGS. 16 and 17, the inside of a one-dot chain line R is a region inside the pixel array and the outside of the one-dot chain line R is a region outside the pixel array. As illustrated in FIG. 16, since the anode electrodes 130 are provided along the pixel separation portions 150 inside the pixel array, the anode electrodes 130 are formed in the grid shape. When the metal layer 152 with the light-shielding property is formed, the metal layer 152 with a shape resembling the anode electrode 130 with the grid shape illustrated in FIG. 16 can be provided on the anode electrode 130. The metal layer 152 with the light-shielding property is located closer to the periphery inside the pixel array, so that the position is further shifted from the pixel separation portion 150, and thus correction can be performed in accordance with a pupil position and a light-shielding effect can be improved. In particular, when the metal layer 152 with the light-shielding property is formed on the anode electrode 130 via the insulation layer 200 as in FIG. 6, the metal layer 152 and the anode electrode 130 are not integrated. Therefore, the position of the metal layer 152 can be closer to the periphery inside the pixel array, so that the position can be further shifted from the pixel separation portion 150 (the anode electrode 130). Outside the pixel array, the contact layer 140 is provided to surround the pixel array and the anode electrode 130 is led out on the front surface side via the contact layer 140, as illustrated in FIG. 2. By providing the contact layer 140 in the periphery outside the pixel array, it is possible to reliably suppress a change in a voltage inside the anode electrode 130.

FIG. 17 illustrates an example in which the contact layer 140 is also provided inside the pixel array in addition to the configuration of FIG. 16. As illustrated in FIG. 17, by also providing the contact layer 140 inside the pixel array, it is possible to further stabilize the potential of the anode electrode 130.

6. Configuration Example Including Color Filter and Lens

Figure 18:
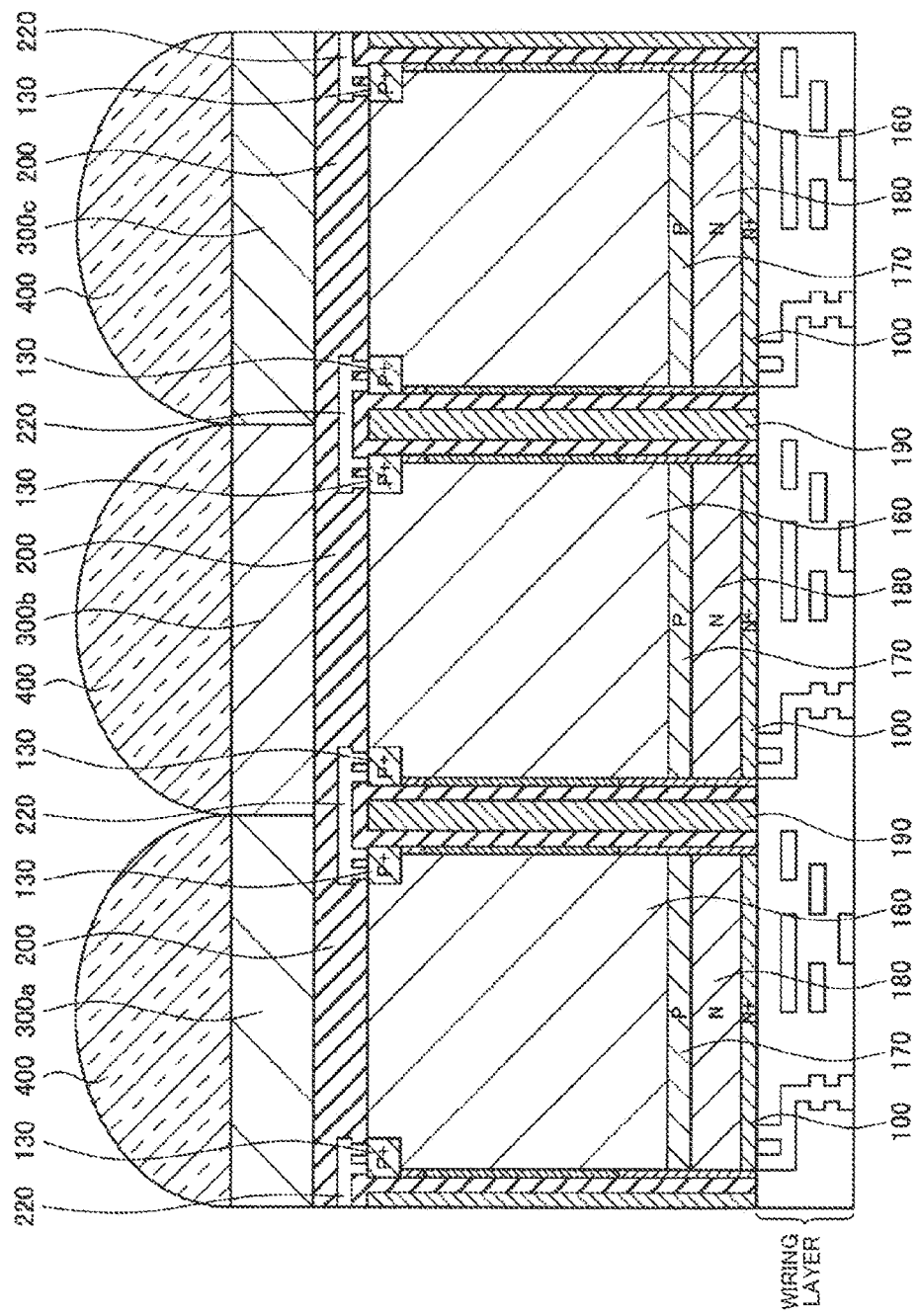
FIG. 18 is a schematic sectional view illustrating a configuration in which color filters are provided on an insulation layer of a light irradiation surface and on-chip lenses are further provided on the color filters in the configuration illustrated in FIG. 12.

FIG. 18 is a schematic sectional view illustrating a configuration in which color filters 300a, 300b, and 300c are provided on the insulation layer 200 of the light irradiation surface and on-chip lenses 400 are further provided on the color filters 300a, 300b, and 300c in the configuration illustrated in FIG. 12. The photoelectric conversion portions 160 are irradiated with light passing through the on-chip lenses 400 and the color filters 300a, 300b, and 300c. In FIG. 18, the insulation film 194 of the pixel separation portion 150 illustrated in FIG. 12 is commonly provided in the insulation layer 200 of the light irradiation surface.

Figure 19:
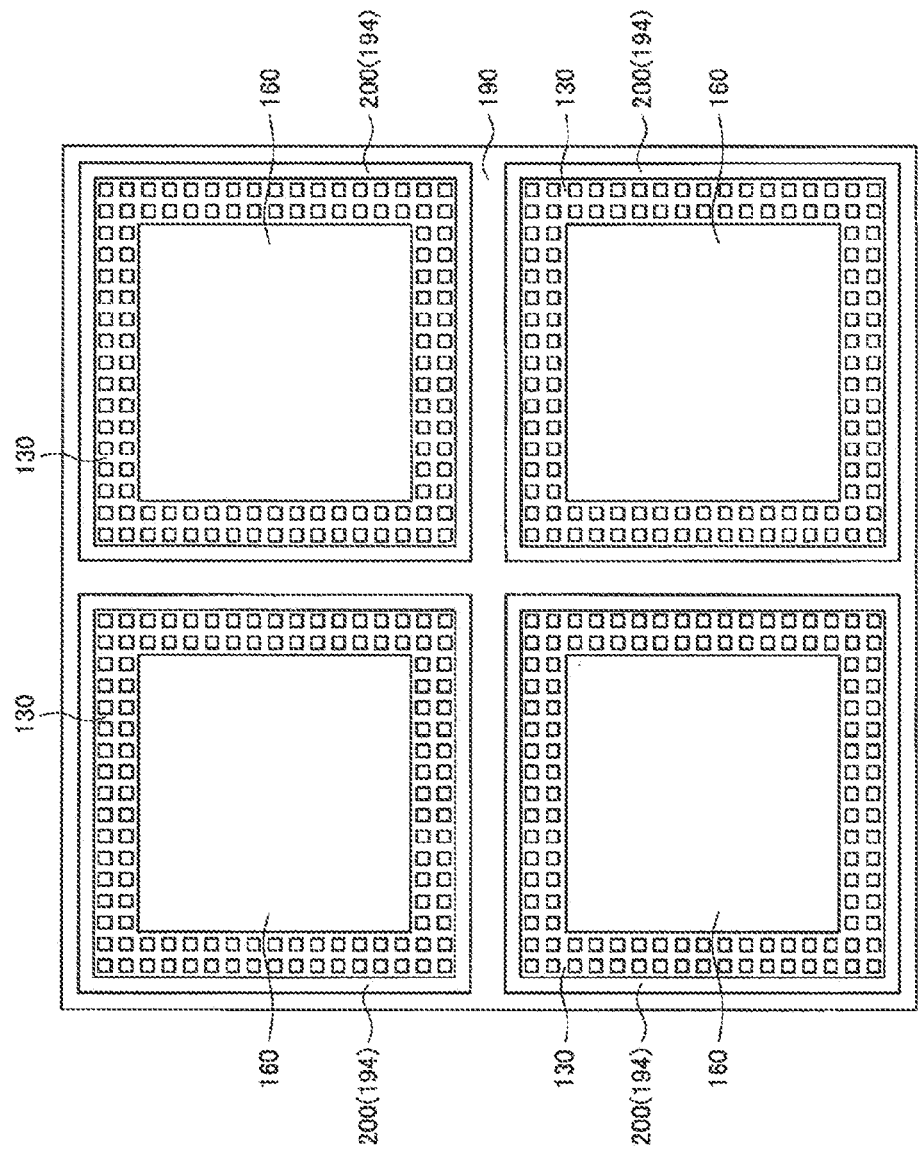
FIG. 19 is a schematic view illustrating a state in which a region of a photoelectric conversion portion is viewed from a boundary surface between the insulation layer and the photoelectric conversion portion illustrated in FIG. 18.

FIG. 19 is a schematic view illustrating a state in which a region of a photoelectric conversion portion 160 is viewed from a boundary surface between the insulation layer 200 and the photoelectric conversion portion 160 illustrated in FIG. 18. As illustrated in FIG. 19, the pixel separation portion 150 is provided from the buried metal layer 190 and the insulation layer 200 (the insulation film 194) and a pixel region formed from the photoelectric conversion portion 160 is demarcated by the pixel separation portion 150. In each photoelectric conversion portion 160 illustrated in FIG. 19, the anode electrode 130 is provided to surround a pixel region along the pixel separation portion 150.

7. Application Example of Imaging Device According to Embodiment

Figure 20:
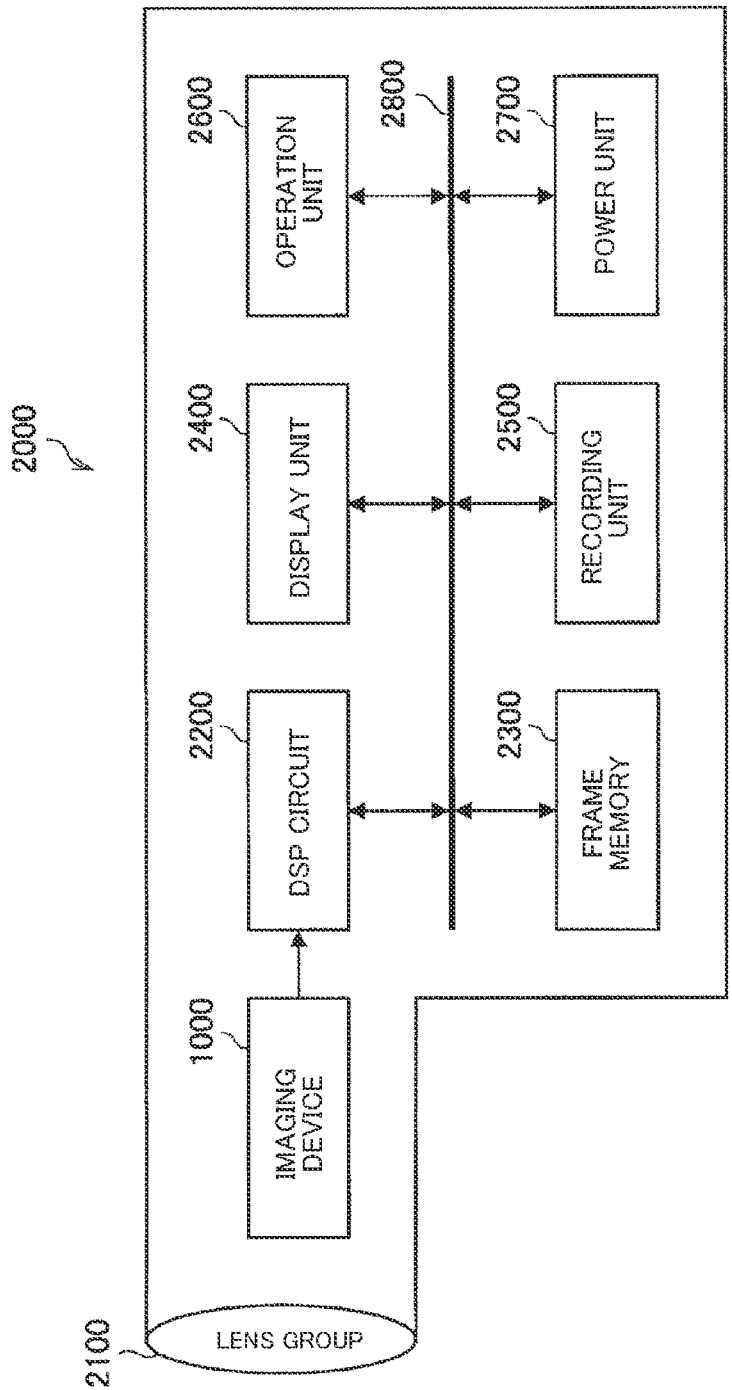
FIG. 20 is a block diagram illustrating a configuration example of a camera device which is an electronic device to which the present technology is applied.

FIG. 20 is a block diagram illustrating a configuration example of a camera device 2000 which is an electronic device to which the present technology is applied. The camera device 2000 illustrated in FIG. 20 includes an optical unit 2100 formed by a lens group or the like, the above-described imaging device 1000, and a DSP circuit 2200 which is a camera signal processing device. The camera device 2000 also includes a frame memory 2300, a display unit (a display device) 2400, a recording unit 2500, an operation unit 2600, and a power unit 2700. The DSP circuit 2200, the frame memory 2300, the display unit 2400, the recording unit 2500, the operation unit 2600, and the power unit 2700 are connected to each other via a bus line 2800.

The optical unit 2100 takes incident light (image light) from a subject and forms an image on an imaging surface of the imaging device 1000. The imaging device 1000 converts a light amount of the incident light formed as an image on the imaging surface by the optical unit 2100 into an electric signal in units of pixels and outputs the electric signal as a pixel signal.

The display unit 2400 is, for example, a panel display device such as an organic electro-luminescence (EL) panel or a liquid crystal panel and displays a moving image or a still image captured by the imaging device 1000. The DSP circuit 2200 receives the pixel signal output from the imaging device 1000 and performs a process for displaying the pixel signal on the display unit 2400. The recording unit 2500 records the moving image or the still image captured by the imaging device 1000 on a recording medium such as a video tape or a digital versatile disk (DVD).

The operation unit 2600 issues operation instructions for various functions of the imaging device 1000 in response to operations of a user. The power unit 2700 appropriately supplies various power sources which serve as operation power sources of the DSP circuit 2200, the frame memory 2300, the display unit 2400, the recording unit 2500, and the operation unit 2600 to supply targets.

8. Variations of Present Disclosure

Hereinafter, problems occurring when the present disclosure is implemented specifically and variations of the embodiment for solving the problems will be described.

8.1. Common Structure

Figure 21A:
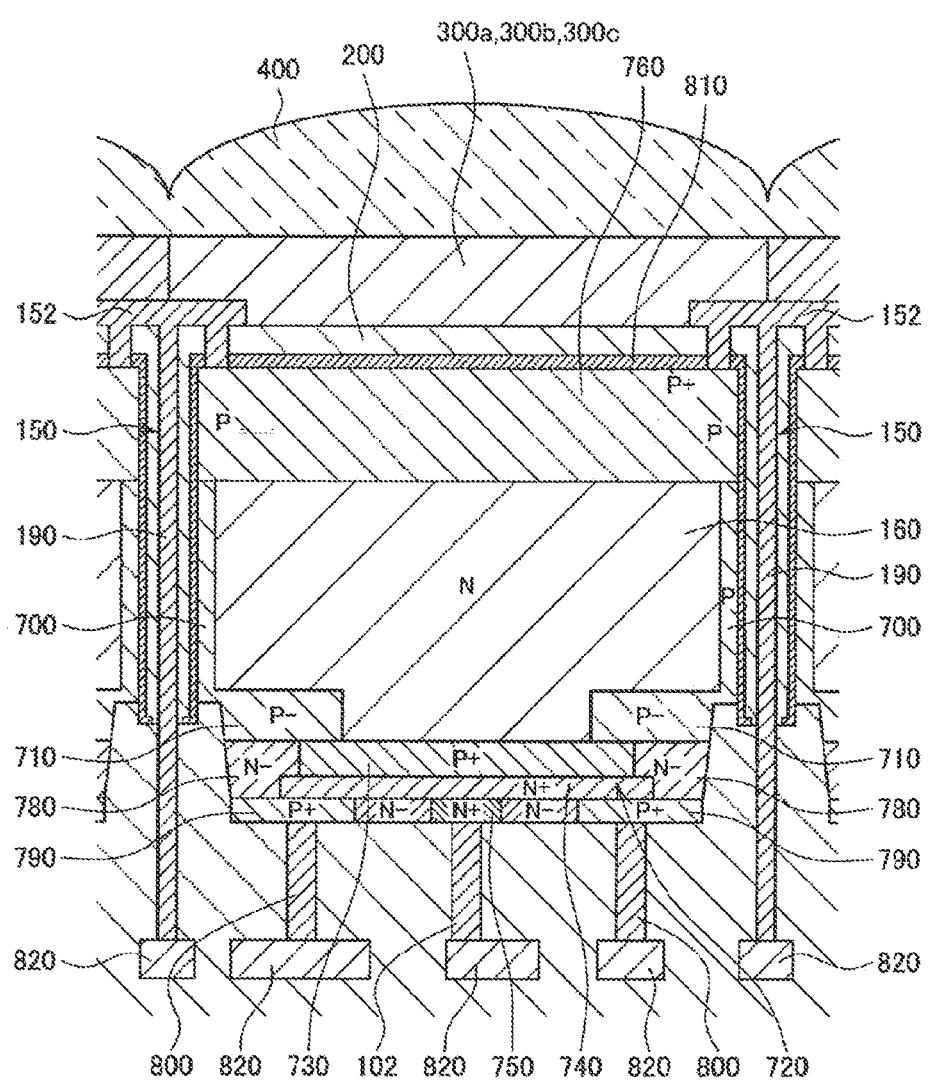
FIG. 21A is a schematic sectional view illustrating a basic configuration common to each variation.

First, a basic configuration common to each variation will be described. FIG. 21A is a schematic sectional view illustrating the basic configuration common to each variation. The imaging device 1000 illustrated in FIG. 21A includes a multiplication region serving as an SPAD pixel and a photoelectric conversion portion (N− region) 160 performing photoelectric conversion. The outermost surface of the photoelectric conversion portion 160 on the rear surface side serves as a light irradiation portion irradiated with light.

As illustrated in FIG. 21A, the metal layer 152 that functions as the anode electrode 130 is electrically connected to a P region 760. The P region 760 is configured such that an impurity concentration is lower in a lower layer. A P region 700 and a P− region 710 are formed from the P region 760 along the pixel separation portion 150, and a portion from the P region 760 to an avalanche portion 720 is electrically connected. The avalanche portion 720 is configured by bonding a P+ region 730 and an N+ region 740. The P region 700 is configured by accumulating opposite charges (holes) so that charges (electrons) desired to be read with the avalanche portion 720 pass. The P− region 710 is preferably formed as a low-concentration region in order to raise a potential of the middle so that charges pass through the avalanche portion 720.

The N+ region 740 is connected to the electrode 102 via an N+ region 750. An N− region 780 is formed on lateral surfaces of the P+ region 730 and the N+ region 740. A P+ layer 790 electrically connected to the N+ region 740 and the N− region 780 is provided. The P+ layer 790 is grounded (GND) via an electrode 800. The P+ layer 790 may be an N layer. The electrode such as a wiring layer 820 connected to the P+ layer 790 may not be formed. The electrode 102 is an electrode that outputs a signal corresponding to incident light. On the other hand, the electrode 800 is an electrode for discharging holes. The P+ layer 790 and the electrode 800 may not be provided. Each of the electrode 102, the electrode 800, and the buried metal layer 190 provided in the pixel separation portion 150 is connected to the wiring layer 820. The wiring layer 820 is a partial wiring layer of the uppermost layer among the wiring layers illustrated in FIG. 18. The P+ layer 790 may be an N layer. The electrode such as the wiring layer 820 connected to the P+ layer 790 may not be provided.

An insulation film (a fixed charge film) 810 is provided on the lateral surface of the pixel separation portion 150 and an upper layer of the P region 760. The insulation film 810 is charged negatively, for example. The configuration of the upper layer of the P region 760 is basically similar to the configuration illustrated in FIG. 18. In the configuration illustrated in FIG. 21A, P-type and N-type conductivity types can also be interchanged to configure the imaging device 1000.

In the imaging device 2000 that has the foregoing configuration in FIG. 21A, the N+ region 740 and the N+ region 750 correspond to the N-type layer 180 illustrated in FIG. 2. The P region 760, the P region 700, and the P– region 710 correspond to the photoelectric conversion portion (the third semiconductor layer) 160 and the P-type layer 170.

Figure 21B:
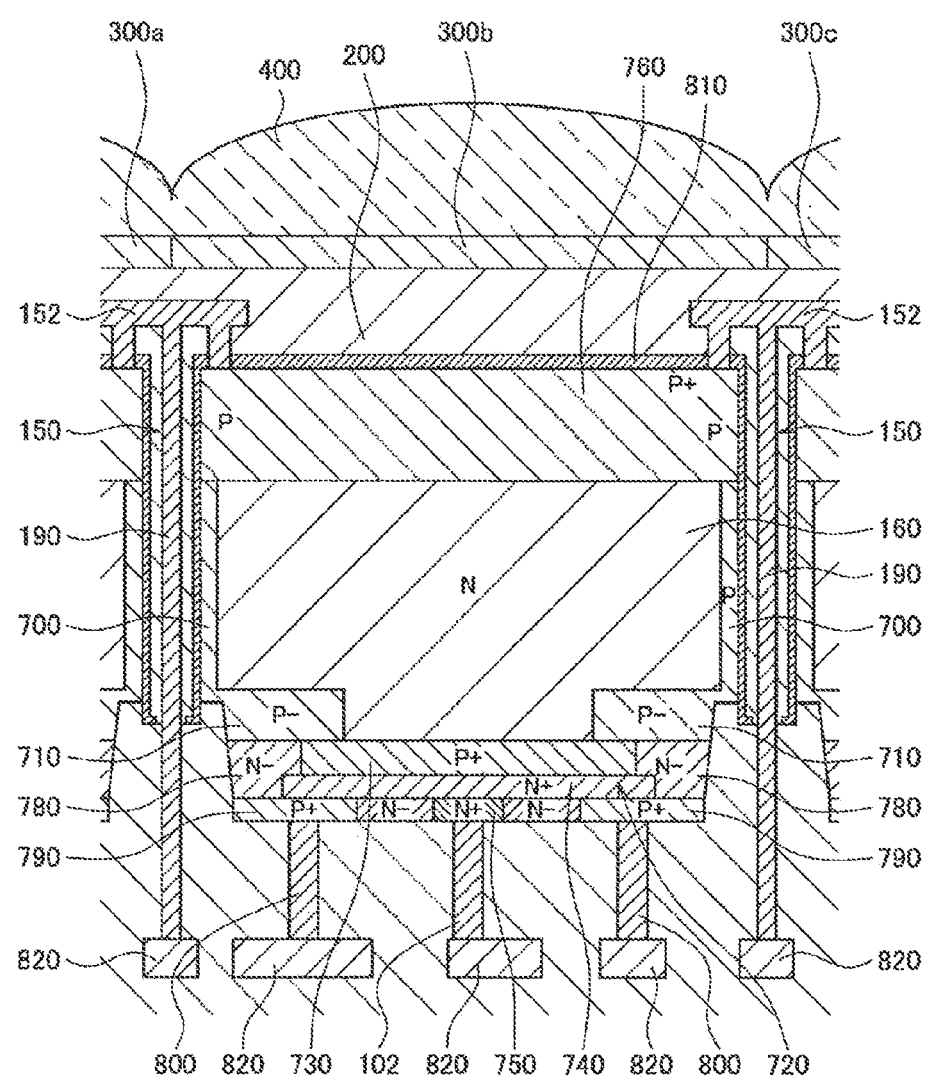
FIG. 21B is a schematic sectional view illustrating an example in which the metal layer is covered with a similar insulation film to that of FIG. 18 and color filters are provided in FIG. 21A.

In each of the variations to be described below, the configuration of the SPAD pixel illustrated in FIG. 21A is assumed to be basically included and illustration is appropriately omitted. In each variation, a configuration other than the basic configuration is partially illustrated, but can be appropriately replaced with the basic configuration. FIG. 21B is a schematic sectional view illustrating an example in which the metal layer 152 is covered with the similar insulation film 200 to that of FIG. 18 and the color filters 300a, 300b, and 300c in FIG. 21A are provided.

8.2. First Variation

As illustrated in FIG. 3, by burying the buried metal layer 190 in the pixel separation portion 150, it is possible to improve a light-shielding property between adjacent pixels, and thus it is possible to suppress interpixel interference occurring in a deep region of the pixel region. A first variation relates to a configuration in which the anode electrode 130 serves as the metal layer 152 and the buried metal layer 190 and the anode electrode 130 (the metal layer 152) are electrically connected.

Figure 22A:
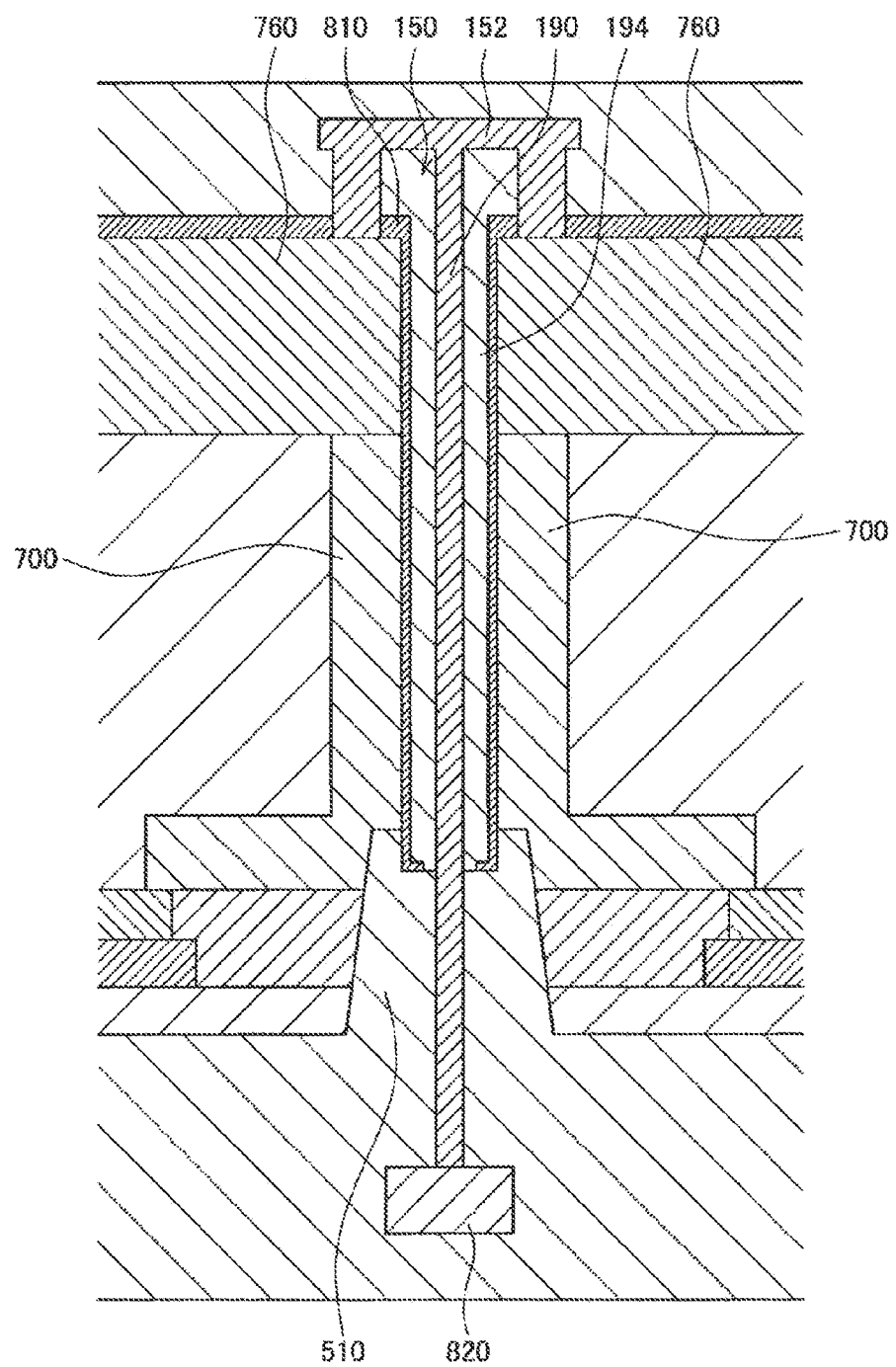
FIG. 22A is a schematic sectional view illustrating the vicinity of the pixel separation portion in detail with regard to the imaging device of a first variation.

FIG. 22A is a schematic sectional view illustrating the vicinity of the pixel separation portion 150 in detail with regard to the imaging device 1000 of the first variation. As illustrated in FIG. 22A, the buried metal layer 190 is provided to penetrate through the pixel separation portion 150. The buried metal layer 190 is electrically connected to the P region 760 on the rear surface side via the metal layer 152. By electrically connecting the buried metal layer 190 with the metal layer 152 serving as the anode electrode 130, it is possible to reduce parasitic resistance of the anode electrode. In particular, it is possible to reduce a voltage drop in a pixel area middle portion.

FIGS. 22B to 22II are schematic sectional views illustrating other aspects of the imaging device 1000 according to the first variation. In the aspects of FIGS. 22B to 22II, the buried metal layer 190 and the metal layer 152 are electrically connected.

Figure 22B:
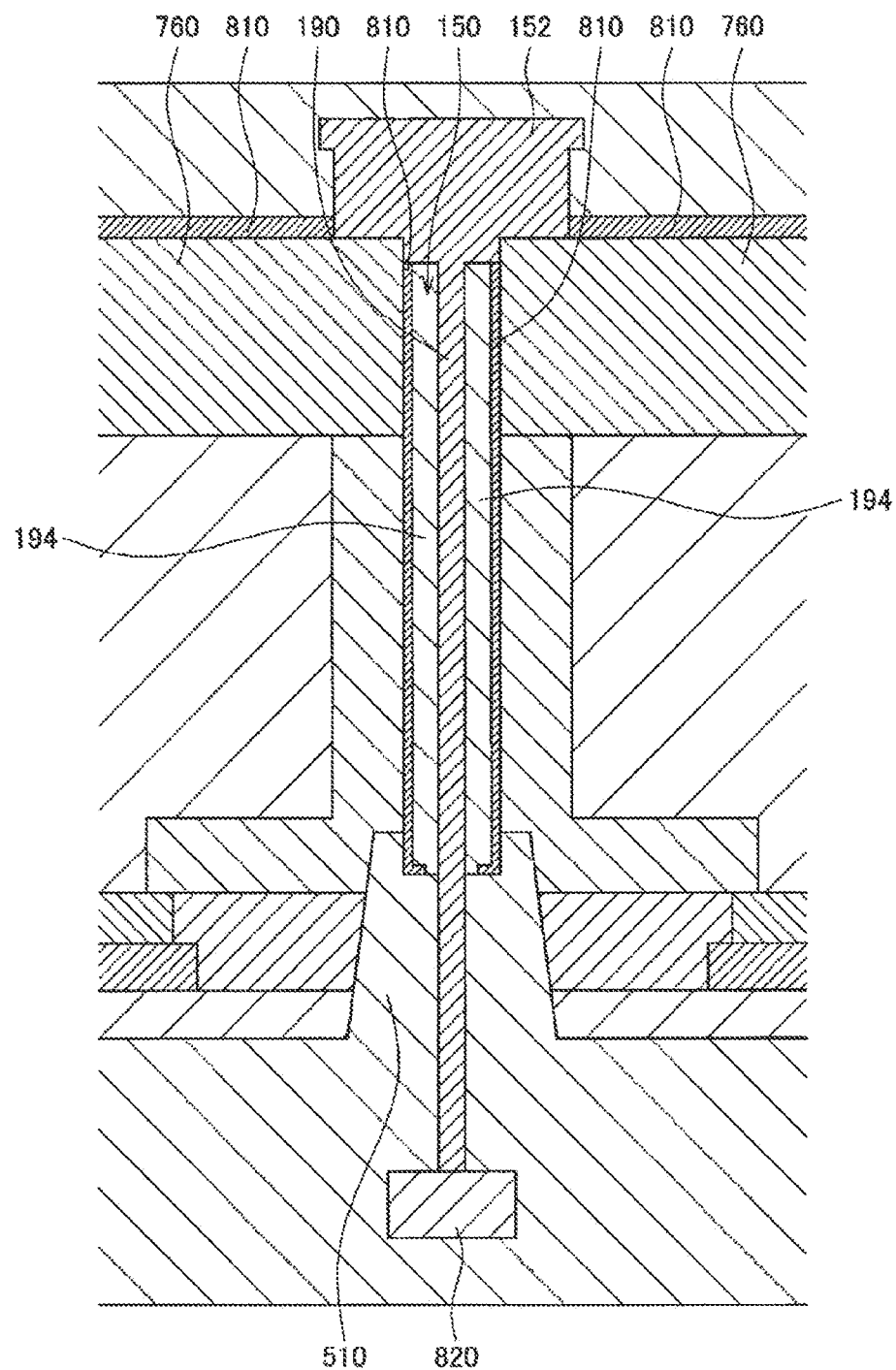
FIG. 22B is a schematic sectional view illustrating another aspect of the imaging device according to the first variation.
Figure 22C:
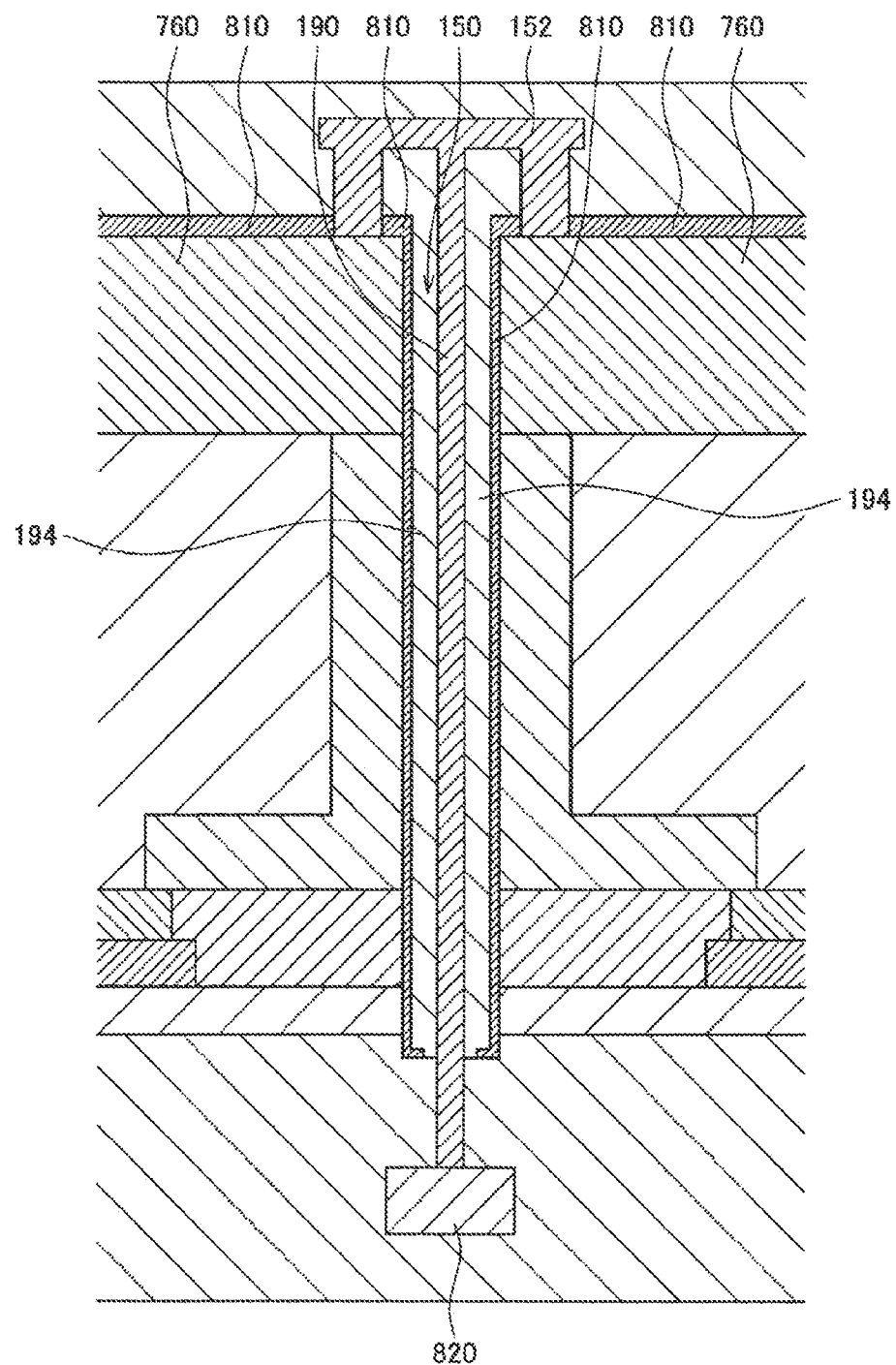
FIG. 22C is a schematic sectional view illustrating still another aspect of the imaging device according to the first variation.
Figure 22D:
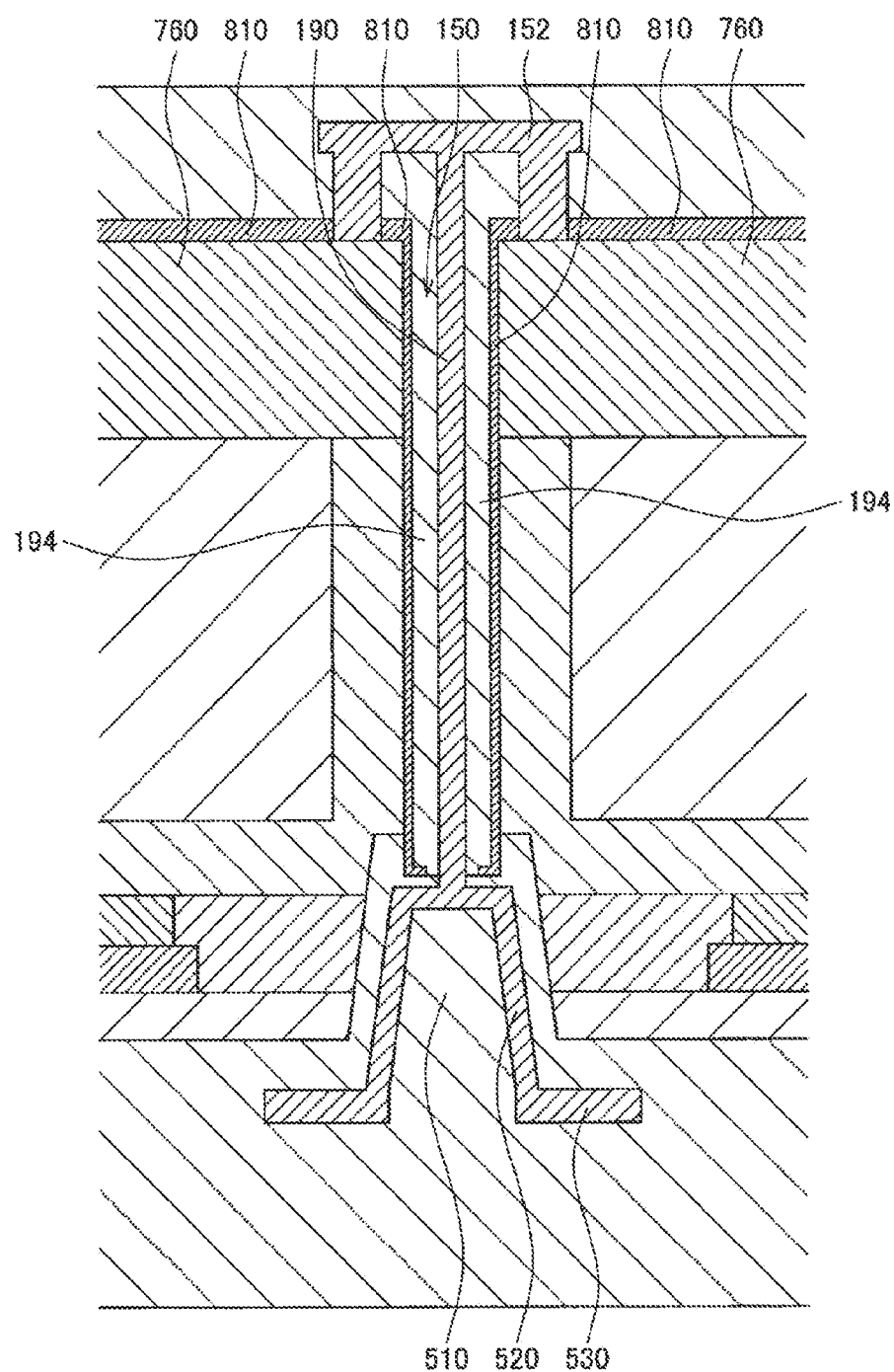
FIG. 22D is a schematic sectional view illustrating still another aspect of the imaging device according to the first variation.
Figure 22E:
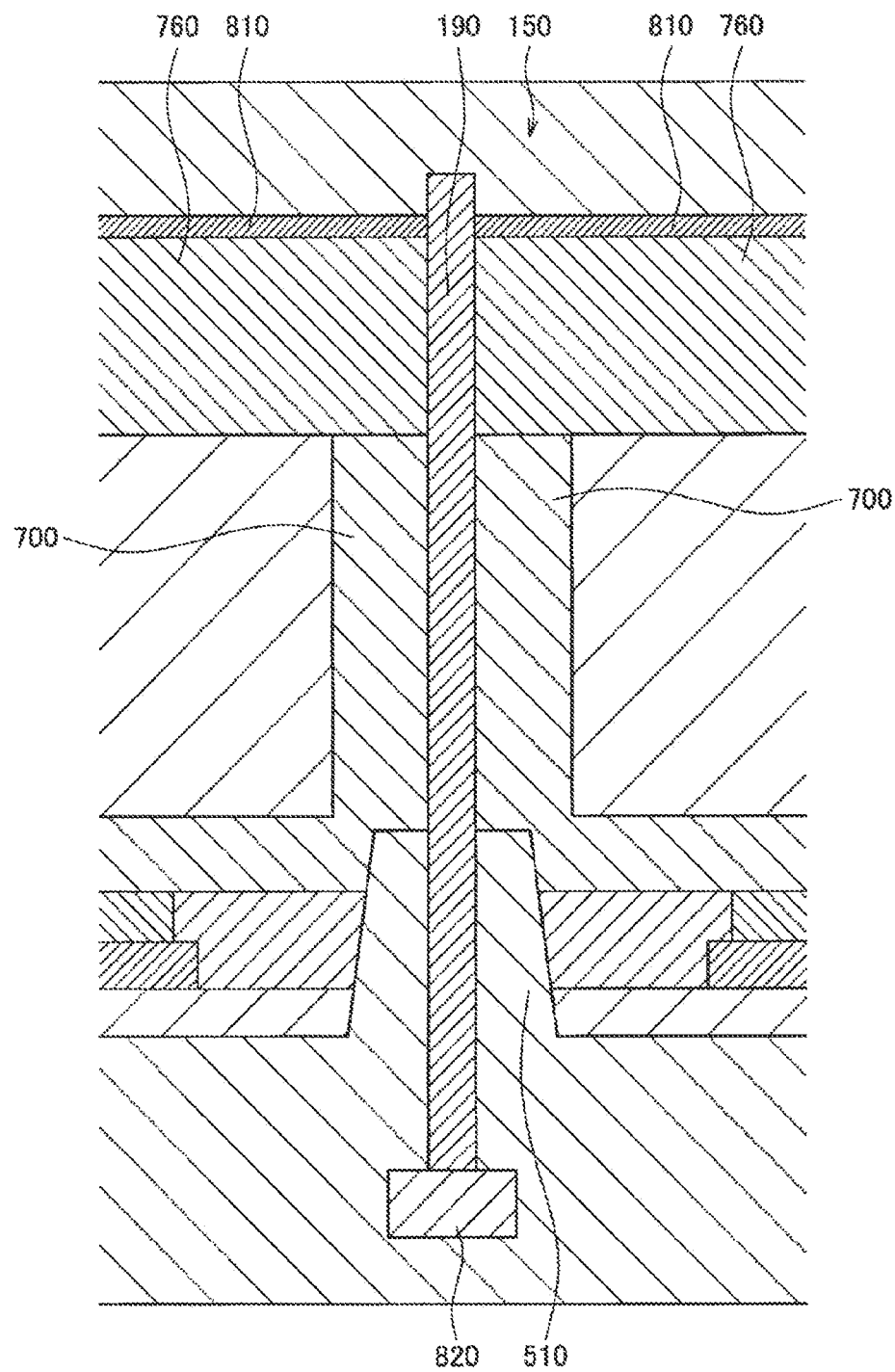
FIG. 22E is a schematic sectional view illustrating still another aspect of the imaging device according to the first variation.
Figure 22F:
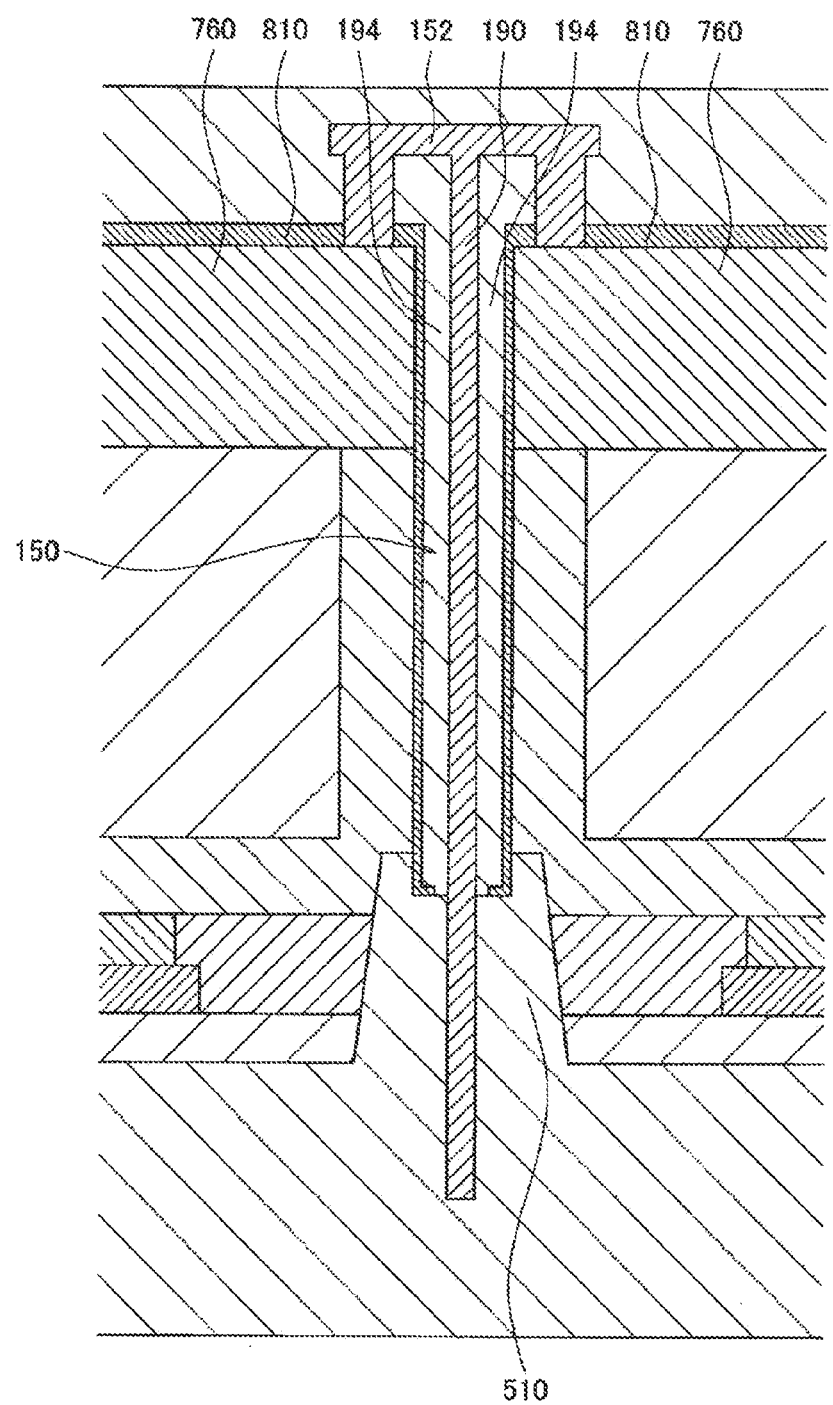
FIG. 22F is a schematic sectional view illustrating still another aspect of the imaging device according to the first variation.
Figure 22G:
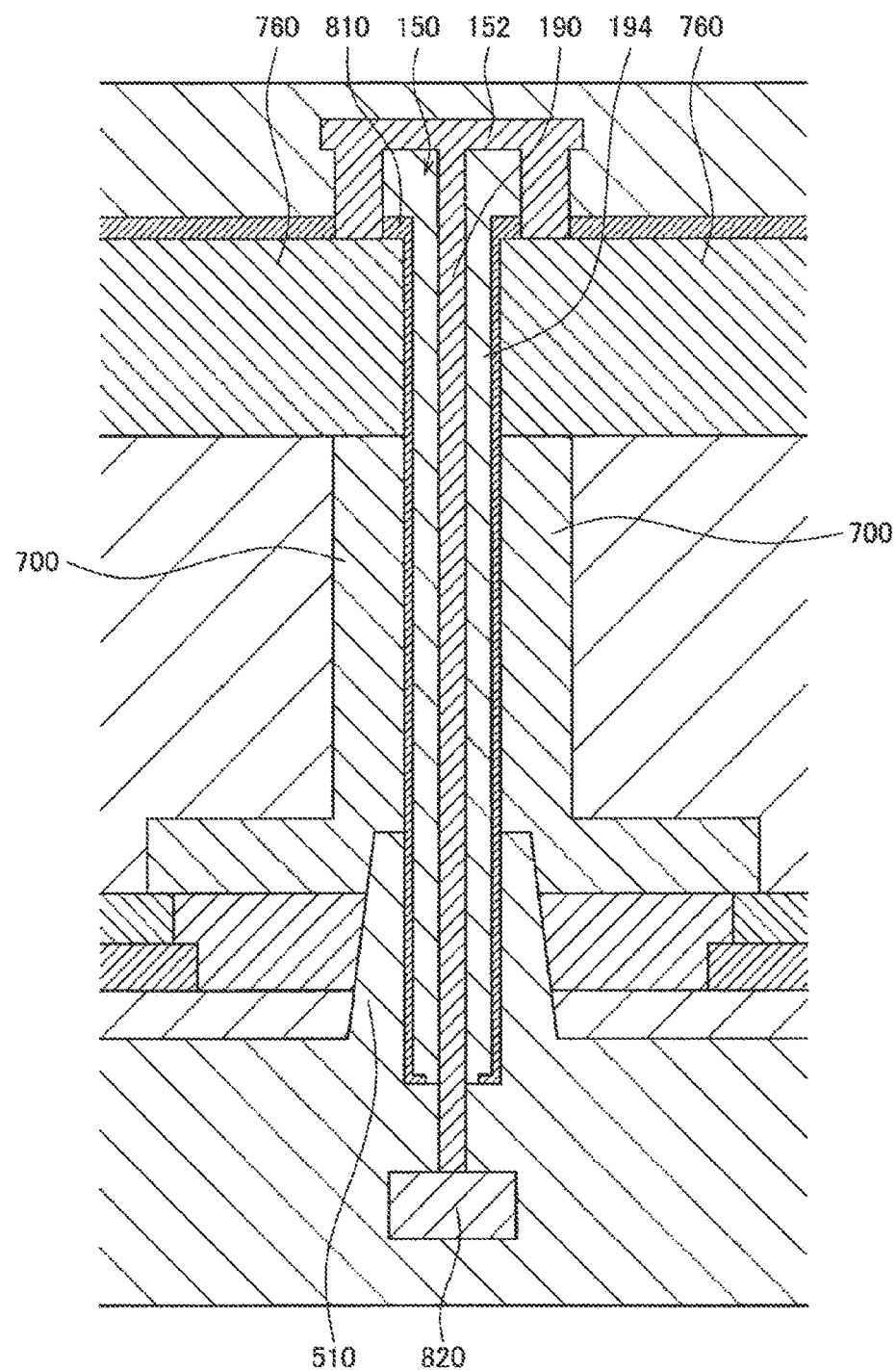
FIG. 22G is a schematic sectional view illustrating still another aspect of the imaging device according to the first variation.
Figure 22H:
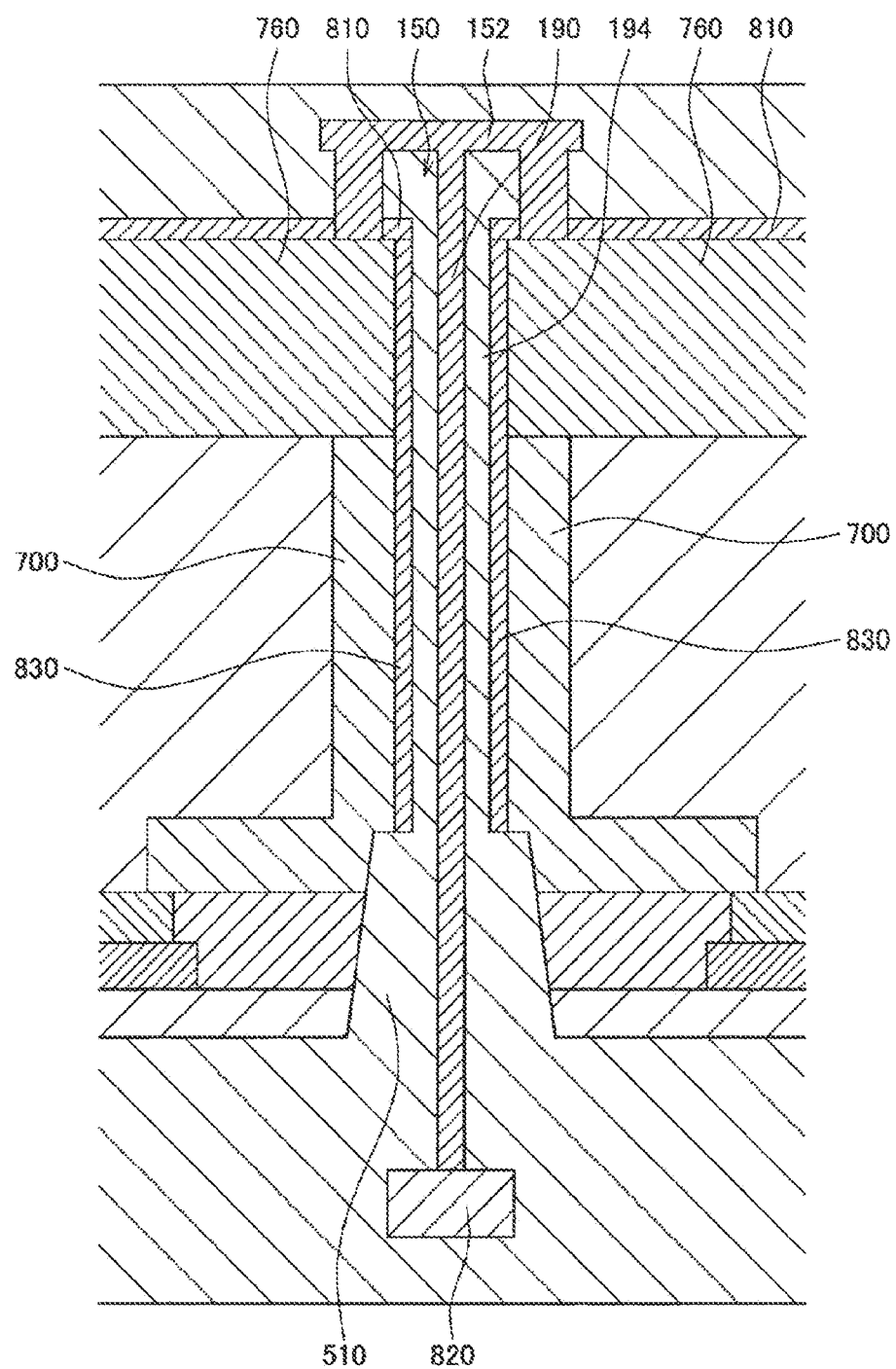
FIG. 22H is a schematic sectional view illustrating still another aspect of the imaging device according to the first variation.

FIG. 22B illustrates an example in which the pixel separation portion 150 is covered with the metal layer 152. FIG. 22C illustrates an example in which a buried insulation film 510 on the front surface side illustrated in FIG. 22A is not formed and the width of the pixel separation portion 150 reading from the rear surface to the front surface is constant. FIG. 22D illustrates an example in which the buried insulation film 510 illustrated in FIG. 22A is recessed to form a depression 520 and a buried metal layer 530 connected to the buried metal layer 190 is formed in the depression 520. FIG. 22E is a schematic view illustrating an example in which the buried metal layer 190 is formed without providing the insulation film 194 in the configuration illustrated in FIG. 22A. In the configuration illustrated in FIG. 22E, an end surface of the upper side of the buried metal layer 190 protrudes more than the upper surface of the insulation film 810, but the end surface of the upper side of the buried metal layer 190 may be located at the same position as the upper surface of the insulation film 810. FIG. 22F illustrates a configuration in which the buried metal layer 190 is not connected to the wiring layer 820 in the configuration illustrated in FIG. 22A. FIG. 22G illustrates a configuration in which the insulation film 810 extends to the lower portion of the buried insulation film 510 in the configuration illustrated in FIG. 22A. FIG. 22II illustrates a configuration in which a high-concentration P layer 830 is provided without providing the insulation film 810 on the lateral side of the buried metal layer 190 in the configuration illustrated in FIG. 22A. The high-concentration P layer 830 corresponds to a P layer 544 illustrated in a manufacturing process of FIG. 25 to be described below. As illustrated in FIG. 22II, a high-concentration P layer 830 may be formed instead of the insulation film 810. In FIG. 22II, the insulation film 810 formed on the P region 760 may not be provided.

In FIGS. 22A to 22C, 22E, 22G, and 22II, the buried metal layer 190 is connected to the wiring layer 820 on the opposite side of the metal layer 152. By connecting the buried metal layer 190 to the wiring layer 820, it is possible to expand an area as an anode wiring and further lower resistance of the anode.

By connecting the buried metal layer 190 to the wiring layer 820, it is possible to further suppress mixed color due to leakage of light in adjacent pixels. By connecting the wiring layer 820 extending in the horizontal direction or the wiring layer 820 formed more deeply than the substrate to the buried metal layer 190, it is possible to suppress incidence of light to adjacent pixels due to reflection from the wiring layer 820 of the lower layer. The wiring layer 820 in the horizontal direction connected to the buried metal layer 190 can reflect obliquely incident light, and light can be again caused to be incident on pixels desired to be detected.

It is also possible to discharge charges (holes collected by the P type) on the incident surface side (the upper side) of the light and it is also possible to discharge charges from the lower side or both the upper and lower sides at the time of connection to the wiring layer 820 on the lower side. In a plan view, the wiring layer 820 of the lower side can also be formed voluntarily similarly to a wiring layout of the upper side.

Figure 23A:
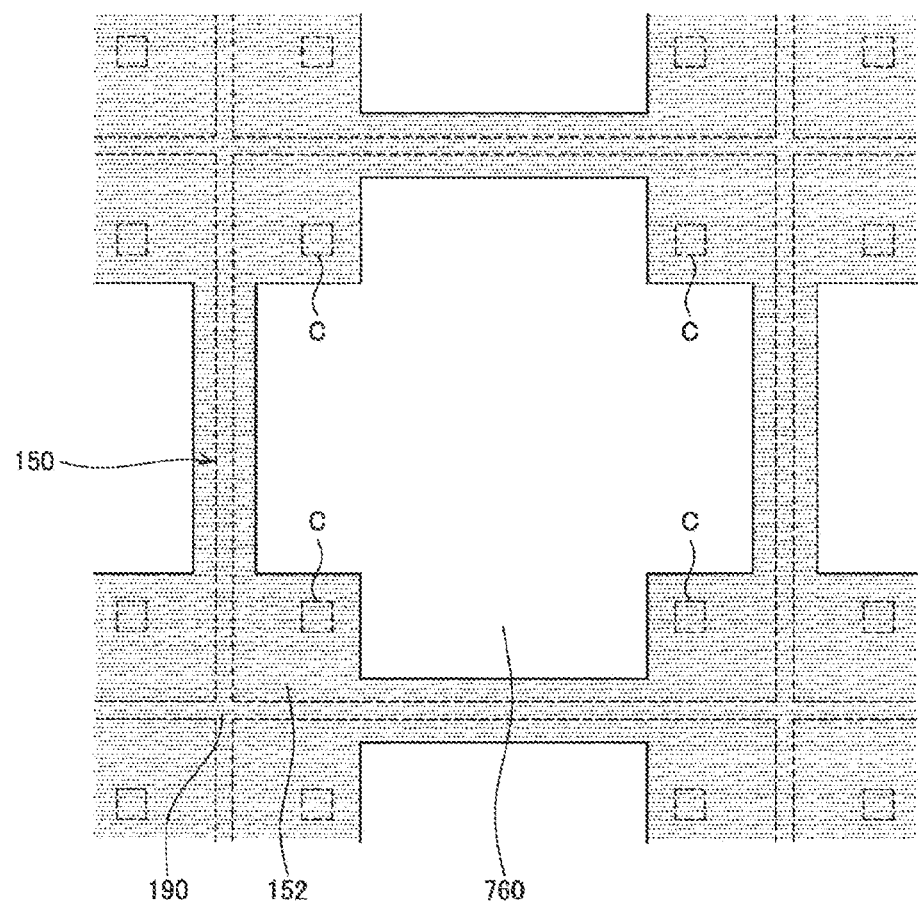
FIG. 23A is a plan view illustrating the imaging device according to the first variation.
Figure 23B:
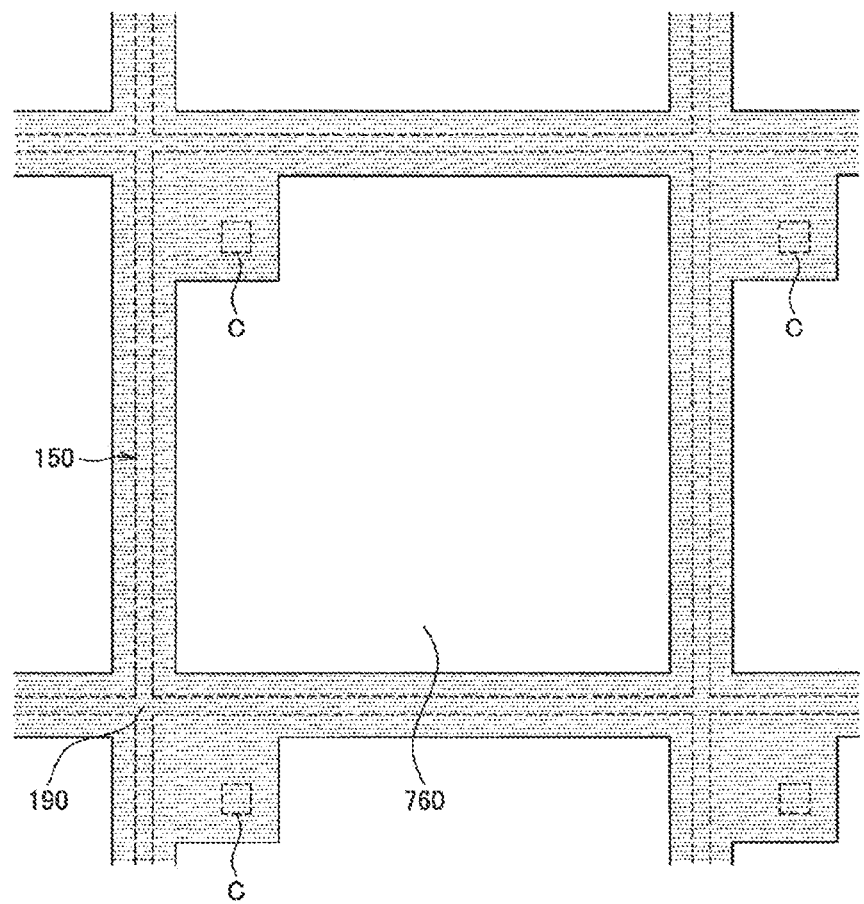
FIG. 23B is a plan view illustrating the imaging device according to the first variation.
Figure 23C:
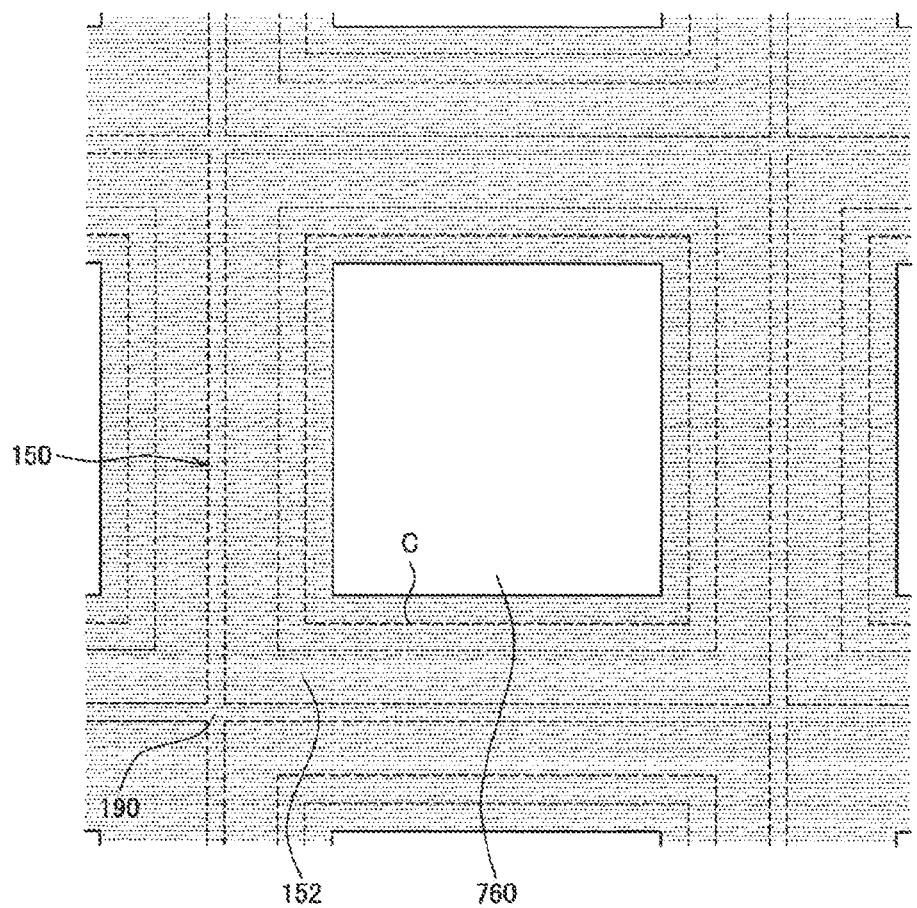
FIG. 23C is a plan view illustrating the imaging device according to the first variation.
Figure 23D:
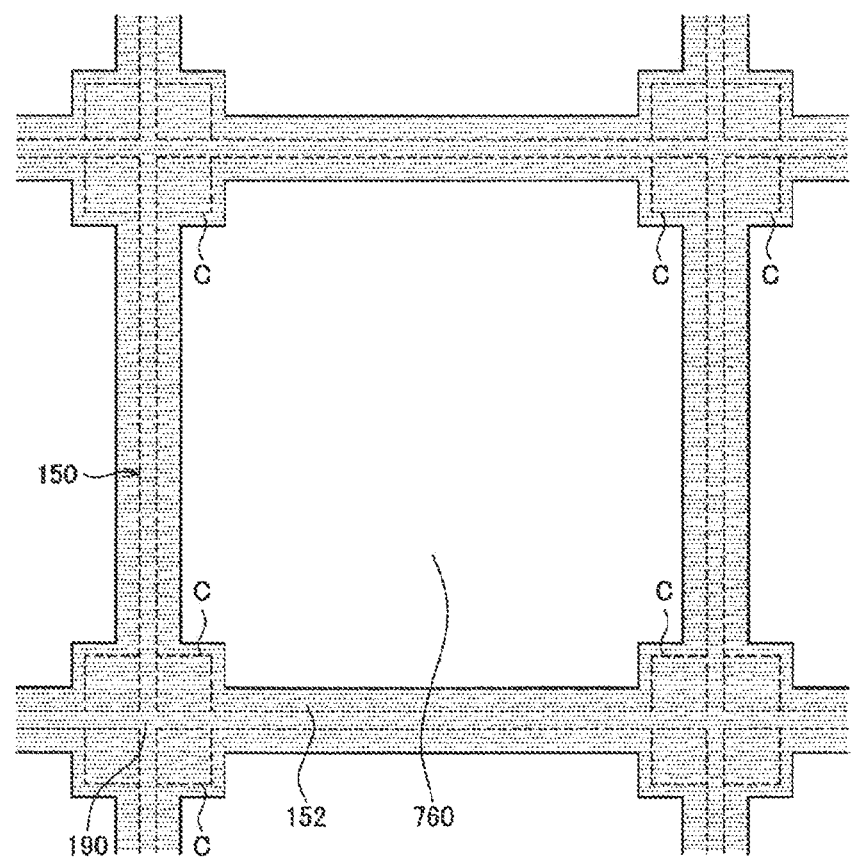
FIG. 23D is a plan view illustrating the imaging device according to the first variation.
Figure 23E:
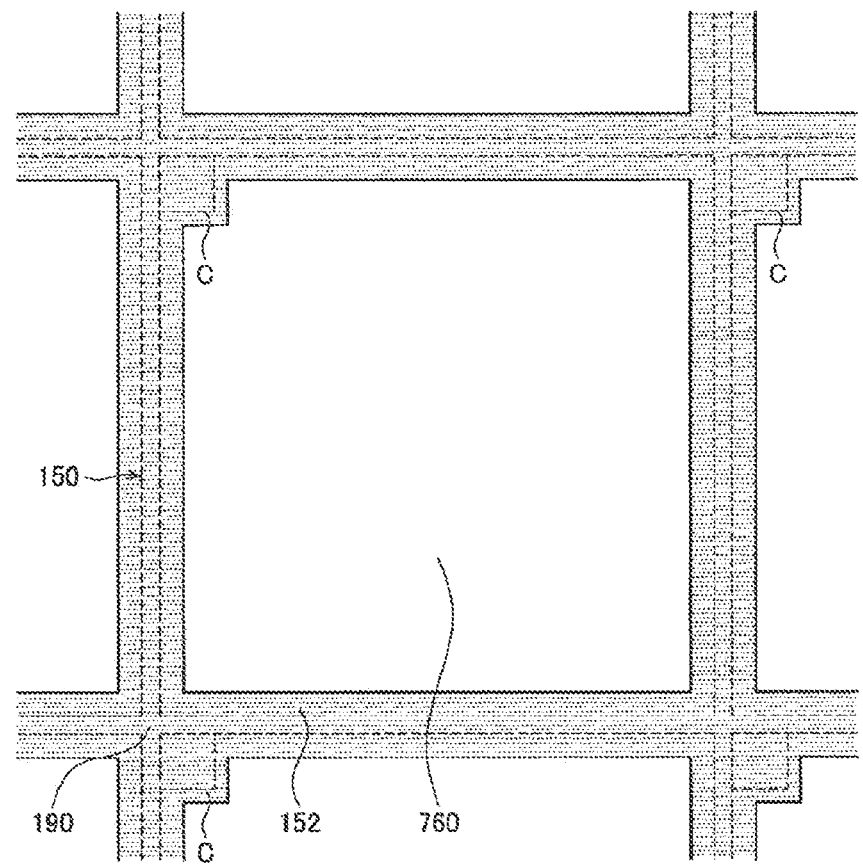
FIG. 23E is a plan view illustrating the imaging device according to the first variation.
Figure 23F:
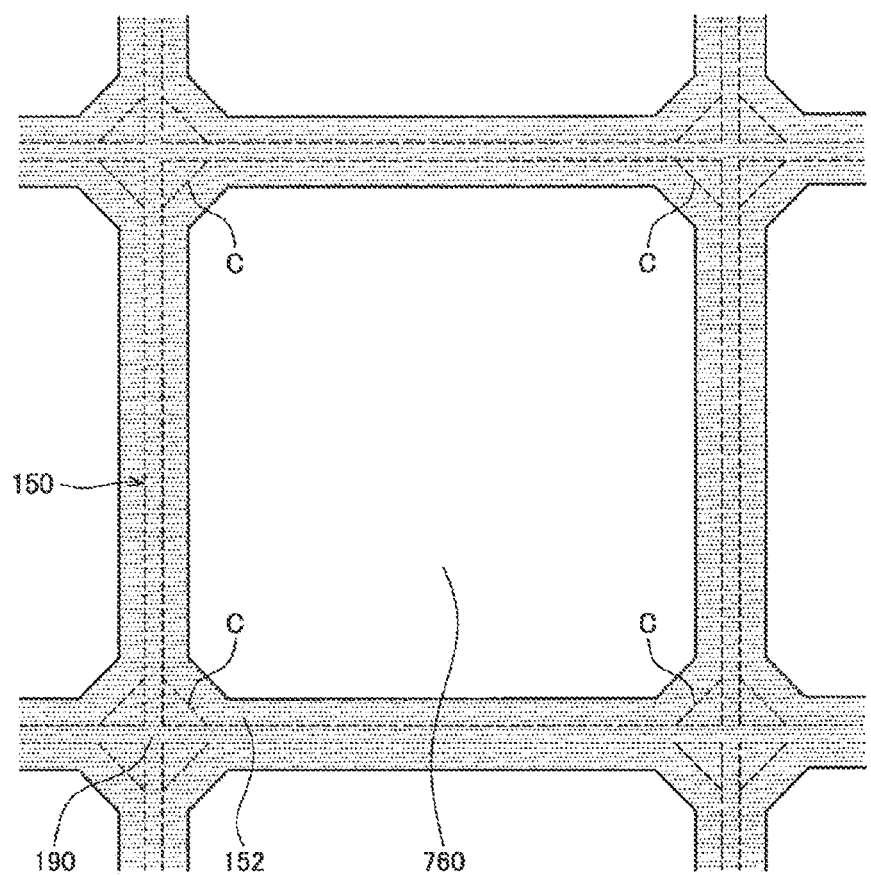
FIG. 23F is a plan view illustrating the imaging device according to the first variation.
Figure 23G:
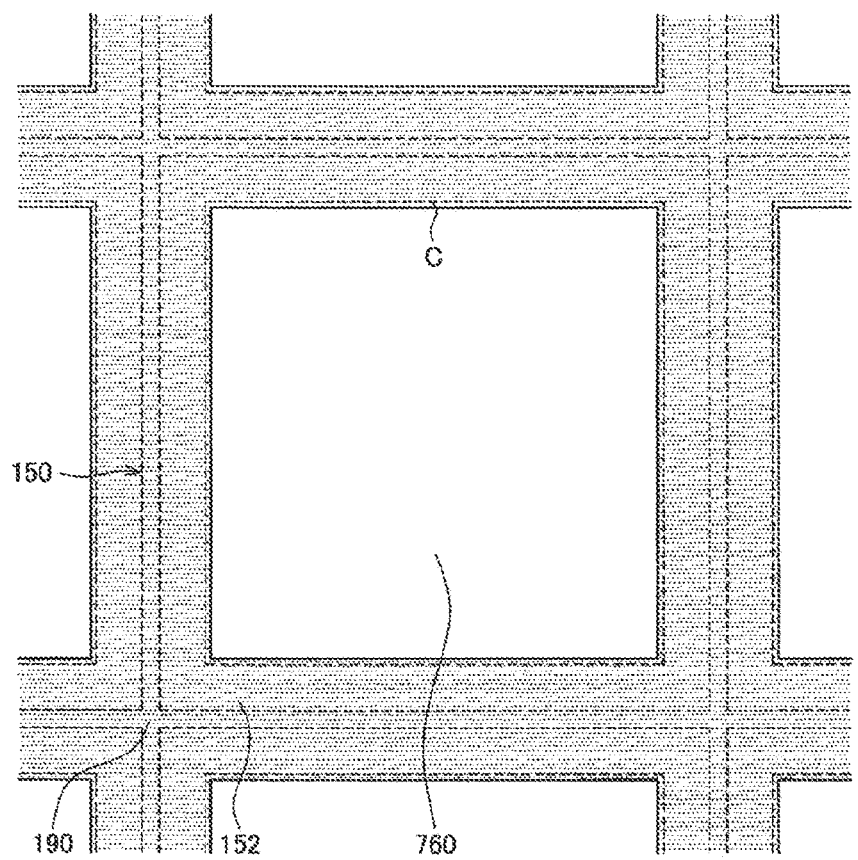
FIG. 23G is a plan view illustrating the imaging device according to the first variation.

FIGS. 23A to 23G are plan views illustrating the imaging device 1000 according to the first variation. In the example illustrated in FIG. 23A, the metal layer 152 is formed with a width larger than the buried metal layer 190 along the pixel separation portion 150 to correspond to the configuration of FIG. 22A. In FIGS. 23A to 23G, dots are given to the region of the metal layer 152 to indicate a portion C in which the metal layer 152 is electrically connected to the P region 760. The example illustrated in FIG. 23A shows a configuration in which the portion C in which the metal layer 152 is electrically connected to the P region 760 is formed at each of four locations for one pixel. The example illustrated in FIG. 23B shows a configuration in which the portion C in which the metal layer 152 is electrically connected to the P region 760 in the configuration of FIG. 22A is formed at one location for one pixel. The example illustrated in FIG. 23C shows a configuration in which the portion C in which the metal layer 152 is electrically connected to the P region 760 in the configuration of FIG. 22A is provided on four sides along the buried metal layer 190 and the portion C in which the metal layer 152 is electrically connected to the P region 760 is formed in a ring shape. In FIG. 23C, the portion C in which the metal layer 152 is electrically connected to the P region 760 may be formed on only one side along the buried metal layer 190. The example illustrated in FIG. 23D corresponds to the configuration of FIG. 22B. In the example illustrated in FIG. 23D, the metal layer 152 is formed with a width larger than the buried metal layer 190 along the pixel separation portion 150 as in FIG. 23A, the portion C electrically connected to the P region 760 is formed in each of four corners of the pixel to be adjacent to the buried metal layer 190. The example illustrated in FIG. 23E shows a configuration in which the portion C electrically connected to the P region 760 in FIG. 23D is provided at one location for one pixel. The example illustrated in FIG. 23F shows a configuration in which a planar shape of the portion C electrically connected to the P region 760 in FIG. 23D is triangular. According to the configuration of FIG. 23F, an opening of the metal layer 152 on which light is incident can be further widened. The planar shape of the portion C electrically connected to the P region 760 may be a shape other than a triangle and may be circular, for example. The example illustrated in FIG. 23G is a schematic view of an example in which the portion C electrically connected to the P region 760 in FIG. 23D is provided along the buried metal layer 190. In FIG. 23G, the portion C in which the metal layer 152 is electrically connected to the P region 760 may be formed on only one side along the buried metal layer 190. In FIGS. 23A to 23G, in the planar configuration, the metal layer 152 does not protrude to the side of the photoelectric conversion portion than the pixel separation portion 150 other than the portion C electrically connected to the P region 760.

Figure 24:
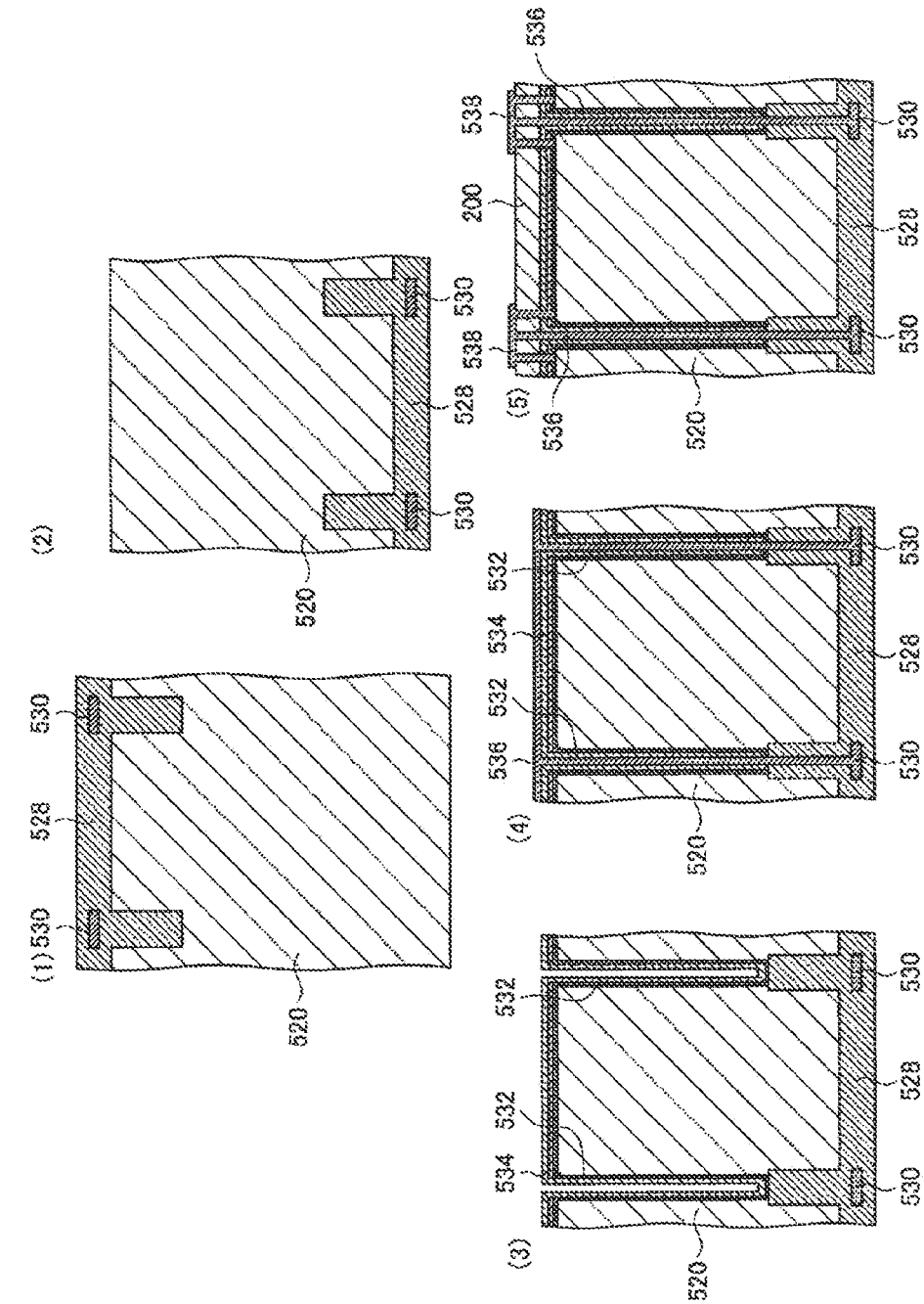
FIG. 24 is a schematic sectional view illustrating a method of manufacturing a semiconductor device according to the first variation in a process order.

Hereinafter, a method of manufacturing the semiconductor device according to the first variation will be described in a process order with reference to FIG. 24. FIG. 24 is a schematic sectional view illustrating the method of manufacturing the semiconductor device according to the first variation in the process order.

First, in a process (1), necessary N and P layers are formed on a Si substrate 520 by ion injection, heat treatment, or the like, a desired structure is formed by deposition, a first layer 528 in which an insulation film of a buried insulation film is buried to surround a pixel is formed. Thus, each N region and each P region illustrated in FIG. 21A are formed. In FIG. 24, each N region and each P region are not illustrated. Then, a structure in which a metal layer 530 is buried in the first layer 528 by forming the metal layer 530 on the first layer 528 in which the insulation film is buried and further forming an insulation film. Various variations of the burying of the first layer 528, such as an oxide film, a nitride film, or a stacked structure of an oxide film and a nitride film, can be considered. The metal layer 530 is preferably formed of tungsten (W). The metal layer 530 may not be formed.

Subsequently, in a process (2), necessary wiring layers are formed, the front and surface surfaces are then reversed by a scheme such as laminating, and unnecessary layers are removed. Subsequently, in a process (3), the Si substrate 520 is etched to reach the buried insulation film, and then an insulation film 532 formed of aluminum oxide ($Al_2O_3$), hafnium oxide ($HfO_2$), or the like and an insulation film 534 formed of an oxide film or the like are formed. In the forming of the films, types of films with good coverage are preferably used. Then, in a process (4), a groove (a trench) penetrating through the first buried layer 528 and reaching the metal layer 530 is formed and the metal film 536 is buried. The metal film 536 is preferably formed of tungsten (W) or the like. After the Si layer 526 and the first buried layer 528 are penetrated, the insulation films 532 and 534 may be formed and the metal layer 536 may be buried. Finally, in a process (5), after the insulation film 200 is formed, the electrode 538 with a backside contact is formed.

Through the processes, an element that includes the backside electrodes is manufactured. The N layer and the P layer may be reversed. In this case, the type of insulation film 532 is changed. Then, the color filters 300a, 300b, and 300c and the on-chip lenses 400 (not illustrated in FIG. 24) illustrated in FIG. 21A are formed on the insulation film 200 and the electrode 538.

Figure 25:
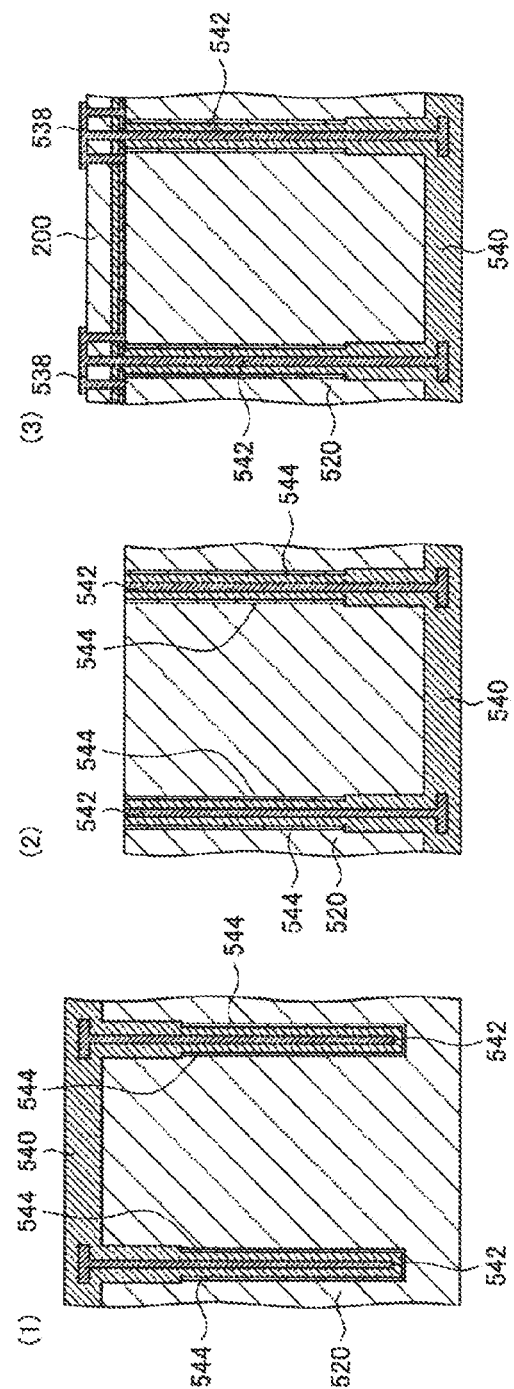
FIG. 25 is a schematic view illustrating a manufacturing process when a second buried layer formed from the front surface side to the rear surface side is surrounded by a high-concentration P layer using solid state diffusion or the like in the manufacturing method illustrated in FIG. 24.

In the manufacturing method illustrated in FIG. 24, without forming the insulation film 532, a second buried layer formed from the front side to the rear surface side may be surrounded by a high-concentration P layer using solid phase diffusion or the like at the time of forming of the front surface side. FIG. 25 is a schematic view illustrating a manufacturing process in this case. In a process (1), necessary N and P layers are formed on the Si substrate 520 by ion injection, heat treatment, or the like, a desired structure is formed by deposition. In this way, each N region and each P region illustrated in FIG. 21A are formed. Then, the second layer 540 is buried in the Si substrate 520 and the metal layer 542 is buried in the second layer 540. When the second layer 540 is buried, a high-concentration P layer 544 is formed on the Si substrate 520 adjacent to the second layer 540 using solid phase diffusion or the like.

Subsequently, in a process (2), the front and rear surfaces are reversed and unnecessary layers are removed. Thereafter, after a predetermined insulation film is formed on the Si substrate 520, the electrode 538 with the backside contact is formed as in the process (5) of FIG. 24. Then, the color filters 300a, 300b, and 300c and the on-chip lenses 400 (not illustrated in FIG. 24) illustrated in FIG. 21A are formed on the insulation film 200 and the electrode 538.

In the process figures illustrated in FIGS. 24 and 25, the insulation film 532 corresponds to the insulation film 810 in FIGS. 22A to 22F, the metal layer 536 corresponds to the buried metal layer 190 in FIGS. 22A to 22F, and the electrode 538 corresponds to the metal layer 152 (the anode electrode). The buried metal layer 190 and the metal layer 152 may be formed of the same material and can be formed of, for example, a metal such as tungsten (W).

According to the first variation, the metal layer 152 functioning as the anode electrode 130 is electrically connected to the P region 760 of the photoelectric conversion portion 160, and thus it is possible to reduce parasitic resistance of the anode wiring. The metal layer 152 functioning as the anode electrode 130 is electrically connected to the P region 760 of the photoelectric conversion portion 160, and thus it is possible to reduce a voltage drop in a pixel area middle portion.

8.3. Second Variation

In the first variation, the metal layer 152 (the anode electrode) connected to the P region 760 is formed along the pixel separation portion 150, as illustrated in FIGS. 23A, 23B, 23C, 23D, 23E, 23F, and 23G. Therefore, it is possible to sufficiently guarantee a contact area between the P region 760 and the metal layer 152, and thus it is possible to reduce contact resistance between the P region 760 and the metal layer 152. On the other hand, in the case of this configuration, the photoelectric conversion portion of each pixel is contracted due to the wiring layer 500 formed inside the pixel separation portion 150.

In a second variation, as in the first variation, the buried metal layer 190 is electrically connected to the metal layer 152. By digging the P region 760 in the connection portion of the metal layer 152 and the P region 760, the contact area is increased, and thus it is possible to reduce the contact resistance. When an occupation area of the wiring layer 500 inside the pixel separation portion 150 is suppressed to the degree of increasing the contact area by digging the P region 760 and the maximum region of the photoelectric conversion portion of each pixel is guaranteed, it is possible to further improve sensitivity of the imaging device 1000 without increasing the contact resistance.

Figure 26:
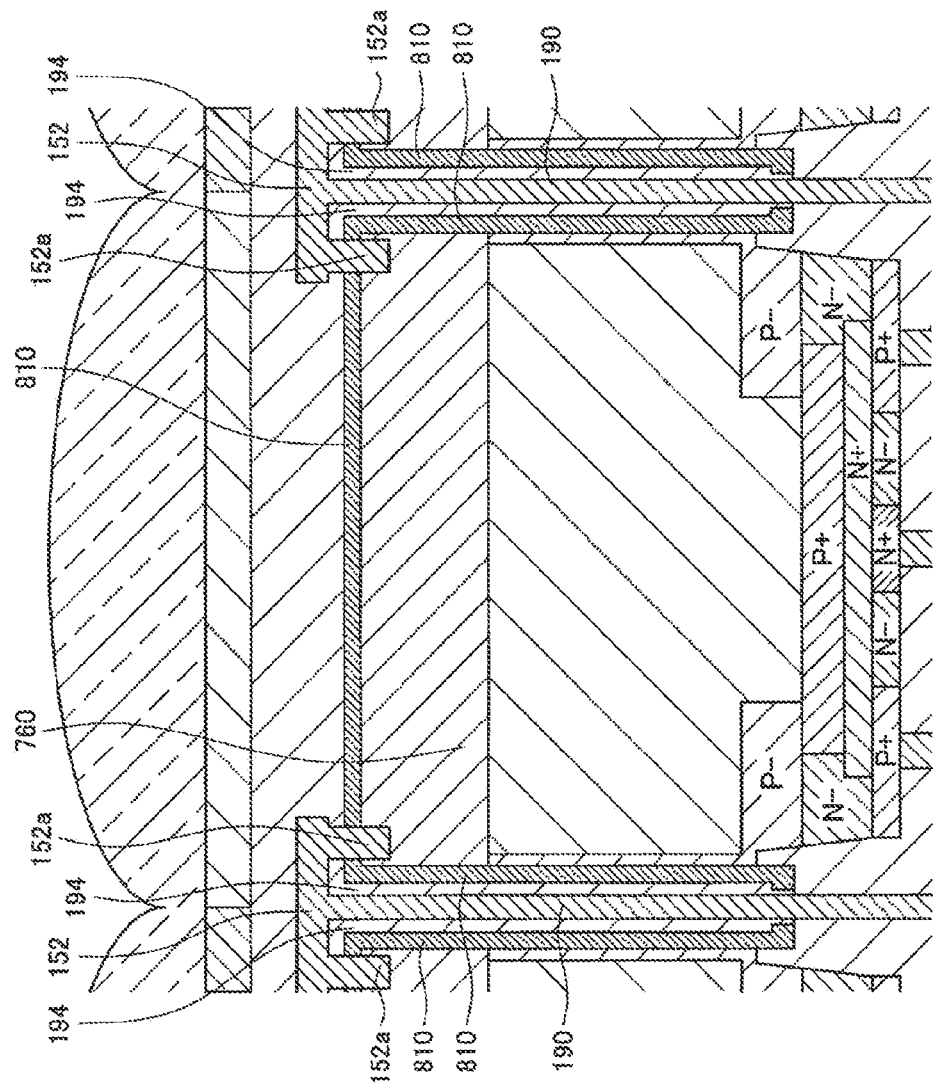
FIG. 26 is a schematic sectional view illustrating the imaging device according to a second variation.

FIG. 26 is a schematic sectional view illustrating the imaging device 1000 in the second variation. In FIG. 26, a dug region of the P region 760 is filled with a contact portion 152*a* of the metal layer 152 connected to the P region 760. Thus, since the contact region is also formed on the lateral wall of the contact portion 152*a*, the contact area increases, and thus it is possible to reduce the contact resistance. The dug region of the P region 760 is considered to be in any of a plurality of shapes such as a groove shape, a hole shape, or a shape connected to a groove engraved between pixels. In the planar configuration, the metal layer 152 does not protrude to the photoelectric conversion portion than the pixel separation portion 150 except for the region in which the contact portion 152*a* is formed. By further increasing the length of the contact portion 152*a*, the contact area between the contact portion 152*a* and the P region 760 increases, and thus it is possible to reduce the contact resistance.

According to the second variation, by connecting the metal layer 152 to the P region 760 using the contact portion 152*a*, it is possible to guarantee a larger region of the photoelectric conversion portion.

8.4. Third Variation

In a third variation, when the metal layer 152 connected to the buried metal layer 190 is connected to the P region 760, the contact resistance of the metal layer 152 and the P region 760 is reduced by retreating the insulation film 810 of the pixel separation portion 150.

Figure 27:
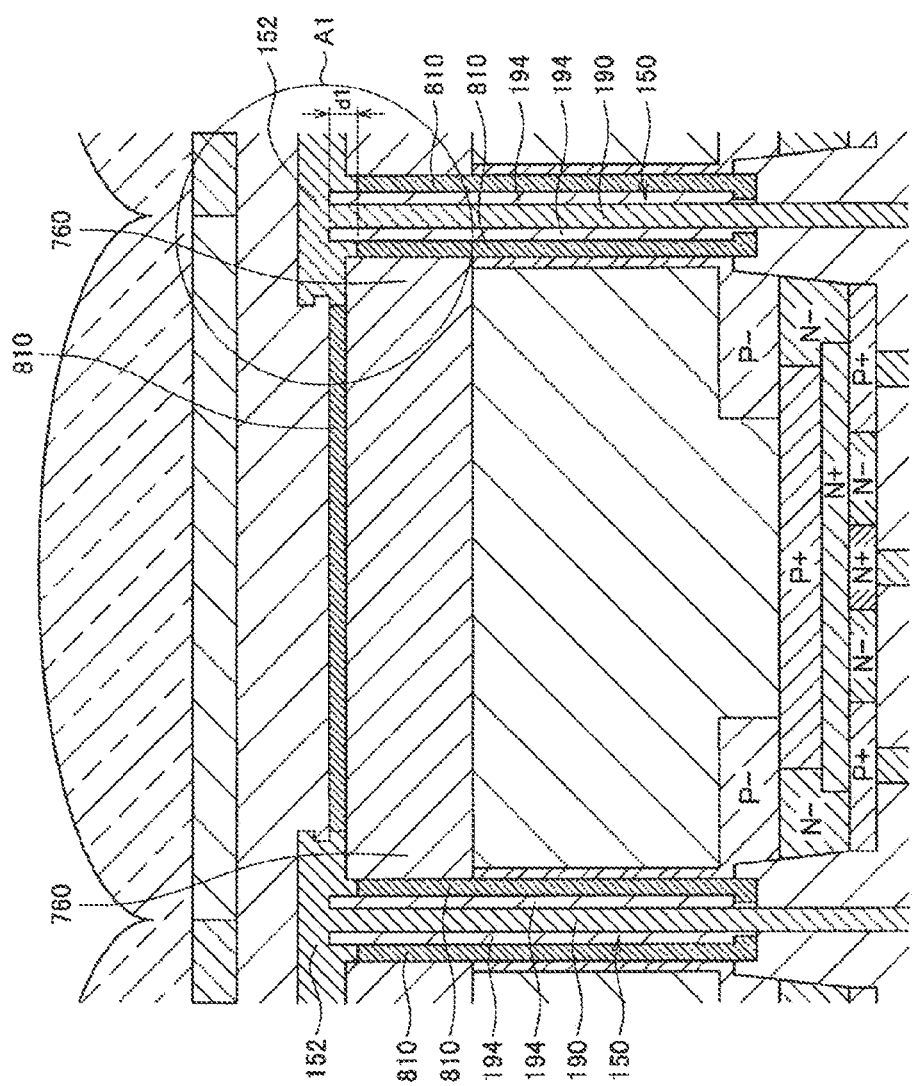
FIG. 27 is a schematic sectional view illustrating the imaging device according to a third variation.

FIG. 27 is a schematic sectional view illustrating the imaging device 1000 according to the third variation. In a configuration illustrated in FIG. 27, the insulation film 810 is formed along the insulation film 194 of the pixel separation portion 150. The position of an upper end of the insulation film 810 along the pixel separation portion 150 retreats to a position lower than the upper end of the insulation film 194 of the pixel separation portion 150. A distance d1 illustrated in FIG. 27 indicates a retreat amount in a downward direction of the insulation film 700.

Figure 28:
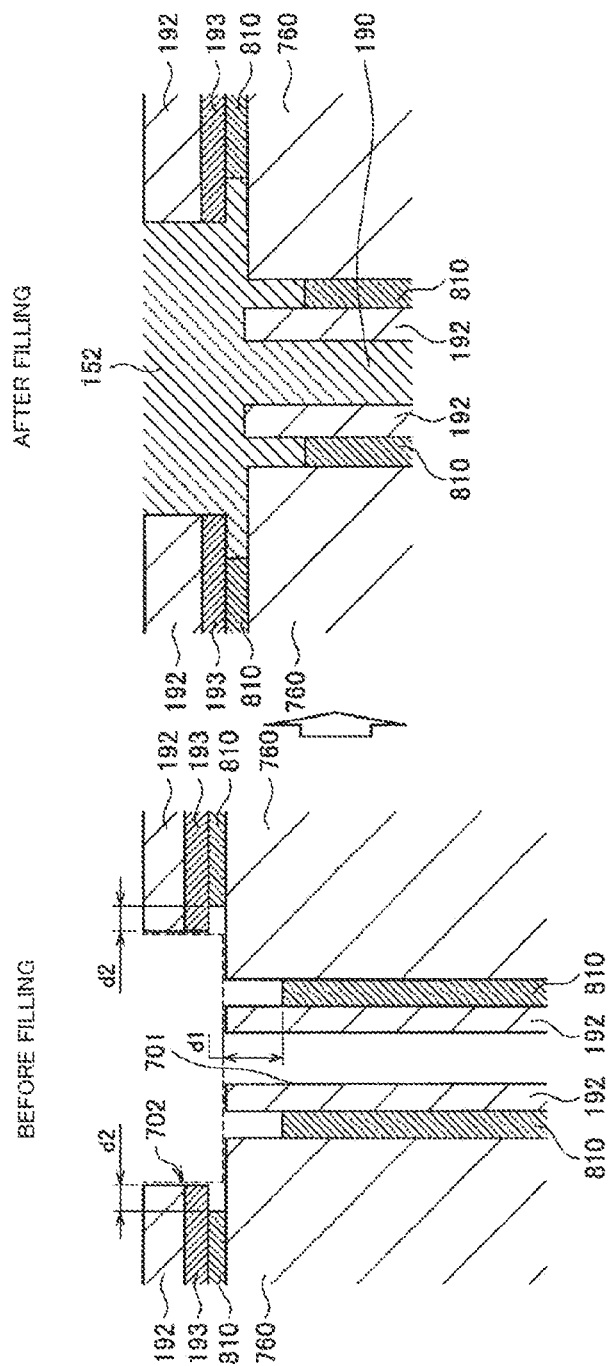
FIG. 28 is a schematic view illustrating an enlarged range of a region A1 illustrated in FIG. 31.

FIG. 28 is a schematic view illustrating an enlarged range of a region A1 illustrated in FIG. 27 and illustrates states before and after filling of the metal layer 152. In FIG. 28, the vicinity of the insulation film 810 is illustrated in more detail. The insulation film 192 and a film 193 formed of a tantalum oxide ($Ta_2O_5$) or the like are formed to be adjacent to the insulation film 810. Since the film 193 is formed by a sputtering method, a coverage is relatively low and the film 193 is not formed on the lateral wall of a groove 701. On the other hand, since the insulation film 192 is formed by CVD or the like, a coverage is good, the insulation film 192 is also formed on the lateral wall of the groove 701. The state before the filling of the metal layer 152 illustrated on the left side of FIG. 28 is a state in which the groove 701 filled with the buried metal layer 190 is formed in the pixel separation portion 150 and an opening 702 is formed in the upper portion of the pixel separation portion 150. In this state, the groove 701 is not filled with the buried metal layer 190 and the opening 702 is not filled with the metal layer 152. A dotted line illustrated in FIG. 28 indicates a range of the opening 702 before the insulation film 810 is retreated. After the opening 702 is formed in the range indicated by the dotted line, the insulation film 810 is retreated by a cleaning process. The insulation film 700 is retreated by a distance d1 in the vertical direction and is retreated by a distance d2 in the horizontal direction. For example, a retreat amount is about a few of nm to tens of nm.

Thereafter, as illustrated in the state after the filling, as illustrated on the right side of FIG. 28, the buried metal layer 190 is formed so that the groove 701 is filled and the metal layer 152 is formed so that the opening 702 is filled. Thus, a region of the metal layer 152 connected to the P region 760 expands to the degree that the insulation film 810 is retreated, and thus it is possible to reduce the contact resistance between the P region 760 and the metal layer 152. In the examples illustrated in FIGS. 27 and 28, the metal layer 152 and the buried metal film 190 may be integrated.

As described above, by retreating the insulation film 810, it is possible to expand a contact region of the P region 760 and the metal layer 152. Accordingly, according to the configuration of the third variation illustrated in FIG. 27, it is possible to further reduce the contact resistance between the P region 760 and the metal layer 152.

Figure 29:
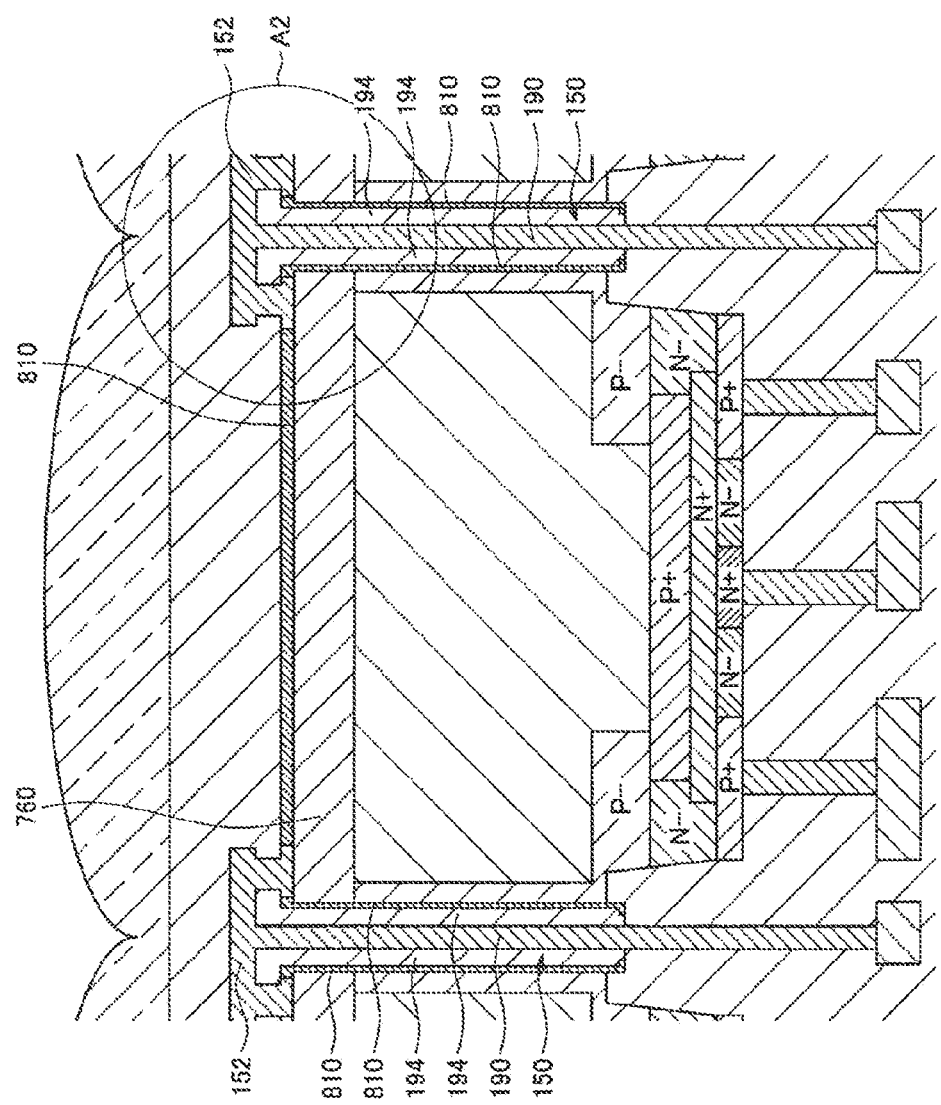
FIG. 29 is a schematic sectional view illustrating another example of the third variation.

FIG. 29 is a schematic sectional view illustrating another example of the third variation. In a configuration illustrated in FIG. 29, a contact with the P region 760 of the metal layer 152 is brought at a position separated from the pixel separation portion 150.

Figure 30:
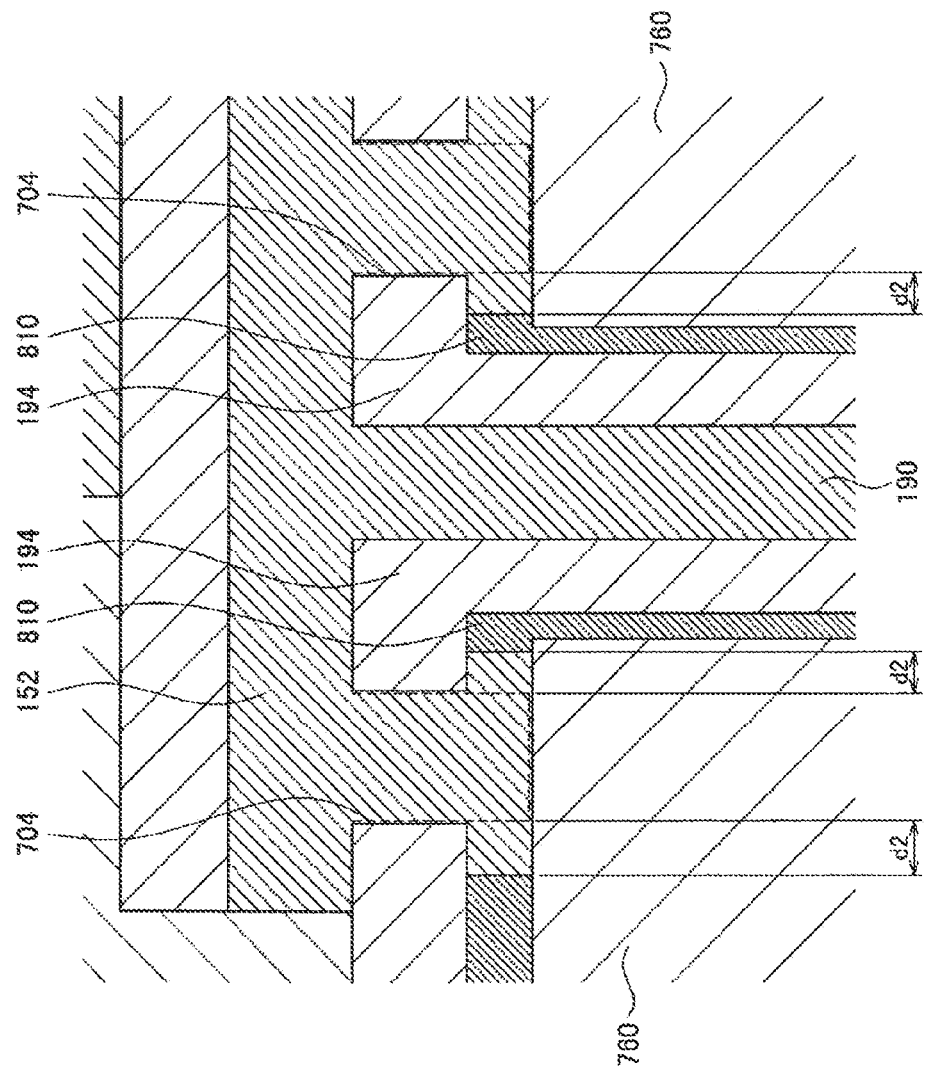
FIG. 30 is a schematic view illustrating an enlarged range of a region A2 illustrated in FIG. 29.

FIG. 30 is a schematic view illustrating an enlarged range of a region A2 illustrated in FIG. 29. A dotted line illustrated in FIG. 30 indicates a range of the opening 704 before the insulation film 810 is retreated. After the opening 704 is formed within the range indicated by the dotted line, the insulation film 810 is retreated by the distance d2 in the horizontal direction by a cleaning process.

Thereafter, the metal layer 152 is formed so that the opening 704 is filled. Thus, a region in which the metal layer 152 comes into contact with the P region 760 expands to the degree that the insulation film 810 is retreated in the horizontal direction, and thus it is possible to reduce the contact resistance between the metal layer 152 and the P region 760.

Figure 31:
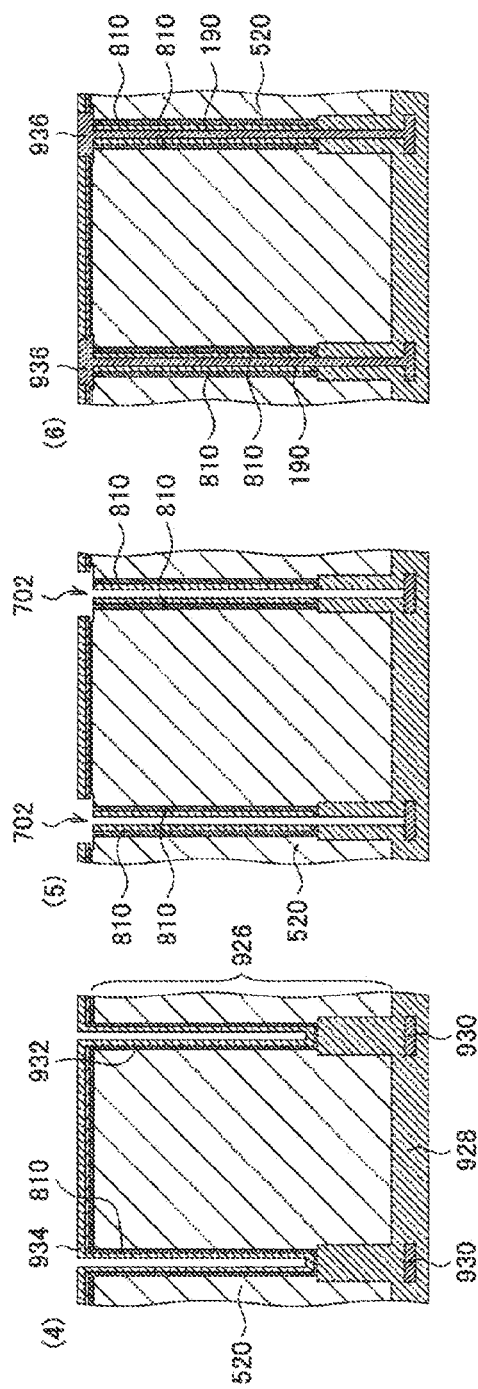
FIG. 31 is a schematic sectional view illustrating a method of manufacturing a semiconductor device according to the third variation in a process order.

Hereinafter, a method of manufacturing the semiconductor device according to the third variation in a process order will be described with reference to FIG. 31. FIG. 31 is a schematic sectional view illustrating the method of manufacturing the semiconductor device according to the third variation in the process order.

After similar processes to the processes (1) and (2) of FIG. 24 are performed, in a process (4) of FIG. 31, a Si layer 926 is etched to reach the buried insulation film, and then an insulation film 810 formed of aluminum oxide ($Al_2O_3$), hafnium oxide ($HfO_2$), or the like and an insulation film 934 formed of an oxide film or the like are formed. In the forming of the films, types of films with good coverage are preferably used.

Subsequently, in a process (5), a first buried layer 928 is penetrated and a groove reaching the metal layer 930 is formed. Further, in the process (5), after the opening 702 is formed, cleaning is performed. Thus, as described in FIG. 28, the insulation film 810 is retreated in the downward direction and the horizontal direction. For example, when the insulation film 810 is formed of aluminum oxide ($Al_2O_3$), hafnium oxide ($HfO_2$), or the like, the insulation film 810 is retreated by about a few of nm to tens of nm using an inorganic chemical of DHF or a general organic chemical used in post-process cleaning.

Subsequently, in a process (6), a metal film 936 is buried. The metal film 936 is preferably formed of tungsten (W) or the like. Sputtering, chemical vapor deposition (CVD), or the like can be used as a method of forming the metal film, but the CVD is advantageous to the coverage. Thus, a region including the inside of the groove and the inside of the opening 702 formed in the process (5) is filled with the metal layer 936. A portion in which the insulation film 810 is retreated is also filled with the metal layer 936. The filled metal layer 936 corresponds to the buried metal layer 190 and the metal layer 152. A P layer 924 corresponds to the P region 760 in FIG. 27. Thereafter, the color filters 300*a*, 300*b*, and 300*c* and the on-chip lenses 400 (not illustrated in FIG. 31) illustrated in FIG. 21A are formed.

As described above, the insulation film 810 is retreated in the downward direction and the horizontal direction in the cleaning process of the process (5). Then, since the portion in which the insulation film 810 is retreated is filled with the metal layer 936 by filling the metal layer 936 in the process (6), the contact area between the metal layer 936 and the P region 760 increases, and thus it is possible to reduce the contact resistance. In the case of the configuration illustrated in FIG. 29, the opening 704 may be formed at a position separated from the pixel separation portion 150 in the process (5).

Figure 32:
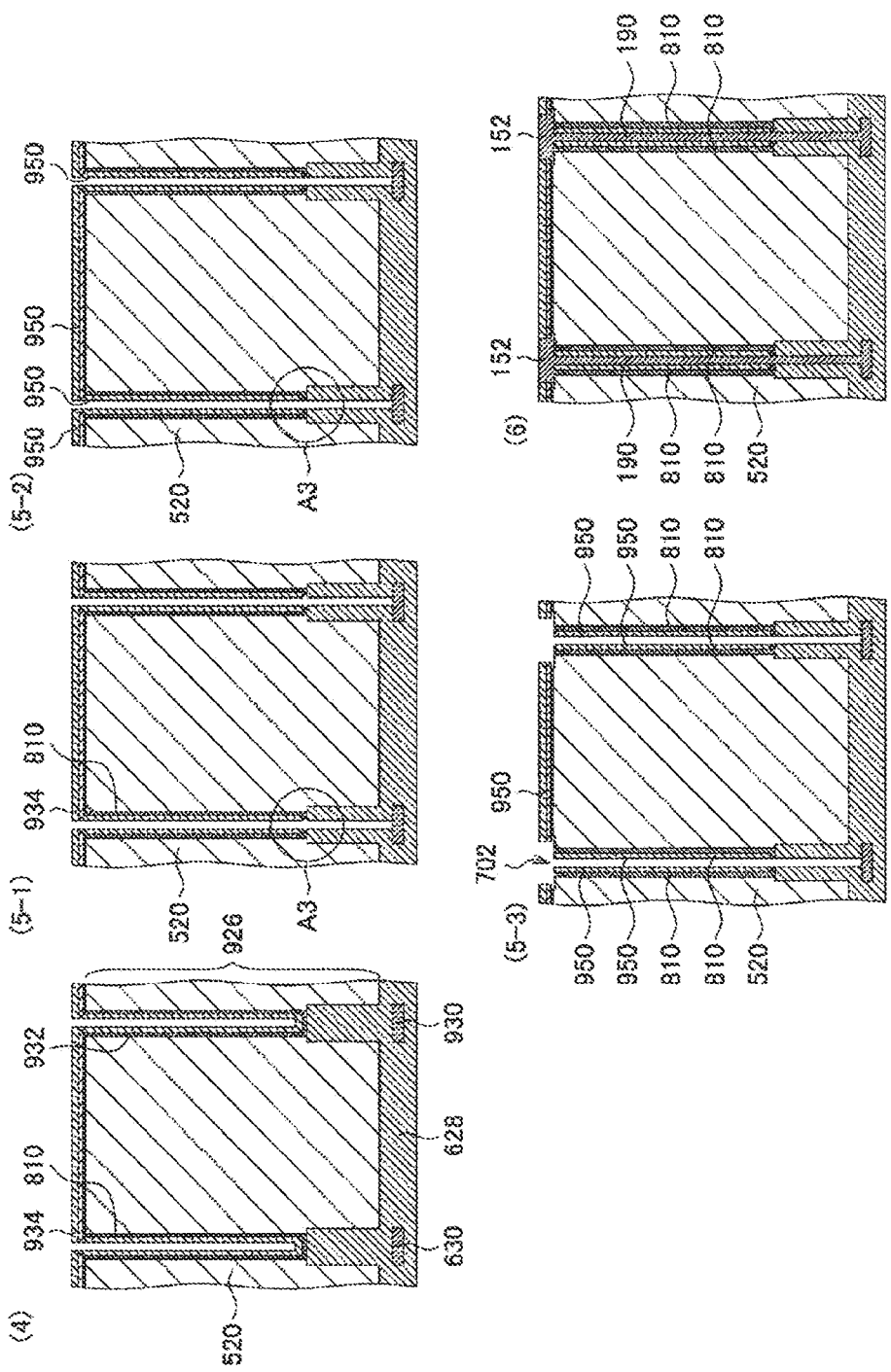
FIG. 32 is a schematic sectional view illustrating an example in which an insulation film is further formed in a groove as the insulation film formed in the first buried layer in the groove retreats in a process (5) of FIG. 31.

FIG. 32 is a schematic sectional view illustrating an example in which an insulation film is further formed in a groove as the insulation film 810 formed in the first buried layer 928 in the groove retreats in a process (5) of FIG. 31.

Figure 33:
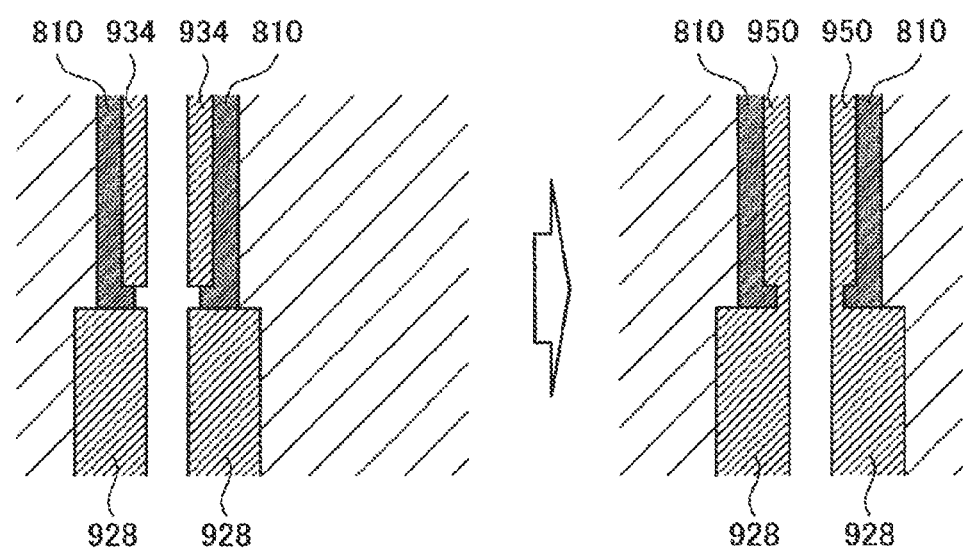
FIG. 33 is a sectional view illustrating an enlarged region A3 in a process (5-1) and a process (5-2) illustrated in FIG. 32.

FIG. 33 is a sectional view illustrating an enlarged region A3 in a process (5-1) and a process (5-2) illustrated in FIG. 32. By forming a groove penetrating through the first buried layer 928 and reaching the metal layer 930 and then performing a cleaning process, the insulation film 810 is exposed to the first buried layer 928. Therefore, as illustrated in the left figure of FIG. 33, the insulation film 810 is retreated on the first buried layer 928. Since there is a possibility of a proof pressure of the pixel separation portion 150 decreasing due to the retreat, an insulation film 950 is formed in a contact hole and the insulation film 810 exposed in the contact hole on the first buried layer 928 is covered with the insulation film 950 in the process (5-2) in FIG. 32. At this time, it is appropriate to form the insulation film 950 with the high proof pressure by a scheme of atomic layer deposition (ALD) or the like. Thus, as illustrated in the right figure of FIG. 33, the insulation film 810 is covered with the insulation film 950 on the first buried layer 928. By performing etchback by dry etching or the like, the insulation film 950 of a portion in which the insulation film 810 is retreated remains and the insulation film of an unnecessary portion can be removed.

Thereafter, in a process (5-3), the insulation film 810 is retreated in the downward direction and the horizontal direction as in the process (5) illustrated in FIG. 31 by forming the opening 702 and performing a cleaning process. The subsequent processes are similar to those of FIG. 31.

As described above, according to the third variation, by retreating the insulation film 810, it is possible to increase the contact area between the metal layer 152 and the P region 760 and reduce the contact resistance. As illustrated in FIGS. 32 and 33, by retreating the insulation film 810 on the lateral wall of the pixel separation portion 150 other than the contact portion and burying the insulation film, it is possible to improve a proof pressure.

9. Application Example Other than Imaging Device

For example, the present disclosure can also be applied to other devices that detect light, such as a time-of-flight (TOF) sensor. In the case of application to a TOF sensor, for example, application can be made to a distance image sensor according to a direct TOF measurement method or a distance image sensor according to an indirect TOF measurement method. In a distance image sensor according to the direct TOF measurement method, a light pulse with a short pulse width is transmitted and an electric pulse is generated by a receiver responding at a high speed to obtain a photon arrival timing in a direct time region in each pixel. At this time, the present disclosure can be applied to the receiver. In the indirect TOF method, a light flight time is measured using a semiconductor element structure in which an amount of detected and accumulated carriers generated by light is changed depending on a light arrival timing. The present disclosure can also be applied as the semiconductor structure. In the case of application to a TOF sensor, the color filters 300*a*, 300*b*, and 300*c* and the on-chip lenses 400 illustrated in FIG. 18 are provided voluntarily and these may not be provided.

10. Configuration Example of Electronic Device

Figure 34:
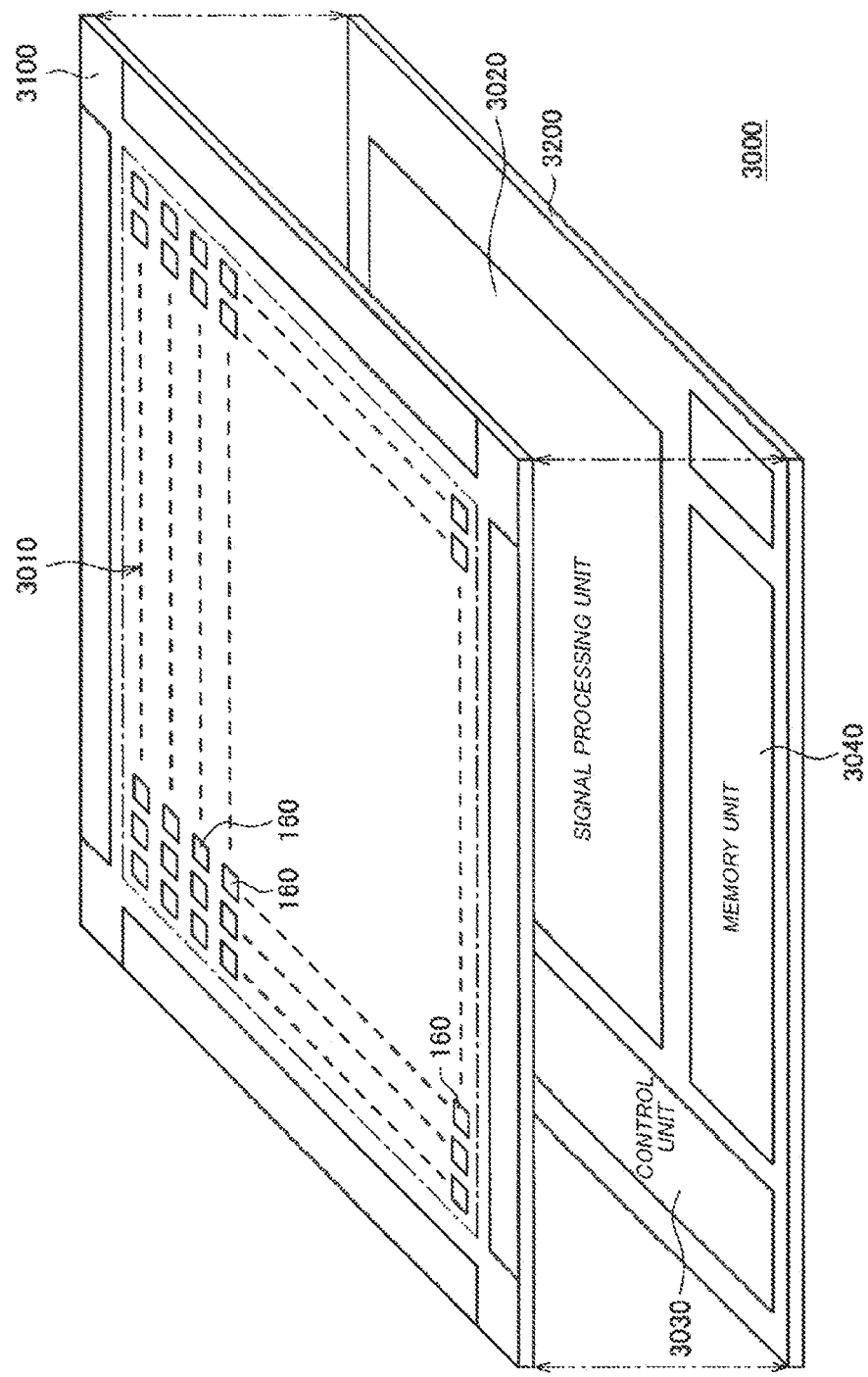
FIG. 34 is a schematic view illustrating a configuration of an electronic device including the imaging device.

FIG. 34 is a schematic view illustrating a configuration of an electronic device 3000 including the above-described imaging device 1000. The electronic device 3000 illustrated in FIG. 34 includes a first semiconductor chip 3100 that includes a sensor unit 3010 in which a plurality of photoelectric conversion portions 160 are disposed and a second semiconductor chip 3200 that includes a signal processing unit 3020 processing signals acquired by the photoelectric conversion portions 160. The first semiconductor chip 3100 and the second semiconductor chip 3200 are stacked. A control unit 3030 that is near the signal processing unit 3020 and controls the electronic device 3000 and a memory unit 3040 that stores signals acquired by the photoelectric conversion portions 160 are provided. The control unit 3030 can be disposed for other driving or control near the photoelectric conversion portions 160, for example, other than the control of the signal processing unit 3020. The control unit 3030 can be provided with any function in any region of the first semiconductor chip 3100 and the second semiconductor chip 3200 in addition to the illustrated disposition. The plurality of photoelectric conversion portions 160 are disposed in a 2-dimensional matrix state (a matrix form). In FIG. 34, to facilitate description, the first semiconductor chip 3100 and the second semiconductor chip 3200 are illustrated in a separate state.

11. Application Example to Moving Body

The technology of the present disclosure (the present technology) can be applied in various products. For example, the technology of the present disclosure may be realized a device mounted on any type of moving body such as an automobile, an electric automobile, a hybrid electric automobile, a motorcycle, a bicycle, a personal mobility, an airplane, a drone, a ship, and a robot.

Figure 35:
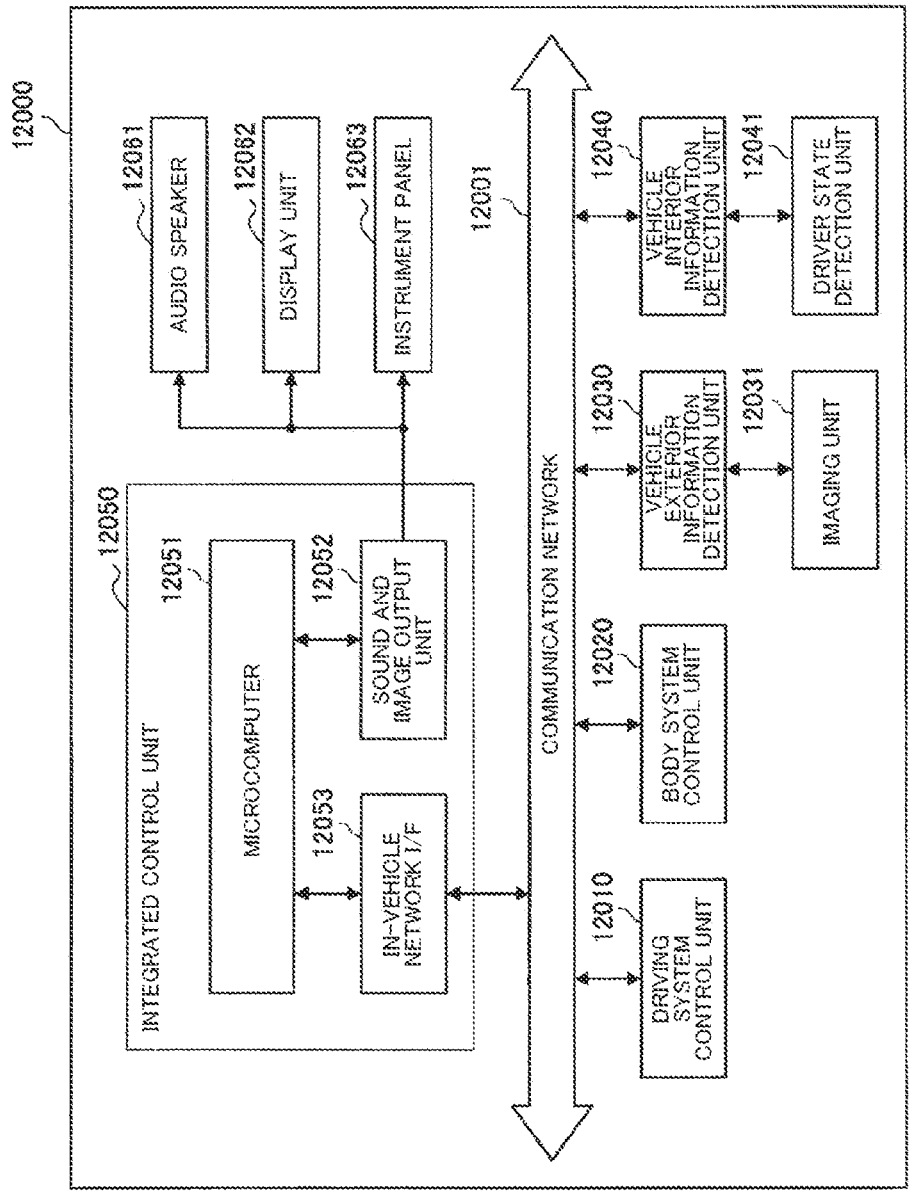
FIG. 35 is a block diagram illustrating an example of a schematic configuration of a vehicle control system.

FIG. 35 is a block diagram illustrating an example of a schematic configuration of a vehicle control system which is an example of a moving body control system to which the technology of the present disclosure can be applied.

A vehicle control system 12000 includes a plurality of electronic control units connected via a communication network 12001. In the example illustrated in FIG. 35, the vehicle control system 12000 includes a driving system control unit 12010, a body system control unit 12020, a vehicle exterior information detection unit 12030, a vehicle interior information detection unit 12040, and an integrated control unit 12050. As a functional configuration of the integrated control unit 12050, a microcomputer 12051, a sound and image output unit 12052, and an in-vehicle network interface (I/F) 12053 are illustrated.

The driving system control unit 12010 controls an operation of a device related to a driving system of a vehicle in accordance with various programs. For example, the driving system control unit 12010 functions as a control device such as a driving force generation device that generates a driving force of a vehicle, such as an internal combustion engine or a driving motor, a driving force transmission mechanism that transmits a driving force to wheels, a steering mechanism that adjusts a rudder angle of the vehicle, and a braking device that generates a braking force of the vehicle.

The body system control unit 12020 controls operations of various devices equipped in a vehicle body in accordance with various programs. For example, the body system control unit 12020 functions as a keyless entry system, a smart key system, a power window device, or a control device of various lamps such as a head lamp, a back lamp, a brake lamp, a turn signal, and a fog lamp. In this case, radio waves transmitted from a portable device with which a key is substituted or signals of various switches are input to the body system control unit 12020. The body system control unit 12020 receives an input of the radio waves or the signals and controls a door locking device, a power window device, lamps, and the like of the vehicle.

The vehicle exterior information detection unit 12030 detects external information of the vehicle on which the vehicle control system 12000 is mounted. For example, the imaging unit 12031 is connected to the vehicle exterior information detection unit 12030. The vehicle exterior information detection unit 12030 causes the imaging unit 12031 to capture vehicle exterior images and receives the captured images. Based on the received images, the vehicle exterior information detection unit 12030 may perform an object detection process or a distance detection process for people, vehicles, obstacles, signs, letters on road surfaces, and the like.

The imaging unit 12031 is an optical sensor that receives light and outputs an electric signal in accordance with an amount of received light. The imaging unit 12031 can output the electric signal as an image or can also output the electric signal as distance measurement information. The light received by the imaging unit 12031 may be visible light or may be invisible light such as infrared light.

The vehicle interior information detection unit 12040 detects vehicle interior information. For example, a driver state detection unit 12041 that detects a driver state is connected to the vehicle interior information detection unit 12040. The driver state detection unit 12041 includes, for example, a camera that images a driver. Based on detection information input from the driver state detection unit 12041, the vehicle interior information detection unit 12040 may calculate a fatigue degree or a concentration degree of the driver or may determine whether the driver is dozing.

The microcomputer 12051 can calculate a control target value of the driving force generation device, the steering mechanism, or the braking device based on information regarding the vehicle exterior and interior acquired by the vehicle exterior information detection unit 12030 or the vehicle interior information detection unit 12040, and can output a control instruction to the driving system control unit 12010. For example, the microcomputer 12051 can perform coordinated control for realizing an advanced driver assistance system (ADAS) function including vehicle collision avoidance, shock alleviation, following travel based on an inter-vehicle distance, vehicle speed maintenance travel, a vehicle collision warning, or a vehicle lane deviation warning.

The microcomputer 12051 can perform coordinated control for automated driving or the like in which autonomous travel is performed without an operation of a driver by controlling the driving force generation device, the steering mechanism, the braking device, and the like based on information regarding the vicinity of the vehicle acquired by the vehicle exterior information detection unit 12030 or the vehicle interior information detection unit 12040.

The microcomputer 12051 can output a control instruction to the body system control unit 12030 based on information regarding the vehicle exterior acquired by the vehicle exterior information detection unit 12030. For example, the microcomputer 12051 can perform coordinated control for achieving antidazzle such as switching of a high beam to a low beam by controlling the head lamp in accordance with a position of a front vehicle or an oncoming vehicle detected by the vehicle exterior information detection unit 12030.

The sound and image output unit 12052 transmits an output signal of at least one of a sound and an image to an output device capable of notifying an occupant of the vehicle or the vehicle exterior of information visually or auditorily. In the example of FIG. 35, an audio speaker 12061, a display unit 12062, and an instrument panel 12063 are exemplified as the output device. The display unit 12062 may include for example, at least one of an onboard display and a head-up display.

Figure 36:
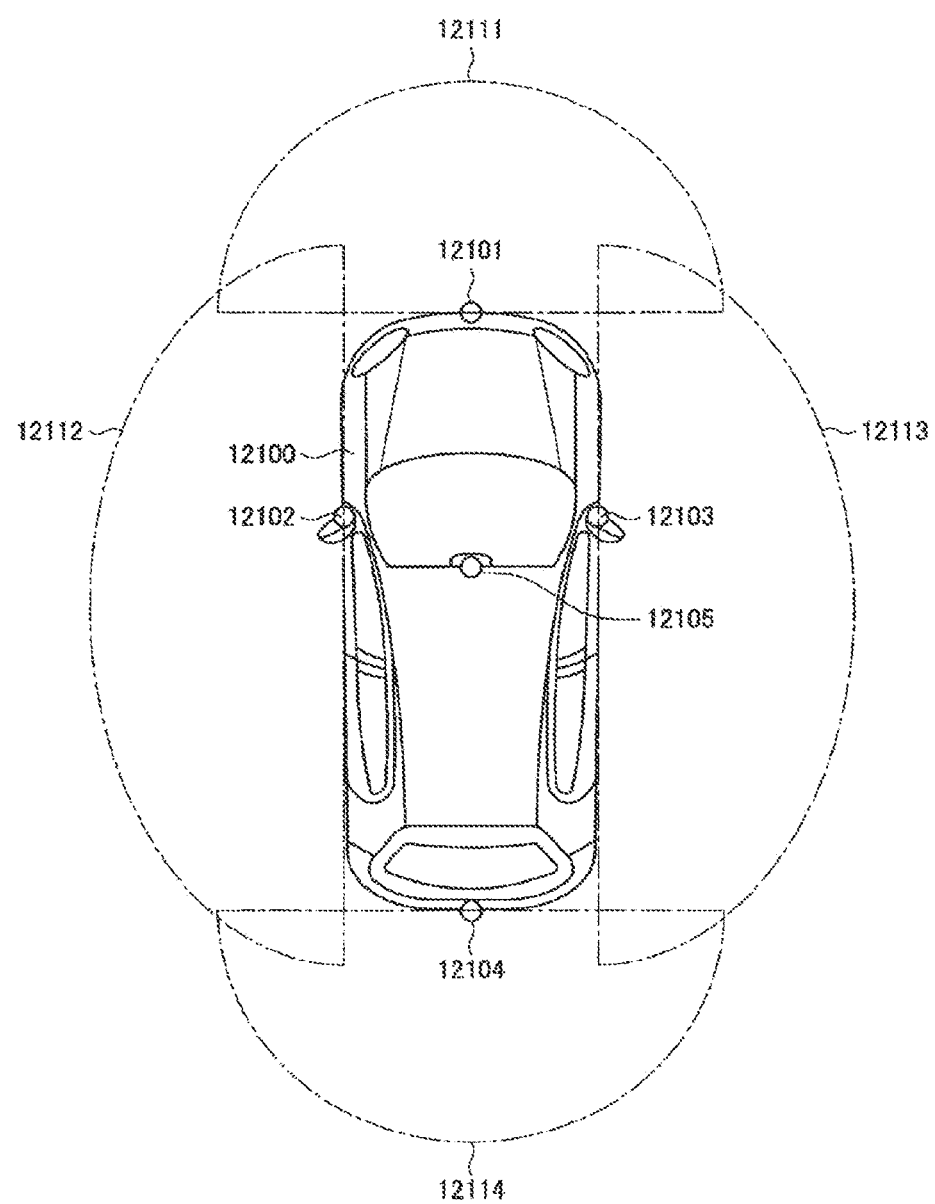
FIG. 36 is an explanatory diagram illustrating an example of a position at which a vehicle exterior information detection unit and an imaging unit are installed.

FIG. 36 is an explanatory diagram illustrating an example of a position at which an imaging unit 12031 is installed.

In FIG. 36, imaging units 12101, 12102, 12103, 12104, and 12105 are included as the imaging unit 12031.

The imaging units 12101, 12102, 12103, 12104, and 12105 are provided, for example, at positions such as a front nose, side mirrors, a rear bumper, a backdoor, and an upper portion of a front glass of the vehicle interior of the vehicle 12100. The imaging unit 12101 provided in the front nose and the imaging unit 12105 provided in the upper portion of the front glass inside the vehicle mainly acquire images on the front side of the vehicle 12100. The imaging units 12102 and 12103 provided in the side mirrors mainly acquire images on the lateral sides of the vehicle 12100. The imaging unit 12104 provided in the rear bumper or the backdoor mainly acquires images on the rear side of the vehicle 12100. The imaging unit 12105 included in the upper portion of the front glass inside the vehicle is mainly used to detect front vehicles or pedestrians, obstacles, traffic signals, traffic signs, lanes, and the like.

FIG. 36 illustrates an example of imaging ranges of the imaging units 12101 to 12104. An imaging range 12111 is an imaging range of the imaging unit 12101 provided in the front nose, imaging ranges 12112 and 12113 are imaging ranges of the imaging unit 12102 and 12103 provided in the side mirrors, and an imaging range 12114 is an imaging range of the imaging unit 12104 provided in the rear bumper or the backdoor. For example, by superimposing the image data captured by the imaging units 12101 to 12104, it is possible to obtain a bird's eye view image in which the vehicle 12100 is viewed from the upper side.

At least one of the imaging units 12101 to 12104 may have a function of acquiring distance information. For example, at least one of the imaging units 12101 to 12104 may be a stereo camera including a plurality of imaging elements or may be an imaging element that has pixels for phase difference detection.

For example, the microcomputer 12051 can extract a 3-dimensional object traveling at a predetermined speed (for example, 0 km/h or more) in substantially the same direction as that of the vehicle 12100 which is particularly a closest 3-dimensional object on a travel road of the vehicle 12100 as a front vehicle by obtaining a distance from each 3-dimensional object within the imaging ranges 12111 to 12114 and a temporal change of the distance (a relative speed to the vehicle 12100) based on the distance information obtained from the imaging units 12101 to 12104. Further, the microcomputer 12051 can set an inter-vehicle distance which is guaranteed in advance before a front vehicle and perform automated brake control (also including following stop control) or automated acceleration control (also including following start control). In this way, it is possible to perform the coordinated control for automated driving or the like in which autonomous travel is performed without an operation of a driver.

For example, the microcomputer 12051 can classify and extract 3-dimensional object data regarding 3-dimensional objects into motorcycles, normal vehicles, large vehicles, pedestrians, electric poles, and the like into other 3-dimensional objects based on the distance information obtained from the imaging units 12101 to 12104, and can use the 3-dimensional objects for automatic avoidance of obstacles. For example, the microcomputer 12051 identifies obstacles around the vehicle 12100 as obstacles which can be recognized by the driver of the vehicle 12100 and obstacles which it is difficult to recognize. Then, the microcomputer 12051 determines a collision risk indicating a risk of collision with each obstacle. In a situation in which there is a possibility of collision at which the collision risk is equal to or greater than a set value, driving support for collision avoidance can be performed by outputting a warning to the driver via the audio speaker 12061 or the display unit 12062 or performing forced deceleration or avoidance steering via the driving system control unit 12010.

At least one of the imaging units 12101 to 12104 may be an infrared camera that detects infrared light. For example, the microcomputer 12051 can recognize pedestrians by determining whether there are the pedestrians in images captured by the imaging units 12101 to 12104. The pedestrians are recognized, for example, in an order in which feature points in the images captured by the imaging units 12101 to 12104 serving as infrared cameras are extracted and an order in which a pattern matching process is on a series of feature points indicating the contour of an object to determine whether there is a pedestrian. When the microcomputer 12051 determines that there is the pedestrian in the images captured by the imaging units 12101 to 12104 and recognizes the pedestrian, the sound and image output unit 12052 controls the display unit 12062 such that a rectangular contour line for emphasizing the recognized pedestrian is superimposed and displayed. The sound and image output unit 12052 may control the display unit 12062 such that an icon or the like indicating the pedestrian is displayed at a desired position.

The example of the vehicle control system to which the technology according to the present disclosure is applied has been described above. The technology according to the present disclosure can be applied to the imaging unit 12031 and the like in the above-described configuration.

12. Application Example to Endoscopic Surgery System

The technology according to the present disclosure (the present technology) can be applied to various products. For example, the technology according to the present disclosure may be applied to an endoscopic surgery system.

Figure 37:
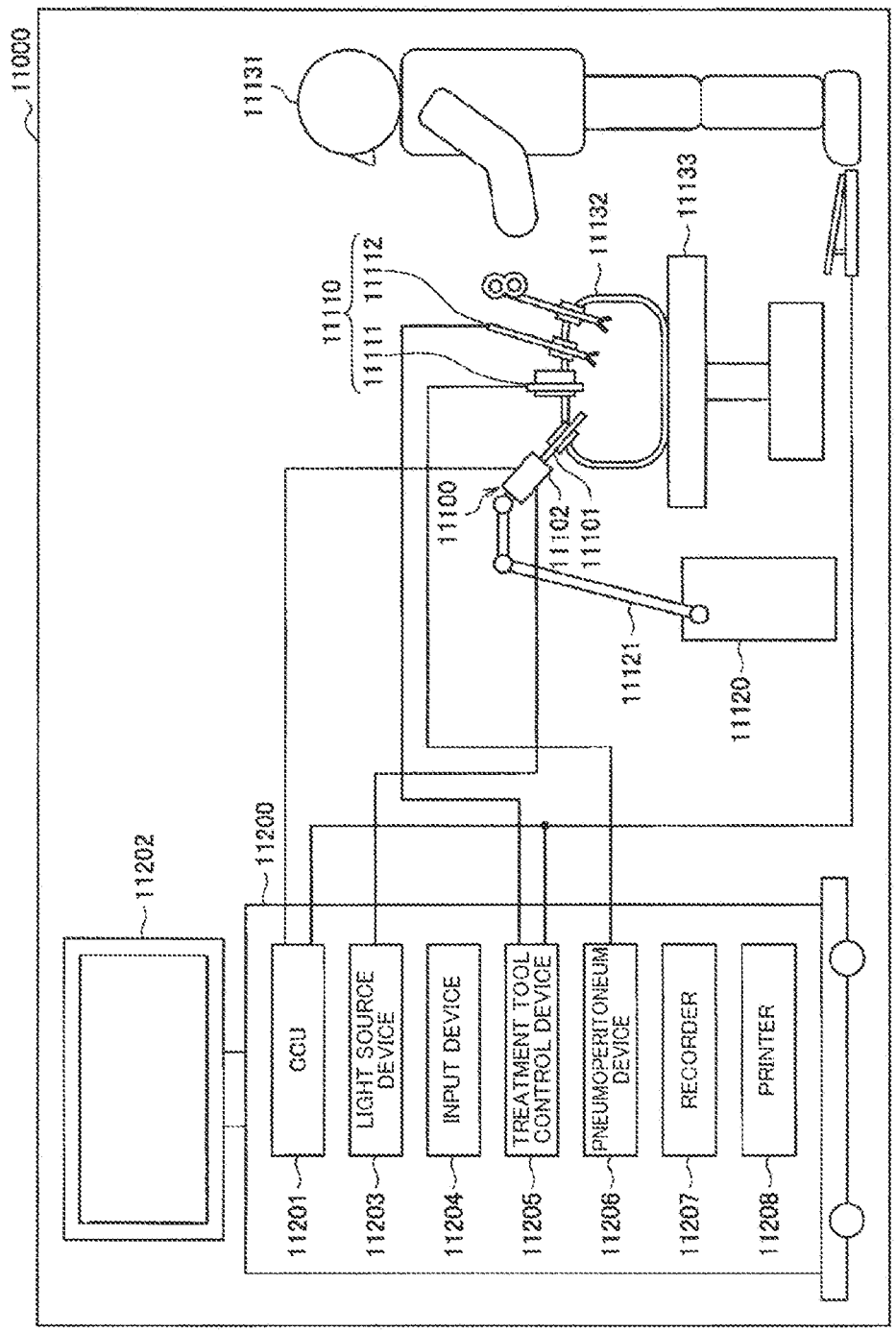
FIG. 37 is a diagram illustrating an example of a schematic configuration of an endoscopic surgery system.

FIG. 37 is a diagram illustrating an example of a schematic configuration of an endoscopic surgery system to which the technology according to the present disclosure (the present technology) can be applied.

FIG. 37 illustrates an aspect in which an operator (a physician) 11131 is performing an operation on a patient 11132 on a patient bed 11133 using an endoscopic surgery system 11000. As illustrated, the endoscopic surgery system 11000 includes an endoscope 11100, other surgery tools 11110 such as a pneumoperitoneum tube 11111 or an energy treatment tool 11112, a support arm device 11120 supporting the endoscope 11100, and a cart 11200 on which various devices for an endoscopic operation are mounted.

The endoscope 11100 includes a body tube 11101 of which a region with a predetermined length is inserted from a distal end into a body cavity of the patient 11132 and a camera head 11102 connected to a base end of the body tube 11101. In the illustrated example, the endoscope 11100 configured as a so-called hard mirror having a hard body tube 11101 is illustrated, but the endoscope 11100 may be configured as a so-called soft mirror having a soft body tube.

At the distal end of the body tube 11101, an opening into which an objective lens is inserted is provided. A light source device 11203 is connected to the endoscope 11100, light generated by the light source device 11203 is guided to the distal end of the body tube by a light guide extended to the inside of the body tube 11101, and the light is radiated to an observation target in the cavity of the patient 11132 through the objective lens. The endoscope 11100 may be a direct-viewing mirror, an oblique-viewing mirror, or a side-viewing mirror.

An optical system and an imaging element are provided inside the camera head 11102 and light (observation light) reflected from the observation target is condensed on the imaging element by the optical system. The observation light is photoelectrically converted by the imaging element and an electric signal corresponding to the observation light, that is, an image signal corresponding to an observation image, is generated. The image signal is transmitted as raw data to a camera control unit (CCU) 11201.

The CCU 11201 is configured by a central processing unit (CPU), a graphics processing unit (GPU), or the like and generally controls operations of the endoscope 11100 and the display device 11202. Further, the CCU 11201 receives an image signal from the camera head 11102 and performs, for example, various kinds of image processing such as a developing process (demosaic processing) on the image signal to display an image based on the image signal.

The display device 11202 displays the image based on the image signal subjected to the image processing in the CCU 11201 under the control of the CCU 11201.

The light source device 11203 is configured by, for example, a light source such as a light-emitting diode (LED) and supplies the endoscope 11100 with irradiation light at the time of imaging of a surgical site or the like.

An input device 11204 is an input interface to the endoscopic surgery system 11000. A user can input various kinds of information or instructions to the endoscopic surgery system 11000 via the input device 11204. For example, the user inputs an instruction or the like to change imaging conditions (a kind of irradiation light, a magnification, a focal distance, and the like) for the endoscope 11100.

A treatment tool control device 11205 controls driving of the energy treatment tool 11112 for tissue cautery or incision, blood vessel sealing, or the like. A pneumoperitoneum device 11206 sends a gas into the cavity via the pneumoperitoneum tube 11111 to inflate the cavity of the patient 11132 in order to guarantee a visual field for the endoscope 11100 and guarantee a working space of the operator. A recorder 11207 is a device capable of recording various kinds of information regarding surgery. A printer 11208 is a device capable of printing various kinds of information regarding surgery in various forms of text, images, graphs, or the like.

The light source device 11203 that supplies the endoscope 11100 with irradiation light at the time of imaging of a surgical site can be configured by, for example, an LED, a laser light source, or a white light source configured in combination thereof. When the white light source is configured in combination of an RGB laser light source, an output intensity and an output timing of each color (each wavelength) can be controlled with high accuracy. Therefore, the light source device 11203 can adjust white balance of a captured image. In this case, by irradiating an observation target with laser light from the RGB laser light source chronologically and controlling driving of the imaging element of the camera head 11102 in synchronization with the irradiation timing, it is also possible to capture images corresponding to RGB chronologically. According to this method, it is possible to obtain a color image even when color filters are not provided in the imaging element.

The driving of the light source device 11203 may be controlled such that the intensity of light to be output is changed at each predetermined time. By controlling the driving of the imaging element of the camera head 11102 in synchronization with a change timing of the intensity of the light, acquiring images chronologically, and combining the images, it is possible to generate an image with a high dynamic range in which there is no so-called black spots and white spots.

The light source device 11203 may be configured to be able to supply light with a predetermined wavelength band corresponding to special light observation. In the special light observation, for example, so-called narrow band observation (narrow band imaging) is performed for imaging a predetermined tissue such as a blood vessel of a mucous membrane surface with high contrast by radiating light with a narrower band than the irradiation light (that is, white light) at the time of normal observation using wavelength dependency of light absorption in a body tissue. Alternatively, in the special light observation, fluorescence observation may be performed for obtaining an image by fluorescence occurring by radiating exciting light. In the fluorescence observation, for example, a body tissue can be irradiated with exciting light and fluorescence from the body tissue can be observed (self-fluorescence observation), or a reagent such as indocyanine green (ICG) can be locally injected into a body tissue and the body tissue can be irradiated with exciting light corresponding to the fluorescence wavelength of the reagent to obtain a fluorescent image. The light source device 11203 can be configured to be able to supply exciting light and/or narrow-band light corresponding to the special light observation.

Figure 38:
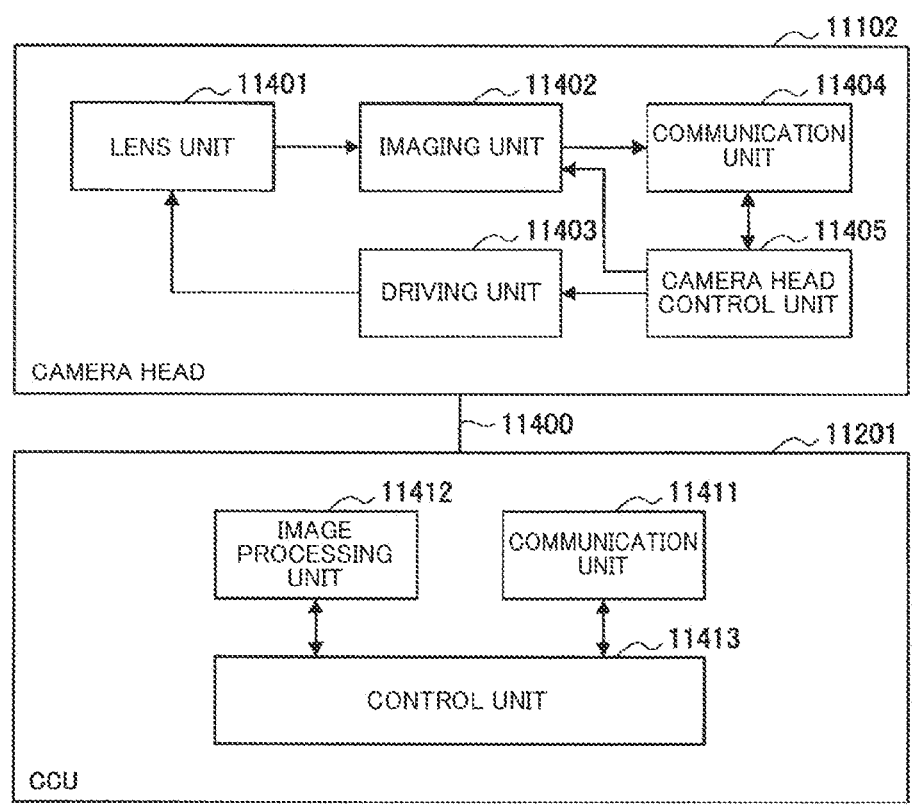
FIG. 38 is a block diagram illustrating examples of functional configurations of a camera head and a CCU.

FIG. 38 is a block diagram illustrating examples of functional configurations of the camera head 11102 and the CCU 11201 illustrated in FIG. 37.

The camera head 11102 includes a lens unit 11401, an imaging unit 11402, a driving unit 11403, a communication unit 11404, and a camera head control unit 11405. The CCU 11201 includes a communication unit 11411, an image processing unit 11412, and a control unit 11413. The camera head 11102 and the CCU 11201 are connected to be able to communicate with each other via a transmission cable 11400.

The lens unit 11401 is an optical system provided in a connection unit with the body tube 11101. Observation light received from the distal end of the body tube 11101 is guided to the camera head 11102 and is incident on the lens unit 11401. The lens unit 11401 is configured to a plurality of lenses including a zoom lens and a focus lens in combination.

The number of imaging elements that configure the imaging unit 11402 may be one (so-called single-plate) or may be multiple (so-called multiple-plate). When the imaging unit 11402 is configured as a multiple-plate, for example, an image signal corresponding to each of RGB may be generated by each imaging element and a color image may be able to be generated by combining the image signals. Alternatively, the imaging unit 11402 may include one imaging element to acquire a pair of imaging elements of right-eye and left-eye images corresponding to 3-dimensional (3D) display. By performing the 3D display, the operator 11131 can ascertain the depth of a body tissue in a surgical site more accurately. When the imaging unit 11402 is configured as a multiple-plate, a plurality of lens units 11401 may be provided to correspond to each imaging element.

The imaging unit 11402 may not necessarily be provided in the camera head 11102. For example, the imaging unit 11402 may be provided immediately after the objective lens inside the body tube 11101.

The driving unit 11403 is configured by an actuator and the zoom lens and the focus lens of the lens unit 11401 are moved by a predetermined distance along an optical axis under the control of the camera head control unit 11405. In this way, it is possible to appropriately adjust the magnification and focus of a captured image by the imaging unit 11402.

The communication unit 11404 is configured by a communication device that transmits and receives various kinds of information to and from the CCU 11201. The communication unit 11404 transmits an image signal obtained from the imaging unit 11402 to the CCU 11201 as raw data via the transmission cable 11400.

The communication unit 11404 receives a control signal for controlling driving of the camera head 11102 from the CCU 11201 and supplies the control signal to the camera head control unit 11405. The control signal includes, for example, information regarding imaging conditions such as information indicating designation of a frame rate of a captured image, information indicating designation of an exposure value at the time of imaging, and/or information indicating designation of the magnification and focus of the captured image.

Imaging conditions such as the foregoing frame rate, exposure value, magnification, and focus may be designated appropriately by the user or may be set automatically by the control unit 11413 of the CCU 11201 based on the acquired image signal. In the latter case, a so-called auto exposure (AE), auto focus (AF) function, and auto white balance (AWB) function are mounted on the endoscope 11100.

The camera head control unit 11405 controls driving of the camera head 11102 based on a control signal received from the CCU 11201 via the communication unit 11404.

The communication unit 11411 is configured by a communication device that transmits and receives various kinds of information to and from the camera head 11102. The communication unit 11411 receives an image signal transmitted via the transmission cable 11400 from the camera head 11102.

The communication unit 11411 transmits a control signal for controlling driving of the camera head 11102 to the camera head 11102. The image signal or the control signal can be transmitted through electric communication, optical communication, or the like.

The image processing unit 11412 applies various kinds of image processing to the image signal which is the raw data transmitted from the camera head 11102.

The control unit 11413 performs various kinds of control on display of a captured image obtained through imaging of a surgical site or imaging of a surgical site or the like by the endoscope 11100. For example, the control unit 11413 generates a control signal for controlling driving of the camera head 11102.

The control unit 11413 causes the display device 11202 to display the captured image in which the surgical site or the like is shown based on the image signal subjected to the image processing in the image processing unit 11412. At this time, the control unit 11413 may recognize various objects in the captured image using various image recognition technologies. For example, the control unit 11413 can recognize a surgery tool such as forceps, a specific biological part, bleeding, or mist or the like at the time of use of the energy treatment tool 11112 by detecting the shape, color, or the like of the edge of an object included in the captured image. The control unit 11413 may superimpose various kinds of surgery support information on the image of the surgical site for display using the recognition result when the display device 11202 is caused to display the captured image. By superimposing and displaying the surgery support information and presenting the surgery support information to the operator 11131, it is possible to reduce a burden on the operator 11131 or allow the operator 11131 to perform an operation reliably.

The transmission cable 11400 connecting the camera head 11102 to the CCU 11201 is an electric signal cable corresponding to communication of an electric signal, an optical fiber corresponding to optical communication, or a composite cable thereof.

Here, in the illustrated example, the transmission cable 11400 is used for wired communication, but communication between the camera head 11102 and the CCU 11201 may be performed wirelessly.

The example of the endoscopic surgery system to which the technology of the present disclosure can be applied has been described above. The technology according to the present disclosure can be applied to the endoscope 11100 or the imaging unit 11402 of the camera head 11102 in the above-described configuration.

Here, the endoscopic surgery system has been described as an example, but the technology according to the present disclosure may be applied to others, for example, a microscope surgery system.

The preferred embodiments of the present disclosure have been described in detail, but the technical range of the present disclosure is not limited to the examples. It is apparent to those skilled in the art in the technical field of the present disclosure that various changes or corrections can be made within the scope of the technical spirit and essence described in the claims and these changes and corrections are, of course, construed to pertain to the technical scope of the present disclosure.

For example, the chemical formulae described in the present specification are exemplary and the described chemical formulae may be changed.

The advantageous effects described in the present specification are merely explanatory or exemplary and are not limited. That is, in the technology according to the present disclosure, it is possible to achieve other advantageous effects apparent to those skilled in the art can be obtained from the description of the present specification in addition or instead of the foregoing advantageous effects.

The following configurations belong to the technical scope of the present disclosure.

(1) An imaging device including:
   a first semiconductor layer formed on a semiconductor substrate;
   a second semiconductor layer formed on the first semiconductor layer and having an opposite conductivity type to the first semiconductor layer;
   a pixel separation portion configured to demarcate a pixel region including the first and second semiconductor layers;
   a first electrode connected to the first semiconductor layer from one surface side of the semiconductor substrate; and
   a metal layer connected to the second semiconductor layer from a light irradiation surface side which is the other surface of the semiconductor substrate and buried in the pixel separation portion in at least a part of the semiconductor substrate in a thickness direction.

(2) The imaging device described in claim 1, further including
   a second electrode connected to the second semiconductor layer from the light irradiation surface side and formed to correspond to a position of the pixel separation portion, in which
   the metal layer is electrically connected to the second semiconductor layer via the second electrode.

(3) The imaging device described in (2), in which the second electrode is formed along a periphery of the pixel region.

(4) The imaging device described in (2), in which the second electrode is formed in a region of a part of the periphery of the pixel region.

(5) The imaging device described in (4), in which the second electrode is formed in at least one of four corners of the rectangular pixel region.

(6) The imaging device described in (4) or (5), in which the second electrode is buried in a hole formed in the second semiconductor layer.

(7) The imaging device described in any one of (2) to (6), in which the second electrode and the metal layer are formed of the same material.

(8) The imaging device described in any one of (2) to (7), further including an insulation film formed along the pixel separation portion and the light irradiation surface, in which
   the second electrode is buried in an opening provided in the second semiconductor layer,
   a region in which an end of the insulation film retreats more than a wall surface of the opening is provided, and
   the region is filled with the second electrode.

(9) The imaging device described in any one of (1) to (8), further including an insulation film formed along the pixel separation portion, in which
   a region in which an end of the insulation film retreats in a thickness direction of the pixel separation portion is formed and the region is filled with an insulation film.

(10) The imaging device described in (2), in which a voltage for multiplying electrons is applied between the first electrode and the metal layer.

(11) The imaging device described in any one of (1) to (10), further including a third semiconductor layer formed on the second semiconductor layer and having the same conductivity type as the second semiconductor layer.

(12) The imaging device described in (2), in which the second electrode is provided on an upper surface of the pixel separation portion.

(13) The imaging device described in (2), in which the pixel separation portion and the second electrode have a planar shape of a grid shape surrounding a plurality of the pixel regions.

REFERENCE SIGNS LIST

100 Cathode electrode (second electrode)
130 Anode electrode (first electrode)
132 Auxiliary electrode
140 Contact layer
150 Pixel separation portion
152 Metal layer
160 Photoelectric conversion portion (third semiconductor layer)
170 P-type layer (second semiconductor layer)
180 N-type layer (first semiconductor layer)
190 Buried metal layer
760 P region

The invention claimed is:

1. An imaging device, comprising:
a first semiconductor layer on a semiconductor substrate;
a second semiconductor layer on the first semiconductor layer, wherein the second semiconductor layer has an opposite conductivity type to the first semiconductor layer;
a pixel separation portion configured to demarcate a pixel region including the first semiconductor layer and the second semiconductor layer;
a first electrode connected to the first semiconductor layer from a first surface side of the semiconductor substrate;
a metal layer connected to the second semiconductor layer from a light irradiation surface side which is a second surface side of the semiconductor substrate, wherein the metal layer is buried in the pixel separation portion in at least a part of the semiconductor substrate; and
a second electrode connected to the second semiconductor layer from the light irradiation surface side, wherein
the second electrode corresponds to a position of the pixel separation portion, and
the metal layer is electrically connected to the second semiconductor layer via the second electrode.

2. The imaging device according to claim 1, wherein the second electrode is along a periphery of the pixel region.

3. The imaging device according to claim 1, wherein the second electrode is in a region of a part of a periphery of the pixel region.

4. The imaging device according to claim 3, wherein
the pixel region is a rectangular pixel region; and
the second electrode is in at least one of four corners of the rectangular pixel region.

5. The imaging device according to claim 3, wherein the second electrode is buried in a hole in the second semiconductor layer.

6. The imaging device according to claim 3, wherein the second electrode and the metal layer are formed of the same material.

7. The imaging device according to claim 1, further comprising:
an insulation film along the pixel separation portion and the light irradiation surface side, wherein
the second electrode is buried in an opening in the second semiconductor layer; and
a specific region in which an end of the insulation film retreats more than a wall surface of the opening, wherein the specific region is filled with the second electrode.

8. The imaging device according to claim 1, further comprising:
an insulation film along the pixel separation portion; and
a specific region in which an end of the insulation film retreats in a thickness direction of the pixel separation portion, wherein the specific region is filled with the second electrode.

9. The imaging device according to claim 1, wherein a voltage for multiplying electrons is applied between the first electrode and the metal layer.

10. The imaging device according to claim 1, further comprising a third semiconductor layer on the second semiconductor layer, wherein the third semiconductor layer and the second semiconductor layer have the same conductivity type.

11. The imaging device according to claim 1, wherein the second electrode is on an upper surface of the pixel separation portion.

12. The imaging device according to claim 1, wherein
the pixel separation portion and the second electrode have a planar shape of a grid shape surrounding a plurality of pixel regions, and
the plurality of pixel regions comprises the pixel region.

* * * * *